(12) United States Patent
Yamazaki et al.

(10) Patent No.: US 10,083,995 B2
(45) Date of Patent: Sep. 25, 2018

(54) SEMICONDUCTOR DISPLAY DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Satoshi Murakami, Tochigi (JP); Masahiko Hayakawa, Kanagawa (JP); Kiyoshi Kato, Kanagawa (JP); Mitsuaki Osame, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/598,651

(22) Filed: May 18, 2017

(65) Prior Publication Data

US 2017/0256570 A1    Sep. 7, 2017

Related U.S. Application Data

(63) Continuation of application No. 14/481,458, filed on Sep. 9, 2014, now Pat. No. 9,666,614, which is a
(Continued)

(30) Foreign Application Priority Data

Apr. 9, 2002   (JP) ................................. 2002-107216

(51) Int. Cl.
*H01L 27/12*       (2006.01)
*H01L 33/52*       (2010.01)
(Continued)

(52) U.S. Cl.
CPC .... *H01L 27/1248* (2013.01); *G02F 1/136227* (2013.01); *H01L 27/12* (2013.01);
(Continued)

(58) Field of Classification Search
CPC ... H01L 27/12; H01L 27/124; H01L 27/1214; H01L 27/1244; H01L 27/1248; H01L 27/1255; H01L 27/3246; H01L 33/52
See application file for complete search history.

(56) References Cited

U.S. PATENT DOCUMENTS 3,597,667 A    8/1971  Horn
4,313,782 A    2/1982  Sokoloski
(Continued)

FOREIGN PATENT DOCUMENTS

EP    0556484 A    8/1993
EP    0603866 A    6/1994
(Continued)

OTHER PUBLICATIONS

Okuyama.K et al., "Water-Related Threshold Voltage Instabilitiy of Polysilicon TFTs", IEDM 93: Technical Digest of International Electron Devices Meeting, Dec. 5, 1993, pp. 527-530.
(Continued)

*Primary Examiner* — Fazli Erdem
(74) *Attorney, Agent, or Firm* — Nixon Peabody LLP; Jeffrey L. Costellia

(57) ABSTRACT

It is an object of the present invention to provide a semiconductor display device having an interlayer insulating film which can obtain planarity of a surface while controlling film formation time, can control treatment time of heating treatment with an object of removing moisture, and can prevent moisture in the interlayer insulating film from being discharged to a film or an electrode adjacent to the interlayer insulating film. An inorganic insulating film containing nitrogen, which is less likely to transmit moisture compared with an organic resin, is formed so as to cover a TFT. Next, an organic resin film containing photosensitive acrylic resin is applied to the organic insulting film, and the organic resin film is partially exposed to light to be opened. Thereafter, an
(Continued)

inorganic insulting film containing nitrogen, which is less likely to transmit moisture compared with an organic resin, is formed so as to cover the opened organic resin film. Then, in the opening part of the organic resin film, a gate insulating film and the two layer inorganic insulating film containing nitrogen are opened partially by etching to expose an active layer of the TFT.

12 Claims, 29 Drawing Sheets

Related U.S. Application Data continuation of application No. 13/857,659, filed on Apr. 5, 2013, now Pat. No. 8,835,271, which is a continuation of application No. 13/217,322, filed on Aug. 25, 2011, now Pat. No. 8,415,669, which is a continuation of application No. 12/711,611, filed on Feb. 24, 2010, now Pat. No. 8,008,666, which is a continuation of application No. 10/400,427, filed on Mar. 28, 2003, now Pat. No. 7,671,369.

(51) Int. Cl.
    *G02F 1/1362* (2006.01)
    *H01L 27/32* (2006.01)
    *H01L 27/13* (2006.01)
    *H01L 51/52* (2006.01)

(52) U.S. Cl.
    CPC ........ *H01L 27/124* (2013.01); *H01L 27/1214* (2013.01); *H01L 27/1244* (2013.01); *H01L 27/1255* (2013.01); *H01L 27/3246* (2013.01); *H01L 33/52* (2013.01); *H01L 27/13* (2013.01); *H01L 27/3276* (2013.01); *H01L 51/5237* (2013.01); *H01L 51/5253* (2013.01)

(56) References Cited

U.S. PATENT DOCUMENTS

| | | |
|---|---|---|
| 4,342,617 A | 8/1982 | Fu et al. |
| 4,347,586 A | 8/1982 | Natsui |
| 4,409,724 A | 10/1983 | Tasch et al. |
| 4,447,272 A | 5/1984 | Saks |
| 4,566,175 A | 1/1986 | Smayling et al. |
| 4,651,406 A | 3/1987 | Shimizu et al. |
| 4,808,845 A | 2/1989 | Suzuki et al. |
| 4,823,180 A | 4/1989 | Wieder et al. |
| 4,851,370 A | 7/1989 | Doklan et al. |
| 4,886,962 A | 12/1989 | Gofuku et al. |
| 4,951,100 A | 8/1990 | Parrillo |
| 5,055,906 A | 10/1991 | Mase et al. |
| 5,063,378 A | 11/1991 | Roach |
| RE33,829 E | 2/1992 | Castleberry |
| 5,102,813 A | 4/1992 | Kobayashi et al. |
| 5,113,511 A | 5/1992 | Nelson et al. |
| 5,142,344 A | 8/1992 | Yamazaki |
| 5,169,792 A | 12/1992 | Katoh et al. |
| 5,182,620 A | 1/1993 | Shimada et al. |
| 5,191,373 A | 3/1993 | Nakano |
| 5,198,685 A | 3/1993 | Kitani et al. |
| 5,212,119 A | 5/1993 | Hah et al. |
| 5,247,289 A | 9/1993 | Matsueda |
| 5,292,675 A | 3/1994 | Codama |
| 5,292,677 A | 3/1994 | Dennison |
| 5,306,651 A | 4/1994 | Masumo et al. |
| 5,308,998 A | 5/1994 | Yamazaki et al. |
| 5,313,076 A | 5/1994 | Yamazaki et al. |
| 5,324,974 A | 6/1994 | Liao |
| 5,343,066 A | 8/1994 | Okamoto et al. |
| 5,359,206 A | 10/1994 | Yamamoto et al. |
| 5,365,079 A | 11/1994 | Kodaira et al. |
| 5,414,278 A | 5/1995 | Kobayashi et al. |
| 5,414,442 A | 5/1995 | Yamazaki et al. |
| 5,424,752 A | 6/1995 | Yamazaki et al. |
| 5,426,315 A | 6/1995 | Pfiester |
| 5,440,163 A | 8/1995 | Ohhashi |
| 5,444,457 A | 8/1995 | Hotto |
| 5,446,562 A | 8/1995 | Sato |
| 5,459,596 A | 10/1995 | Ueda et al. |
| 5,466,617 A | 11/1995 | Shannon |
| 5,468,987 A | 11/1995 | Yamazaki et al. |
| 5,476,802 A | 12/1995 | Yamazaki et al. |
| 5,479,052 A | 12/1995 | Yuuki |
| 5,485,019 A | 1/1996 | Yamazaki et al. |
| 5,497,021 A | 3/1996 | Tada |
| 5,498,562 A | 3/1996 | Dennison et al. |
| 5,499,123 A | 3/1996 | Mikoshiba |
| 5,504,020 A | 4/1996 | Aomori et al. |
| 5,504,029 A | 4/1996 | Murata et al. |
| 5,508,209 A | 4/1996 | Zhang et al. |
| 5,512,779 A | 4/1996 | Noda |
| 5,521,107 A | 5/1996 | Yamazaki et al. |
| 5,523,257 A | 6/1996 | Yamazaki et al. |
| 5,545,577 A | 8/1996 | Tada |
| 5,563,427 A | 10/1996 | Yudasaka et al. |
| 5,576,231 A | 11/1996 | Konuma et al. |
| 5,576,655 A | 11/1996 | Fujihira et al. |
| 5,580,381 A | 12/1996 | Yamagata |
| 5,583,369 A | 12/1996 | Yamagaki et al. |
| 5,585,949 A | 12/1996 | Yamazaki et al. |
| 5,585,951 A | 12/1996 | Noda et al. |
| 5,612,254 A | 3/1997 | Mu et al. |
| 5,619,045 A | 4/1997 | Konuma et al. |
| 5,620,905 A | 4/1997 | Konuma et al. |
| 5,623,157 A | 4/1997 | Miyazaki et al. |
| 5,627,084 A | 5/1997 | Yamazaki et al. |
| 5,635,423 A | 6/1997 | Huang et al. |
| 5,650,338 A | 7/1997 | Yamazaki et al. |
| 5,663,077 A | 9/1997 | Adachi et al. |
| 5,672,900 A | 9/1997 | Konuma et al. |
| 5,674,771 A | 10/1997 | Machida et al. |
| 5,680,147 A | 10/1997 | Yamazaki et al. |
| 5,696,386 A | 12/1997 | Yamazaki |
| 5,706,064 A | 1/1998 | Fukunaga et al. |
| 5,712,495 A | 1/1998 | Suzawa |
| 5,719,065 A | 2/1998 | Takemura et al. |
| 5,721,601 A | 2/1998 | Yamaji et al. |
| 5,729,035 A | 3/1998 | Anma |
| 5,733,797 A | 3/1998 | Yamaha |
| 5,737,049 A | 4/1998 | Shin et al. |
| 5,747,355 A | 5/1998 | Konuma et al. |
| 5,771,110 A | 6/1998 | Hirano et al. |
| 5,781,254 A | 7/1998 | Kim et al. |
| 5,784,073 A | 7/1998 | Yamazaki et al. |
| 5,786,241 A | 7/1998 | Shimada |
| 5,789,762 A | 8/1998 | Koyama et al. |
| 5,804,878 A | 9/1998 | Miyazaki et al. |
| 5,805,252 A | 9/1998 | Shimada et al. |
| 5,808,315 A | 9/1998 | Murakami et al. |
| 5,814,529 A | 9/1998 | Zhang |
| 5,815,226 A | 9/1998 | Yamazaki et al. |
| 5,818,550 A | 10/1998 | Kadota et al. |
| 5,831,284 A | 11/1998 | Park et al. |
| 5,847,410 A | 12/1998 | Nakajima |
| 5,849,611 A | 12/1998 | Yamazaki et al. |
| 5,879,969 A | 3/1999 | Yamazaki et al. |
| 5,880,038 A | 3/1999 | Yamazaki et al. |
| 5,893,623 A | 4/1999 | Muramatsu |
| 5,895,937 A | 4/1999 | Su et al. |
| 5,913,112 A | 6/1999 | Yamazaki et al. |
| 5,917,225 A | 6/1999 | Yamazaki et al. |
| 5,939,731 A | 8/1999 | Yamazaki et al. |
| 5,940,732 A | 8/1999 | Zhang |
| 5,945,711 A | 8/1999 | Takemura et al. |
| 5,946,561 A | 8/1999 | Yamazaki et al. |
| 5,956,105 A | 9/1999 | Yamazaki et al. |
| 5,962,870 A | 10/1999 | Yamazaki et al. |
| 5,962,872 A | 10/1999 | Zhang et al. |
| 5,982,460 A | 11/1999 | Zhang et al. |
| 5,990,542 A | 11/1999 | Yamazaki |

(56) References Cited

U.S. PATENT DOCUMENTS

| | | | |
|---|---|---|---|
| 6,013,928 A | 1/2000 | Yamazaki et al. |
| 6,031,290 A | 2/2000 | Miyazaki et al. |
| 6,037,712 A | 3/2000 | Codama et al. |
| 6,057,904 A | 5/2000 | Kim et al. |
| 6,069,443 A | 5/2000 | Jones et al. |
| 6,078,316 A | 6/2000 | Page et al. |
| 6,115,090 A | 9/2000 | Yamazaki |
| 6,124,904 A | 9/2000 | Sato |
| 6,136,624 A | 10/2000 | Kemmochi et al. |
| 6,141,066 A | 10/2000 | Matsushima |
| 6,147,375 A | 11/2000 | Yamazaki et al. |
| 6,150,692 A | 11/2000 | Iwanaga et al. |
| 6,166,414 A | 12/2000 | Miyazaki et al. |
| 6,215,154 B1 | 4/2001 | Ishida et al. |
| 6,236,106 B1 | 5/2001 | Sato |
| 6,252,297 B1 | 6/2001 | Kemmochi et al. |
| 6,271,066 B1 | 8/2001 | Yamazaki et al. |
| 6,271,543 B1 | 8/2001 | Ohtani et al. |
| 6,274,516 B1 | 8/2001 | Kamei et al. |
| 6,274,887 B1 | 8/2001 | Yamazaki et al. |
| 6,294,799 B1 | 9/2001 | Yamazaki et al. |
| 6,303,493 B1 | 10/2001 | Lee |
| 6,306,559 B1 | 10/2001 | Tanamura et al. |
| 6,306,694 B1 | 10/2001 | Yamazaki et al. |
| 6,320,224 B1 | 11/2001 | Zhang |
| 6,335,555 B1 | 1/2002 | Takemura et al. |
| 6,346,718 B1 | 2/2002 | Yamanaka et al. |
| 6,356,318 B1 | 3/2002 | Kawahata |
| 6,372,558 B1 | 4/2002 | Yamanaka et al. |
| 6,429,053 B1 | 8/2002 | Yamazaki et al. |
| 6,448,612 B1 | 9/2002 | Miyazaki et al. |
| 6,451,636 B1 | 9/2002 | Segawa et al. |
| 6,475,836 B1 | 11/2002 | Suzawa et al. |
| 6,476,447 B1 | 11/2002 | Yamazaki et al. |
| 6,492,659 B1 | 12/2002 | Yamazaki et al. |
| 6,495,920 B2 | 12/2002 | Lee |
| 6,514,855 B1 | 2/2003 | Suzuki et al. |
| 6,515,300 B2 | 2/2003 | Boer et al. |
| 6,521,913 B1 | 2/2003 | Murade |
| 6,538,301 B1 | 3/2003 | Yamada et al. |
| 6,556,257 B2 | 4/2003 | Ino |
| 6,562,672 B2 | 5/2003 | Yamazaki et al. |
| 6,566,711 B1 | 5/2003 | Yamazaki et al. |
| 6,576,926 B1 | 6/2003 | Yamazaki et al. |
| 6,580,475 B2 | 6/2003 | Yamazaki et al. |
| 6,593,990 B1 | 7/2003 | Yamazaki |
| 6,599,818 B2 | 7/2003 | Dairiki |
| 6,605,826 B2 | 8/2003 | Yamazaki et al. |
| 6,608,353 B2 | 8/2003 | Miyazaki et al. |
| 6,614,076 B2 | 9/2003 | Kawasaki et al. |
| 6,617,611 B2 | 9/2003 | Hasegawa et al. |
| 6,624,450 B1 | 9/2003 | Yamazaki et al. |
| 6,657,230 B1 | 12/2003 | Murade |
| 6,657,260 B2 | 12/2003 | Yamazaki et al. |
| 6,664,145 B1 | 12/2003 | Yamazaki et al. |
| 6,664,732 B2 | 12/2003 | Yamazaki et al. |
| 6,677,621 B2 | 1/2004 | Yamazaki et al. |
| 6,680,577 B1 | 1/2004 | Inukai et al. |
| 6,689,492 B1 | 2/2004 | Yamazaki et al. |
| 6,690,031 B1 | 2/2004 | Ohtani et al. |
| 6,690,033 B2 | 2/2004 | Yamazaki et al. |
| 6,730,948 B2 | 5/2004 | Umeda et al. |
| 6,739,931 B2 | 5/2004 | Yamazaki et al. |
| 6,740,599 B2 | 5/2004 | Yamazaki et al. |
| 6,768,259 B2 | 7/2004 | Hirano |
| 6,774,578 B2 | 8/2004 | Tanada |
| 6,777,710 B1 | 8/2004 | Koyama |
| 6,778,232 B2 | 8/2004 | Nakata et al. |
| 6,784,037 B2 | 8/2004 | Yamazaki et al. |
| 6,784,949 B1 | 8/2004 | Nagata et al. |
| 6,791,129 B2 | 9/2004 | Inukai |
| 6,791,521 B2 | 9/2004 | Isami et al. |
| 6,822,264 B2 | 11/2004 | Yamazaki et al. |
| 6,822,629 B2 | 11/2004 | Yamazaki et al. |
| 6,828,950 B2 | 12/2004 | Koyama |
| 6,833,560 B2 | 12/2004 | Konuma et al. |
| 6,842,660 B2 | 1/2005 | Tripathi et al. |
| 6,855,954 B1 | 2/2005 | Zhang |
| 6,875,999 B2 | 4/2005 | Koyama et al. |
| 6,900,462 B2 | 5/2005 | Suzawa et al. |
| 6,903,377 B2 | 6/2005 | Yamazaki et al. |
| 6,905,903 B2 | 6/2005 | Hasegawa et al. |
| 6,909,114 B1 | 6/2005 | Yamazaki |
| 6,911,688 B2 * | 6/2005 | Yamazaki ........... H01L 27/1244 257/296 |
| 6,936,846 B2 | 8/2005 | Koyama et al. |
| 6,940,180 B1 | 9/2005 | Uchiyama |
| 6,943,369 B2 | 9/2005 | Hayashi |
| 6,958,489 B2 | 10/2005 | Kimura |
| 6,967,129 B2 | 11/2005 | Yamazaki et al. |
| 6,972,263 B2 | 12/2005 | Yamazaki et al. |
| 6,972,435 B2 | 12/2005 | Ohtani |
| 6,977,394 B2 | 12/2005 | Yamazaki et al. |
| 7,038,239 B2 | 5/2006 | Murakami et al. |
| 7,084,517 B2 | 8/2006 | Uchiyama |
| 7,129,523 B2 | 10/2006 | Yamazaki et al. |
| 7,132,693 B2 | 11/2006 | Konuma et al. |
| 7,141,821 B1 | 11/2006 | Yamazaki et al. |
| 7,142,781 B2 | 11/2006 | Koyama et al. |
| 7,148,510 B2 | 12/2006 | Yamazaki et al. |
| 7,242,021 B2 | 7/2007 | Yamazaki et al. |
| 7,301,209 B2 | 11/2007 | Takemura et al. |
| 7,365,393 B2 | 4/2008 | Yamazaki et al. |
| 7,375,376 B2 | 5/2008 | Yamazaki et al. |
| 7,442,991 B2 | 10/2008 | Yamazaki et al. |
| 7,629,617 B2 | 12/2009 | Yamazaki et al. |
| 7,671,369 B2 * | 3/2010 | Yamazaki ......... G02F 1/136227 257/59 |
| 8,217,396 B2 | 7/2012 | Yamazaki et al. |
| 8,350,466 B2 | 1/2013 | Murakami et al. |
| 8,823,009 B2 | 9/2014 | Yamazaki et al. |
| 8,829,527 B2 | 9/2014 | Yamazaki et al. |
| 2001/0005606 A1 | 6/2001 | Tanaka et al. |
| 2001/0009283 A1 | 7/2001 | Arao et al. |
| 2001/0030322 A1 | 10/2001 | Yamazaki et al. |
| 2001/0036462 A1 | 11/2001 | Fong et al. |
| 2001/0051416 A1 | 12/2001 | Yamazaki et al. |
| 2001/0053559 A1 | 12/2001 | Nagao et al. |
| 2001/0055841 A1 | 12/2001 | Yamazaki et al. |
| 2002/0036462 A1 | 3/2002 | Hirano |
| 2002/0051382 A1 | 5/2002 | Matsubara et al. |
| 2002/0052124 A1 | 5/2002 | Raaijmakers et al. |
| 2002/0055206 A1 | 5/2002 | Zhang |
| 2002/0145116 A1 | 10/2002 | Choo et al. |
| 2002/0155706 A1 | 10/2002 | Mitsuki et al. |
| 2002/0163043 A1 | 11/2002 | Zhang et al. |
| 2002/0177326 A1 | 11/2002 | Klee et al. |
| 2002/0179969 A1 | 12/2002 | Miyazaki et al. |
| 2003/0057419 A1 | 3/2003 | Murakami et al. |
| 2003/0089991 A1 | 5/2003 | Yamazaki et al. |
| 2003/0090447 A1 | 5/2003 | Kimura |
| 2003/0094615 A1 | 5/2003 | Yamazaki et al. |
| 2003/0129790 A1 | 7/2003 | Yamazaki et al. |
| 2003/0165781 A1 | 9/2003 | Takeda |
| 2003/0173570 A1 | 9/2003 | Yamazaki et al. |
| 2003/0189207 A1 | 10/2003 | Murakami et al. |
| 2003/0189210 A1 | 10/2003 | Yamazaki et al. |
| 2003/0193054 A1 | 10/2003 | Hayakawa et al. |
| 2003/0197178 A1 | 10/2003 | Yamazaki et al. |
| 2003/0206332 A1 | 11/2003 | Yamazaki et al. |
| 2003/0210358 A1 | 11/2003 | Zhang et al. |
| 2003/0230764 A1 | 12/2003 | Yamazaki et al. |
| 2004/0023445 A1 | 2/2004 | Miyazaki et al. |
| 2004/0051102 A1 | 3/2004 | Miyazaki et al. |
| 2004/0072380 A1 | 4/2004 | Yamazaki et al. |
| 2004/0075094 A1 | 4/2004 | Yamazaki et al. |
| 2004/0080263 A1 | 4/2004 | Yamazaki et al. |
| 2004/0115934 A1 | 6/2004 | Broz et al. |
| 2004/0135181 A1 | 7/2004 | Yamazaki et al. |
| 2005/0056948 A1 | 3/2005 | Uchiyama |
| 2005/0087741 A1 | 4/2005 | Yamazaki |
| 2005/0132549 A1 | 6/2005 | Shih et al. |
| 2005/0205868 A1 | 9/2005 | Yamazaki et al. |
| 2005/0224820 A1 | 10/2005 | Yamazaki et al. |

(56) References Cited

U.S. PATENT DOCUMENTS

| | | |
|---|---|---|
| 2005/0233507 A1 | 10/2005 | Yamazaki et al. |
| 2005/0276912 A1 | 12/2005 | Yamamoto et al. |
| 2005/0282305 A1 | 12/2005 | Murakami et al. |
| 2005/0287722 A1 | 12/2005 | Zhang |
| 2006/0060861 A1 | 3/2006 | Yamazaki et al. |
| 2007/0001236 A1 | 1/2007 | Yamazaki et al. |
| 2007/0096106 A1 | 5/2007 | Yamazaki et al. |
| 2007/0096224 A1 | 5/2007 | Takemura et al. |
| 2008/0061299 A1 | 3/2008 | Takemura et al. |
| 2008/0230871 A1 | 9/2008 | Yamazaki et al. |
| 2008/0246039 A1 | 10/2008 | Zhang |
| 2009/0014724 A1 | 1/2009 | Yamazaki et al. |
| 2009/0072235 A1 | 3/2009 | Zhang et al. |
| 2012/0235155 A1 | 9/2012 | Yamazaki et al. |
| 2013/0134401 A1 | 5/2013 | Murakami et al. |
| 2014/0332819 A1 | 11/2014 | Yamazaki et al. |

FOREIGN PATENT DOCUMENTS

| | | |
|---|---|---|
| EP | 0680082 A | 11/1995 |
| EP | 0878840 A | 11/1998 |
| EP | 1031873 A | 8/2000 |
| EP | 1122773 A | 8/2001 |
| EP | 1128430 A | 8/2001 |
| EP | 1128439 A | 8/2001 |
| EP | 1148553 A | 10/2001 |
| EP | 1566837 A | 8/2005 |
| JP | 55-041703 A | 3/1980 |
| JP | 56-081973 A | 7/1981 |
| JP | 56-111258 A | 9/1981 |
| JP | 57-058363 A | 4/1982 |
| JP | 57-104218 A | 6/1982 |
| JP | 58-037967 A | 3/1983 |
| JP | 58-197761 A | 11/1983 |
| JP | 60-136259 A | 7/1985 |
| JP | 60-202931 A | 10/1985 |
| JP | 61-059473 A | 3/1986 |
| JP | 61-220341 A | 9/1986 |
| JP | 62-064562 A | 4/1987 |
| JP | 62-274729 A | 11/1987 |
| JP | 63-314862 A | 12/1988 |
| JP | 64-054762 A | 3/1989 |
| JP | 01-156725 A | 6/1989 |
| JP | 02-025024 A | 1/1990 |
| JP | 02-039541 A | 2/1990 |
| JP | 02-044769 A | 2/1990 |
| JP | 02-100024 A | 4/1990 |
| JP | 02-159730 A | 6/1990 |
| JP | 02-214152 A | 8/1990 |
| JP | 02-234134 A | 9/1990 |
| JP | 03-020046 A | 1/1991 |
| JP | 03-095938 A | 4/1991 |
| JP | 03-095939 A | 4/1991 |
| JP | 03-126921 A | 5/1991 |
| JP | 03-280018 A | 12/1991 |
| JP | 03-280420 A | 12/1991 |
| JP | 04-139828 A | 5/1992 |
| JP | 04-142740 A | 5/1992 |
| JP | 04-155834 A | 5/1992 |
| JP | 04-180219 A | 6/1992 |
| JP | 04-196328 A | 7/1992 |
| JP | 04-239731 A | 8/1992 |
| JP | 04-299566 A | 10/1992 |
| JP | 04-356129 A | 12/1992 |
| JP | 05-055581 A | 3/1993 |
| JP | 05-055582 A | 3/1993 |
| JP | 05-082442 A | 4/1993 |
| JP | 05-114724 A | 5/1993 |
| JP | 05-226364 A | 9/1993 |
| JP | 05-232515 A | 9/1993 |
| JP | 05-249478 A | 9/1993 |
| JP | 05-259458 A | 10/1993 |
| JP | 05-275373 A | 10/1993 |
| JP | 05-299581 A | 11/1993 |
| JP | 06-067210 A | 3/1994 |
| JP | 06-130414 A | 5/1994 |
| JP | 06-169086 A | 6/1994 |
| JP | 06-232160 A | 8/1994 |
| JP | 06-242433 A | 9/1994 |
| JP | 06-267210 A | 9/1994 |
| JP | 06-267982 A | 9/1994 |
| JP | 06-291314 A | 10/1994 |
| JP | 06-308531 A | 11/1994 |
| JP | 06-337436 A | 12/1994 |
| JP | 06-338612 A | 12/1994 |
| JP | 07-056190 A | 3/1995 |
| JP | 07-273191 A | 10/1995 |
| JP | 07-335756 A | 12/1995 |
| JP | 08-152651 A | 6/1996 |
| JP | 08-181214 A | 7/1996 |
| JP | 08-203876 A | 8/1996 |
| JP | 10-039334 A | 2/1998 |
| JP | 10-048668 A | 2/1998 |
| JP | 10-056182 A | 2/1998 |
| JP | 10-068972 A | 3/1998 |
| JP | 10-307305 A | 11/1998 |
| JP | 11-103069 A | 4/1999 |
| JP | 11-183929 A | 7/1999 |
| JP | 11-345981 A | 12/1999 |
| JP | 2000-312007 A | 11/2000 |
| JP | 2001-189462 A | 7/2001 |
| JP | 2001-223267 A | 8/2001 |
| JP | 2001-313397 A | 11/2001 |
| JP | 2001-318622 A | 11/2001 |
| JP | 2001-318628 A | 11/2001 |
| JP | 2001-356711 A | 12/2001 |
| JP | 2002-006777 A | 1/2002 |
| JP | 2002-026331 A | 1/2002 |
| JP | 2003-017273 A | 1/2003 |
| KR | 1992-0010788 A | 6/1992 |
| KR | 10-0198634 | 6/1999 |
| KR | 10-0254567 | 5/2000 |
| KR | 10-0289490 | 11/2001 |
| WO | WO-1992/014268 | 8/1992 |
| WO | WO-2003/038533 | 5/2003 |

OTHER PUBLICATIONS

Bonnel.M et al., "Si Poly TFT's With Low Off-Current for Flat Panel Displays", Eurodisplay '93 : The 13th International Display Research Conference, 1993, pp. 199-202.

Shimoyama.N et al., "30P-ZM-3 Increased Hot-Carrier Degradation Due to Water in TEOS/O3-Oxide", Extended Abstracts (The 39th Spring Meeting, 1992); The Japan Society of Applied Physics and Related Societies, Mar. 28, 1992, No. 2, p. 723.

U.S. Office Action (U.S. Appl. No. 10/407,184) dated Dec. 2, 2004.

Pending Claims (U.S. Appl. No. 12/533,669) dated Jul. 31, 2009.

Shimoyama.N et al., "30P-ZM-4 Increased Hot-Carrier Degradation Due to Water in TEOS/O3-Oxide(2)-Water Blocking Effect of an ECR-SIO2 Film Under TEOS/O3-Oxide and Improvement of Hot-Carrier Tolerance", Extended Abstracts (The 39th Spring Meeting, 1992); The Japan Society of Applied Physics and Related Societies, Mar. 28, 1992, No. 2, p. 723.

\* cited by examiner

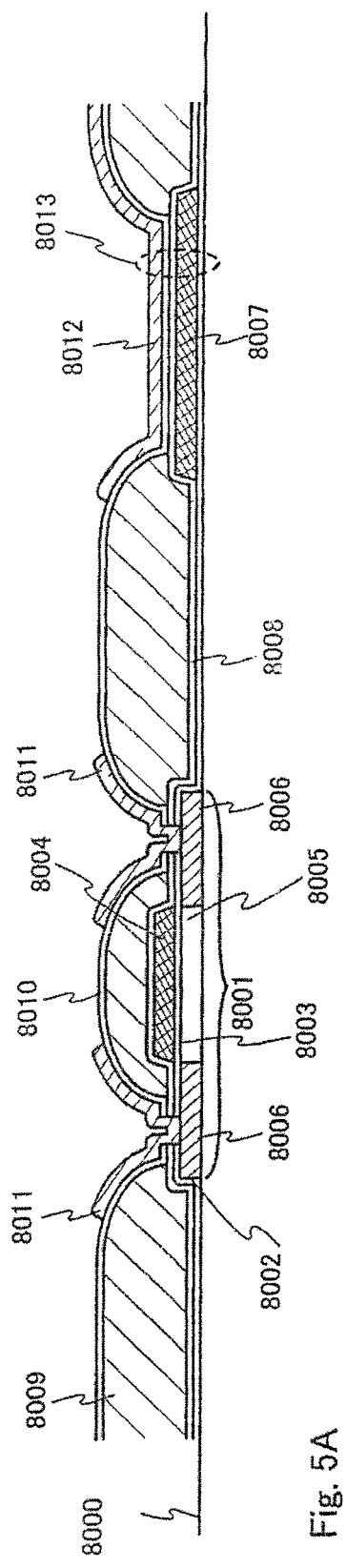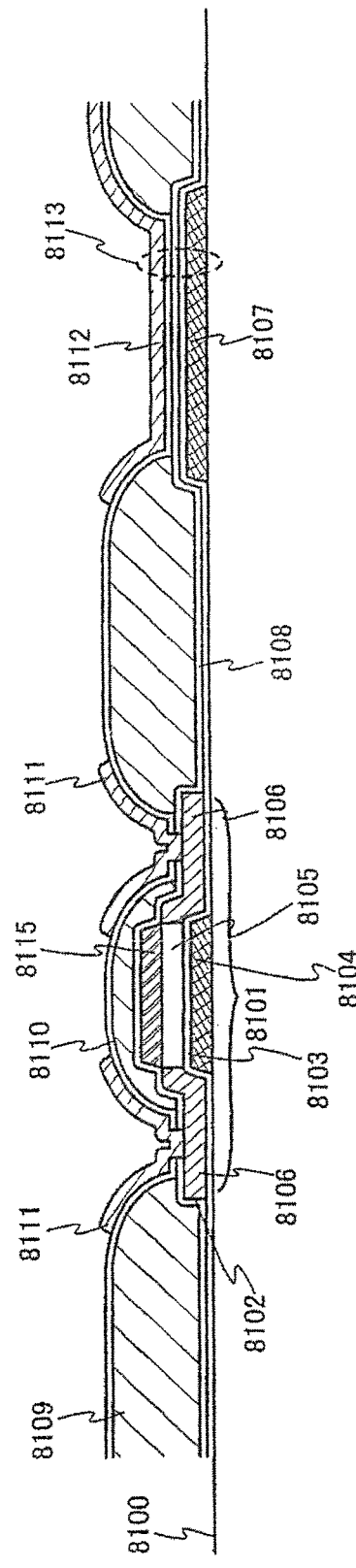
Fig. 5A
Fig. 5B

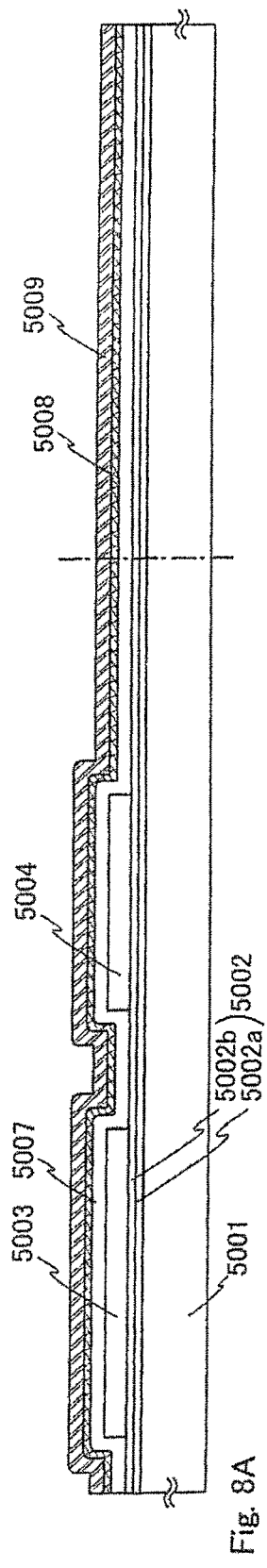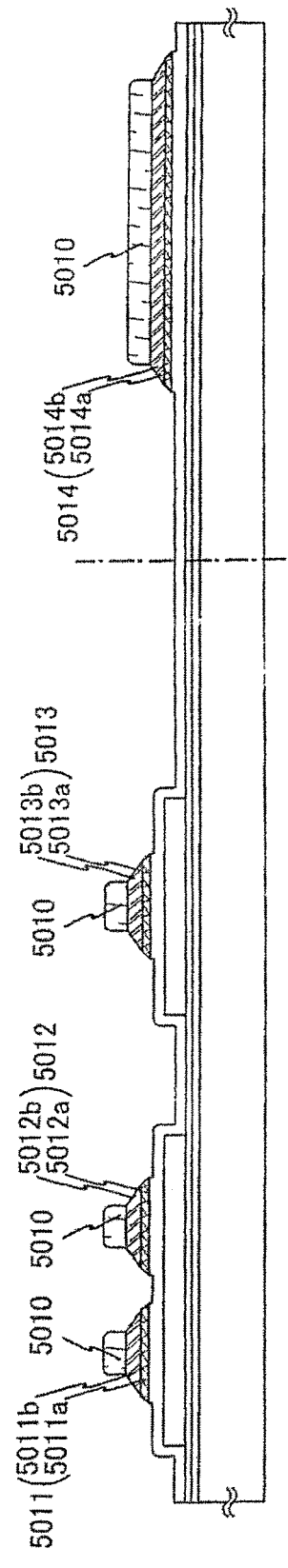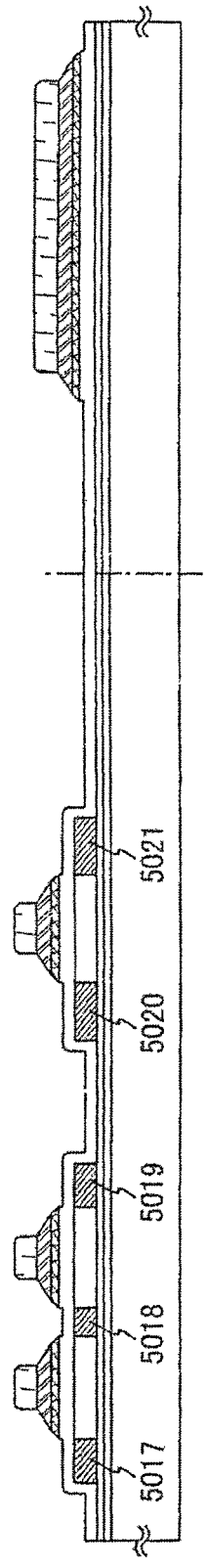
Fig. 8A
Fig. 8B
Fig. 8C

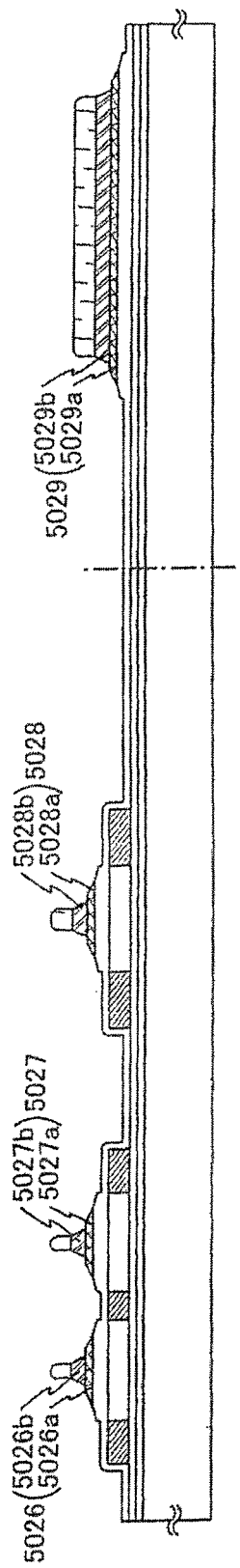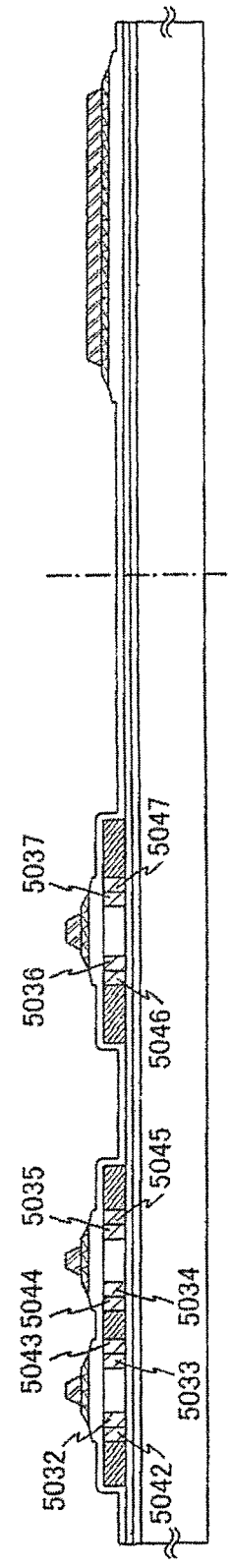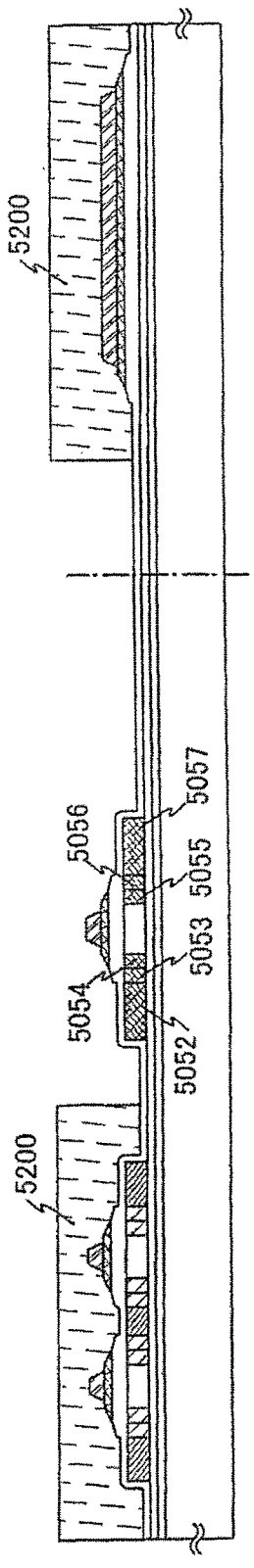

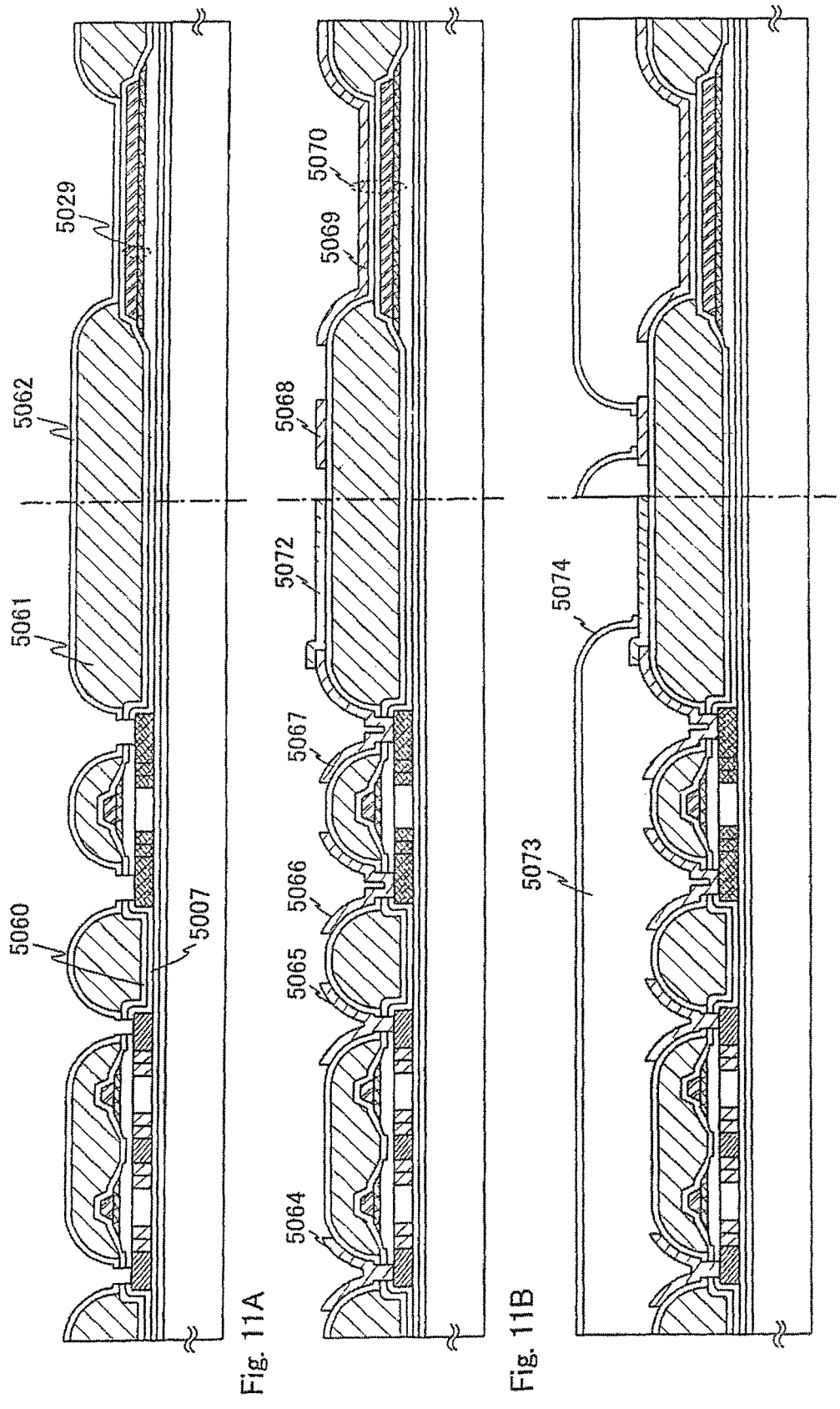

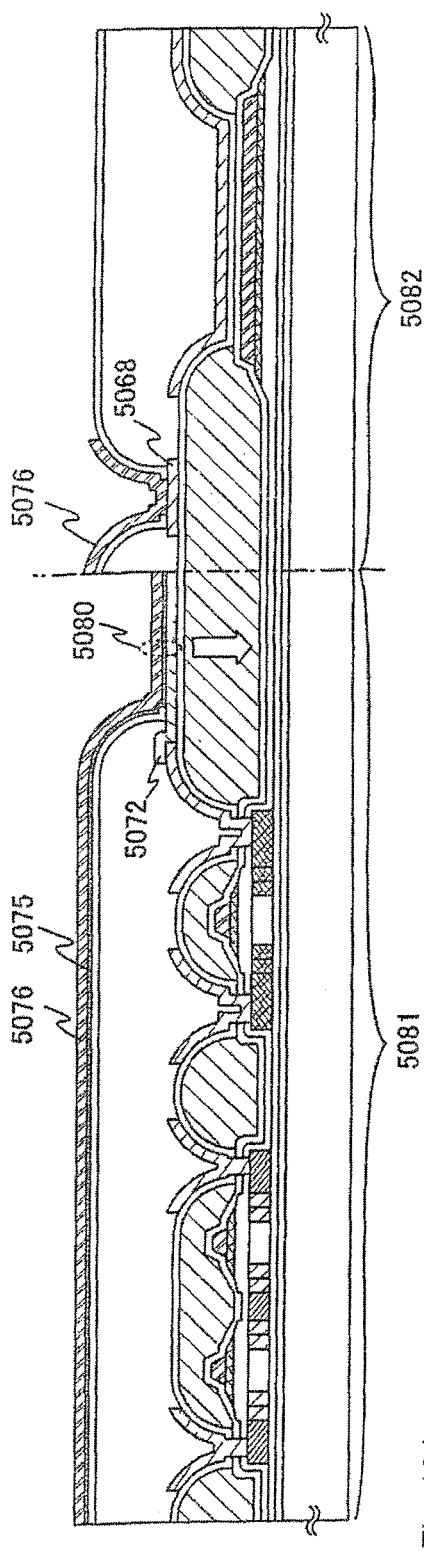
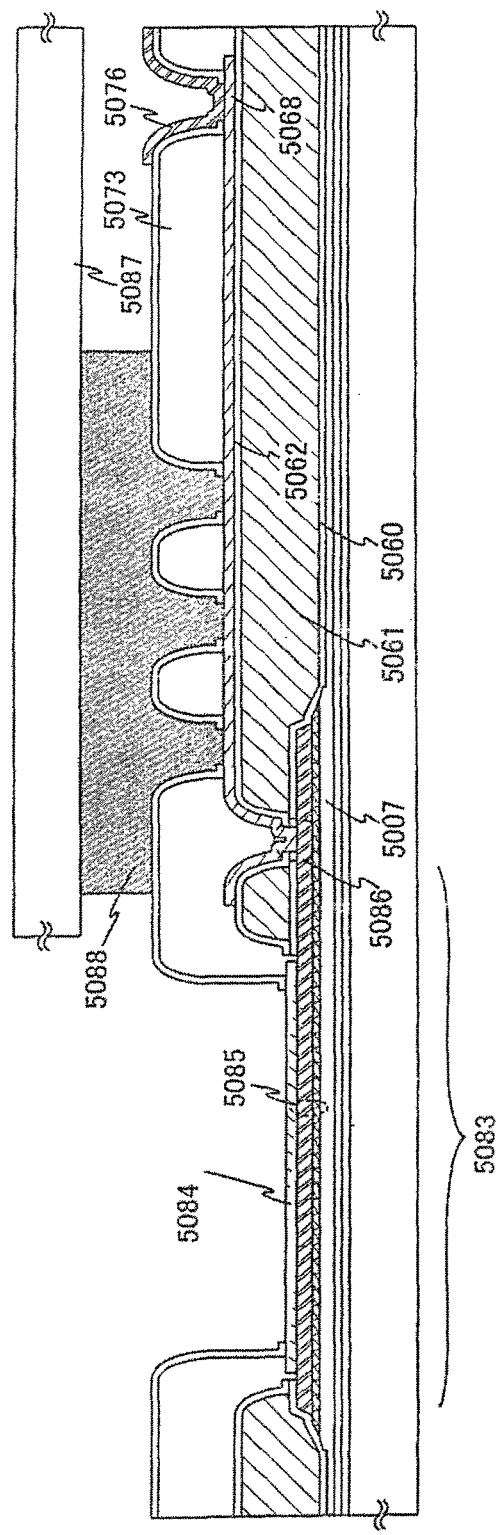
Fig. 12A
Fig. 12B

CV chanracteristic of MOS structure
( Si\SiO₂\RF-SP SiN\Li-dip\Al )

CV characteristic of MOS structure
(Si wafer\CVD SiN(100nm)\Al-Li)

SEMICONDUCTOR DISPLAY DEVICE

BACKGROUND OF THE INVENTION

Field of the Invention

The present invention relates to a semiconductor display device in which an organic resin film is used as an interlayer insulating film.

Description of the Related Art

In recent years, a technology for forming a TFT on a substrate has achieved a great advance, and application of the technology to an active matrix semiconductor display device which is one of semiconductor devices has been in progress. In particular, a TFT using a polycrystalline semiconductor film can operate at a high speed because it has field effect mobility higher than that of a conventional TFT using an amorphous semiconductor film. Thus, it is possible to perform control of pixels, which has been conventionally performed by a drive circuit provided outside a substrate, with a drive circuit formed on a substrate identical with a substrate on which the pixels are formed.

A TFT includes an active layer, which is obtained by adding impurities giving one conductive type to a semiconductor film, a gate electrode, and a gate insulating film provided between the active layer and the gate electrode. Further, in general, an interlayer insulating film including an insulating film is formed covering the TFT, and a wiring to be electrically connected to the TFT is formed on the interlayer insulating film.

Unless a surface of the interlayer insulating film is sufficiently planarized, when the wiring to be electrically connected to the TFT is formed on the interlayer insulating film, disconnection of the wiring is caused or the wiring becomes partially thin to increase a wiring resistance. In addition, in the case in which a pixel electrode is formed on the interlayer insulating film, unevenness is formed on a surface of the pixel electrode due to unevenness of a surface of the interlayer insulating film or a thickness of the pixel electrode cannot be uniformalized, which appears as irregularity in display.

Therefore, it is necessary to form the interlayer insulating film sufficiently thick, for example, approximately 1 to 5 μm in order to prevent unevenness from appearing on the surface of the interlayer insulating film according to a shape peculiar to the TFT.

The interlayer insulating films are roughly classified into an inorganic insulating film hereinafter referred to as inorganic resin-film and an insulating film including an organic resin having an insulating property (hereinafter referred to as organic resin film).

The inorganic insulating film is formed by chemical vapor deposition such as the CVD method or the sputtering method. Thus, in the case in which the inorganic insulating film is used as an interlayer insulating film, there is a disadvantage that treatment takes time because the inorganic insulating film has to be formed thick enough to allow a surface thereof to be planarized.

On the other hand, in the case in which the organic resin film is used, since an organic resin can be applied to a substrate on which a TFT is formed, an interlayer insulating film with a surface thereof planarized can be formed easily.

Incidentally, a wiring to be connected to a TFT is formed by forming a film having conductivity (hereinafter referred to a conductive film) on an interlayer insulating film in which a contact hole is opened and etching the conducive film.

In this case, both wet etching and dry etching can be used as the etching of the conductive film. However, the wet etching cannot cope with micronization of a wiring pattern of 3 μm or less because it is isotropic etching. On the other hand, the dry etching is capable of coping with micronization of a wiring pattern because anisotropic etching is possible with the dry etching.

However, a problem of the dry etching is that, when a conductive film on an interlayer insulating film including an organic resin film, a surface of the organic resin film is roughened. If the surface of the organic resin film is roughened, planarity of a surface of a pixel electrode to be formed on the organic resin film is spoiled, which affects display of a pixel.

In addition, organic resin is high in a water absorbing property and absorbs moisture in alkaline water solution, which is used in development, to swell. Thus, it is necessary to provide a step for subjecting the organic resin film to heating treatment after development to evaporate moisture contained therein. Moreover, even if the organic resin film is subjected to the heating treatment to evaporate the moisture, it is likely that the film absorbs moisture in an adjacent film or the atmosphere, the moisture in the film corrodes a wiring formed in contact with the organic resin film as time elapses, and long-term reliability of a panel is spoiled.

SUMMARY OF THE INVENTION

The present invention has been devised in view of the above and other drawbacks, and it is an object of the present invention to provide a semiconductor display device having an interlayer insulating film which can obtain planarity of a surface of the interlayer insulating film while controlling film formation time, can control time for heating treatment for removing moisture in the interlayer insulating film, and can prevent the moisture from being discharged to a film or an electrode adjacent to the interlayer insulating film.

In addition, since a circuit comprising a thin film transistor more or less has unevenness on its surface, it has been a general practice to planarize the surface with an organic resin film or the like in forming a liquid crystal element or a light emitting element thereon. However, facts described below have been proven by researches of the applicant. That is, it has been proved that, in the case in which a resin film is used as an interlayer insulating film and a contact hole is formed using a dry etching technique, a threshold voltage (Vth) of a completed thin film transistor fluctuate largely. For example, data shown in FIGS. 24A and 24B is a result of examining fluctuation of threshold voltages of a thin film transistor formed on an SOI substrate. Black circles in the figure indicate the case in which a laminated structure of a silicon nitride (SiN) film and an acrylic film is used as the interlayer insulating film and white triangles in the figure indicate the case in which a laminated structure of a silicon nitride oxide (SiNO) film and a silicon oxide nitride (SiON) film is used as the interlayer insulating film. In addition, in both the cases, the dry etching technique is used in an opening of the contact hole. Note that, "SiNO" and "SiON" are distinguished to mean that the former contains more nitrogen than oxygen and the latter contains more oxygen than nitrogen.

The data of FIGS. 24A and 24B is a graph in which the fluctuation of threshold voltages according to statistic processing, and a channel length (length of carrier movement) is represented by the horizontal axis and Vth fluctuation is represented by the vertical axis. "Quartile deviation" is known as statistic processing. The quartile deviation is a difference between a value of 25% and a value of 75% in a normal probability graph and is attracting attention as statistic processing which is not affected by an abnormal value. The applicant defines a difference between a value of 16% and a value of 84% as 16-percentile deviation based upon this quartile deviation (also referred to as 25-percentile deviation), and plots the value on the vertical axis as "Vth deviation". Note that, since the 16-percentile deviation is equivalent to ±σ in terms of a normal probability distribution, values multiplied by a coefficient, respectively, and changed to values which can be regarded as ±3σ are used in data plot. Judging only from the data, an n-channel TFT and a p-channel TFT which use the acrylic film as the interlayer insulating layer have fluctuation approximately four times and twice as large as fluctuation of those using the SiNO film and the SiON film as the interlayer insulating layer, respectively. It is clear that fluctuation is larger when the acrylic film is used. The applicant surmises that plasma damage at the time of the dry etching causes the acrylic film to capture charges, which results in fluctuation of threshold voltages.

The present invention has been devised in view of the above-described problems, and it is an object of the present invention to provide a technique for manufacturing a thin film transistor without fluctuating a threshold voltage thereof in manufacturing a display device using an organic resin film as interlayer insulating film to thereby attaining improvement of stability of an operation performance of the display device and increase in a design margin in circuit design. In addition, it is another object of the present invention to attain improvement of image quality of the display device.

In the present invention, the perimeter of an organic resin film containing a positive photosensitive acrylic resin is surrounded by an insulating film containing nitrogen which is less likely to transmit moisture compared with an organic resin.

More specifically, after forming a TFT, an inorganic insulating film containing nitrogen, which is less likely to transmit moisture compared with organic rein, is formed so as to cover the TFT. Next, an organic resin containing a photosensitive acrylic resin is applied to the inorganic insulating film to form an organic resin film. The organic resin film is partially exposed to light to open the same. Thereafter, an inorganic insulating film containing nitrogen which is less likely to transmit moisture compared with an organic resin is formed so as to cover the opened organic resin film. Then, in the opening part of the organic resin film, a gate insulating film and the two-layer inorganic insulating films containing nitrogen are etched to partially open them to expose an active layer of the TFT.

In this etching, it is essential to prevent the organic resin film from being exposed in a region where a part, in which it is desirable to avoid influence of moisture and influence of unevenness of a surface of a film, such as a wiring or a pixel electrode is formed on the surface in a later process. In addition, the other regions may be completely covered by the inorganic insulating film.

In general, since the inorganic insulating film has less etching damage due to dry etching compared with the organic resin film represented by an acrylic resin, roughness of a surface of the film is less. Thus, since unevenness is prevented from appearing on a surface of a pixel electrode or the like to be formed later or a thickness of the pixel electrode is prevented from becoming non-uniform, irregularity can be prevented from occurring in display.

In addition, since the organic resin film is covered by the inorganic insulting film containing nitrogen which is less likely to transmit moisture compared with the organic resin, discharge of moisture from the organic resin film can be controlled and, conversely, the organic resin film can be prevented from absorbing alkaline water solution, which is used in development, to swell, and time for heating treatment for the purpose of removing moisture after the development can be controlled. Thus, discharge of moisture in the organic resin film to an adjacent film or electrode can be prevented more and long-term reliability of a panel can be improved. Moreover, in the case in which a light emitting element represented by an organic light emitting diode (OLED) is used, luminance of the light emitting element can be prevented from deteriorating due to moisture discharged from the organic resin film.

Note that, in the present invention, a photosensitive acrylic resin is used as the organic resin film. The photosensitive organic resin includes a positive photosensitive organic resin in which a part exposed to an energy beam such as light, electron, or ion is removed and a negative photosensitive organic resin in which an exposed part remains. FIGS. 1A to 1D show sectional views of an opening part of the positive acrylic resin and an opening part of the negative acrylic resin.

In the case of the positive acrylic resin, as shown in FIG. 1A, after a first inorganic insulating film 7000 is formed, a positive acrylic organic resin film is formed and a part to be opened of the organic resin film is exposed to light. Thereafter, the part exposed to light is removed by development to expose the first inorganic insulating film 7000. Then, a second inorganic insulating film 7002 is formed so as to cover a positive organic resin film 7001 on which the opening part is formed and the exposed part of the first inorganic insulating film 7000.

FIG. 1B shows an enlarged view of a section of the opened positive organic resin film 7001. As shown in FIG. 1B, the section of the opening part curves, and an inclination of a tangent line in each part on the surface of the positive organic resin film 7001 with respect to a substrate direction (horizontal direction) is smaller as the part is farther apart from the opening part. In other words, a curvature radius at respective contact points R1, R2, and R3 increases continuously as the point is farther apart from the opening part and draws a parabola. Then, curvature centers of all the contact points R1, R2, and R3 exist on the positive organic resin film 7001 side (substrate side).

In the case in which the positive acrylic resin is used, an angle θ of a tangent line with respect to the substrate at a contact point in a part in the opening part where the positive organic resin film 7001 breaks can be set to 30° or more and 65° or less.

In this way, in the case of the positive organic resin film, all the curvature centers on the surface of the organic resin film in the opening part exist on the substrate side, and a part of the film is less likely to remain in a part, which is desired to be opened, due to etching failure. Thus, contact failure is less likely to occur, which leads to increase in yield.

In the case of the negative acrylic resin, as shown in FIG. 1C, after a first inorganic insulating film 7005 is formed, a negative acrylic organic resin film is formed, and parts other than a part to be opened of the organic resin film is exposed to light. Thereafter, the part not exposed to light is removed by development to expose the first inorganic insulating film 7005. Then, a second inorganic insulating film 7007 is formed so as to cover a negative organic resin film 7006 in which the opening part is formed and the exposed part of the first inorganic insulating film 7005.

FIG. 1D shows an enlarged view of a section of the opened negative organic resin film 7006. As shown in FIG.

1D, the section of the opening part curves, and an inclination of a tangent line in each part on the surface of the negative organic resin film 7006 with respect to a substrate direction (horizontal direction) is smaller as the part is farther apart from a contact point R0 of the opening part toward the outside of the opening part. In other words, a curvature radius at respective contact points R1, R2, and R3 increases continuously as the point is farther apart from the contact point R0 toward the outside of the opening part. For example, in the case of the positive photosensitive acrylic resin, although depending upon conditions of exposure to light, a minimum curvature radius is approximately 3 to 30 μm at an end part thereof. The inclination of the tangent line decreases toward the center of the opening part from the contact point R0, and the curvature radius also continuously increases. Then, curvature centers of all the contact points R1, R2, and R3 located on the outside of the opening part from the contact point R0 exist on the negative organic resin film 7006 side (substrate side). A curvature center of a contact point R-1 located on the center side of the opening part from the contact point R0 exists on the opposite side of the negative organic resin film 7006 (opposite side of the substrate).

As described above, in the case of the negative organic resin film, the curvature center on the surface of the organic resin film in the opening part exists on the opposite side of the substrate from the contact point R0 toward the center. The longer a distance from the contact point R0 to a part where the negative organic resin film 7006 breaks, the smaller an area of the opening part becomes and more likely contact failure is caused. This distance changes depending upon conditions of etching or a thickness of the organic resin film before being opened. In addition, although FIGS. 1A to 1D are illustrated with the case of the acrylic resin as an example, in the case in which an organic resin film other than the acrylic organic resin film is used, the distance from the contact point R0 to the part where the organic resin film breaks also changes depending upon a composition of the resin. Thus, even in the case in which the negative photosensitive organic resin is used to form the sectional shape shown in FIGS. 1C and 1D, it is possible to use the negative photosensitive organic resin if the distance from the contact point R0 to the part where the negative organic resin film 7006 breaks can be reduced to a degree for allowing the area of the opening part to be secured sufficiently.

However, the organic resin which can form the sectional shape shown in FIGS. 1A and 1B is still preferable to the organic resin which forms the sectional shape shown in FIGS. 1C and 1D as a resin to be used as a part of an interlayer insulating film. However, all positive photosensitive organic resins cannot always form the sectional shape shown in FIGS. 1A and 1B. Although positive acrylic can form the sectional shape shown in FIGS. 1A and 1B, positive polyimide cannot form the sectional shape.

In addition, in the case in which non-photosensitive organic resin is used, general dry etching is used for forming an opening in an interlayer insulating film. The dry etching is an etching method using an active radical or plasma of a reactive gas. Since the interlayer insulating film has a thickness ten times as large as that of a gate insulating film, the dry etching with an object of forming an opening takes time. When a substrate on which a TFT is formed is exposed to plasma for a long time, threshold values of the TFT are likely to fluctuate to a positive side due to so-called charging damage in which a hole is trapped in the gate insulating film. Thus, by using the photosensitive organic resin to form an opening with the wet etching as in the present invention, time required for the dry etching can be reduced significantly and fluctuation of threshold value of the TFT can be controlled.

Further, in the present invention, a gate electrode of a TFT and an electrode of a capacitor used in a drive circuit of a semiconductor display device are simultaneously formed, and a wiring to be electrically connected to the TFT and the other electrode of the capacitor are simultaneously formed. Then, in an opening part of an organic resin film, two-layer inorganic insulating films overlap each other with the two electrodes between them, whereby a storage capacitor is formed.

Since the semiconductor display device has its drive circuit formed on a glass substrate, the number of pins of an FPC can be reduced, physical impact resistance can be increased, and a size of the semiconductor display device itself can be controlled. In addition, decrease in yield due to connection failure of the FPC can be controlled.

Note that, representative examples of the drive circuit include a scanning line drive circuit for selecting one or several pixels among plural pixels, which are provide in a pixel portion, in order and a signal line drive circuit for inputting a signal having image information (video signal) in the selected pixel(s). Both the pixels can be formed using the present invention. In particular, it is possible to use a capacitor to be formed using the present invention, for example, as a capacitor included in a capacity division type D/A conversion circuit of the signal line drive circuit.

In addition, it is also possible to form other semiconductor devices used in a semiconductor display device such as a controller or a CPU, which have been formed on a silicon substrate, integrally on a glass substrate using the present invention. In particular, a capacitor to be manufactured using the capacitor of the present invention can be used as a capacitor included in every circuit such as a booster circuit, a Dynamic Random Access Memory (DRAM), an analog latch, a capacity division type D/A conversion circuit, and a protection circuit for coping with static electricity.

By integrally forming other circuits used in a semiconductor display device such as a controller and a CPU on a glass substrate, the number of pins of an FPC can be further reduced, physical impact resistance can be increased, and a size of the semiconductor display device itself can be controlled. In addition, decrease in yield due to connection failure of the FPC can be further controlled.

BRIEF DESCRIPTION OF THE DRAWINGS

FIGS. 5A and 5B are sectional views of a TFT and a storage capacitor included in a semiconductor display device of the present invention;

FIGS. 8A to 8C are views showing a manufacturing method of the semiconductor display device of the present invention;

FIGS. 9A to 9C are views showing the manufacturing method of the semiconductor display device of the present invention;

FIGS. 11A to 11C are views showing the manufacturing method of the semiconductor display device of the present invention;

FIGS. 12A and 12B are views showing the manufacturing method of the semiconductor display device of the present invention;

DESCRIPTION OF THE PREFERRED EMBODIMENTS

Figure 2:
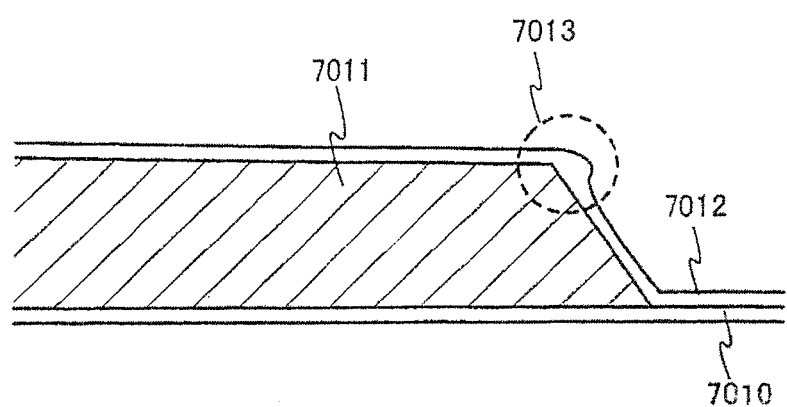
FIG. 2 is a sectional view of a photosensitive positive polyimide film in an opening part.

FIG. 2 shows an enlarged view of a section in an opening part in the case in which positive photosensitive polyimide is used. As shown in FIG. 2, a positive polyimide film is formed after a first inorganic insulating film 7010 is formed in the same manner as the case in which positive acrylic is used. Then, an opening part is formed by exposing a part to be opened to light and developing the part, whereby the first inorganic insulating film 7010 is exposed. Then, a second inorganic insulating film 7012 is formed so as to cover a positive polyimide film 7011 in which the opening part is formed and the exposed part of the first inorganic insulating film 7010.

Since an end of the positive polyimide film 7011 in which the opening part is formed is not sufficiently roundish in the opening part, when a wiring is formed on the second inorganic insulating film 7012, a film thickness of the wiring is reduced at the end to increase a wiring resistance. In addition, in the case in which the second inorganic insulating film 7012 is formed by the chemical vapor deposition method, since the end of the positive polyimide film 7011 in the opening part is not sufficiently roundish, the second inorganic insulating film 7012 may be formed thicker at an end 7013 than other parts of the film. This is because, when material molecules constituting a thin film adhere to a surface to be formed, the material molecules move on the surface looking for a stable site but tend to gather in a part of a shape having an acute angle (shape to be a projected part) like an upper end of a contact hole. This tendency is particularly conspicuous in the evaporation method. If the second inorganic insulating film 7012 is formed thick partially at the end 7013, a film thickness of the wiring is reduced especially at the end to increase the wiring resistance.

Therefore, it is not preferable to use the positive photosensitive polyimide or other organic resins, which form a sectional shape not in curves at an end of an opening part as shown in FIG. 2, as a part of an interlayer insulating film of the present invention.

Figure 1A:
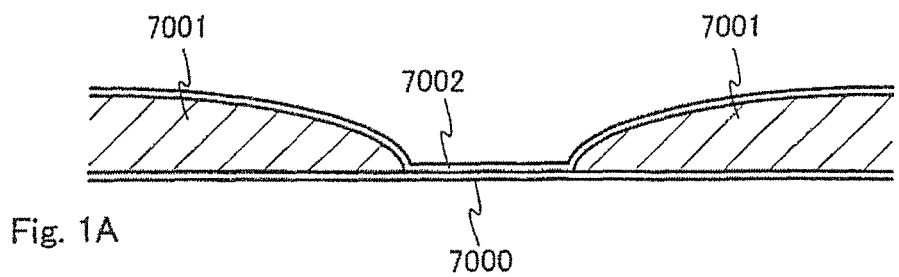
FIGS. 1A to 1D are sectional views of a photosensitive acrylic film in an opening part.
Figure 3A:
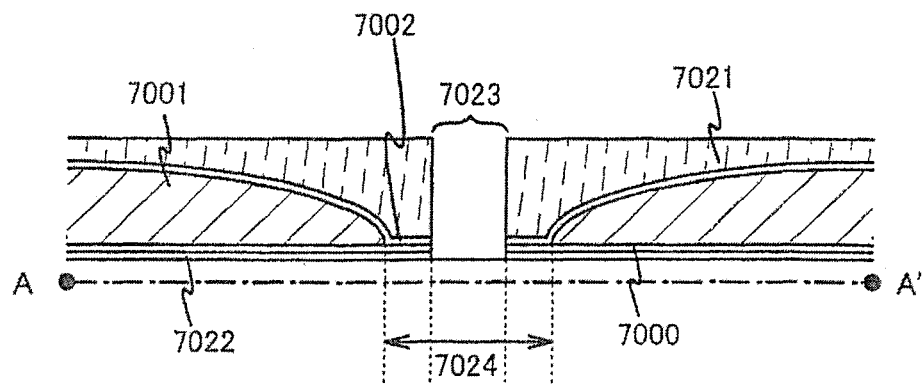
FIGS. 3A to 3C are sectional views of a contact hole.

Next, a section in the vicinity of a contact hole at the time when the contact hole is formed by etching to open an inorganic insulating film will be described. After forming films to a state shown in FIG. 1A, a resist mask 7021 is formed and a first inorganic insulating film 7000, a second inorganic insulating film 7002, and a gate insulating film 7022 formed between the first inorganic insulating film 7000 and a semiconductor film are subjected to dry etching to form a contact hole 7023 as shown in FIG. 3A.

Figure 3B:
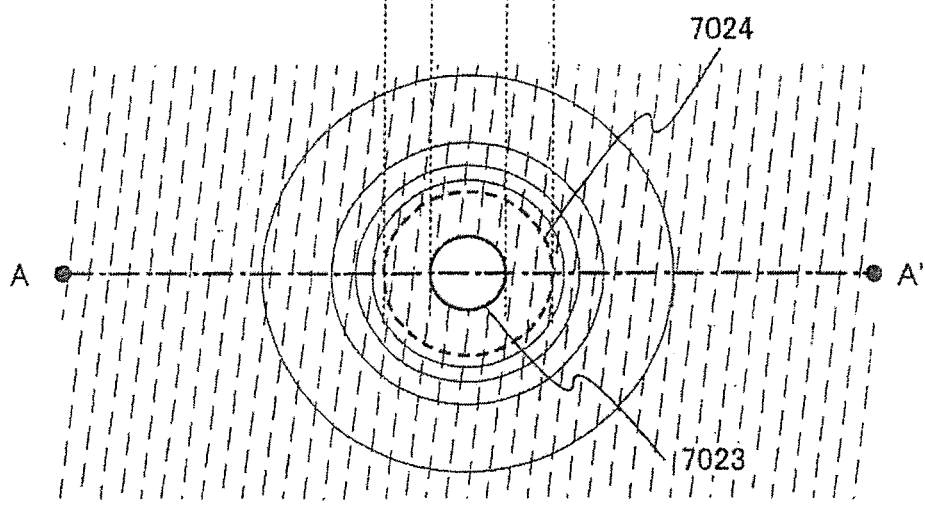

Note that FIG. 3B shows a state in the vicinity of the contact hole viewed from an upper surface for a substrate. For ease of inspection of the drawing, a state after removing the resist mask 7021 is shown. A section along line A-A' of FIG. 3B corresponds to FIG. 3A.

Figure 3C:
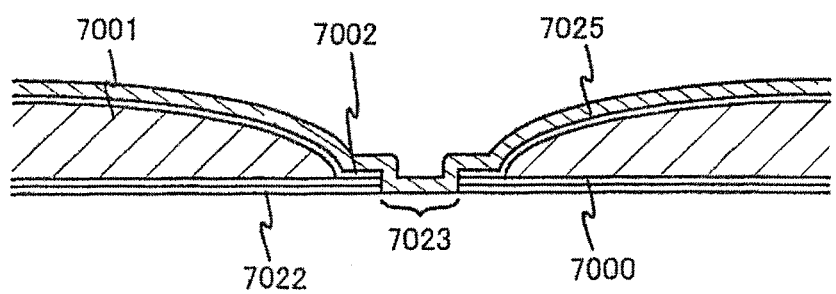

The contact hole 7023 is formed inside an opening part 7024 formed in the positive organic resin film 7001. Then, as shown in FIG. 3C, a conductive film 7025 is formed on the second inorganic insulating film 7002 covering the contact hole 7023. Then, the conductive film 7025 is patterned to form a wiring.

Figure 4A:
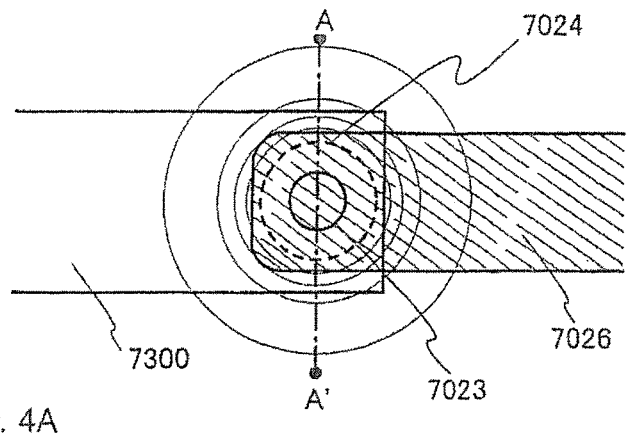
FIGS. 4A to 4D are views showing a positional relationship between the contact hole and a wiring.
Figure 4B:
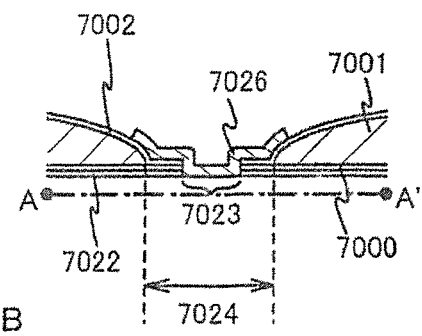

FIGS. 4A to 4D show a positional relationship between the opening part 7024 of the positive organic resin film 7001 and the contact hole 7023. FIG. 4A shows a plan view of the vicinity of the contact hole 7023. Note that FIG. 4B shows a sectional view along line A-A' of FIGS. 4A to 4D.

A wiring 7026 obtained by patterning the conductive film 7025 is connected with a semiconductor film 7300 formed under the gate insulating film 7022 via the contact hole 7023 formed substantially in the center of the opening part 7024.

In this way, the contact hole 7023 is formed so as to be always settled in the opening part 7024 and is adapted such that the positive organic resin film 7001 is not exposed in the contact hole 7023 due to the formation of the contact hole 7023.

Note that, although the contact hole 7023 is laid out so as to be located substantially in the center of the opening part 7024 in FIGS. 4A and 4B, the present invention is not limited to this structure. The contact hole 7023 only has to be settled in the opening part 7024 and may deviate to one direction.

Figure 4C:
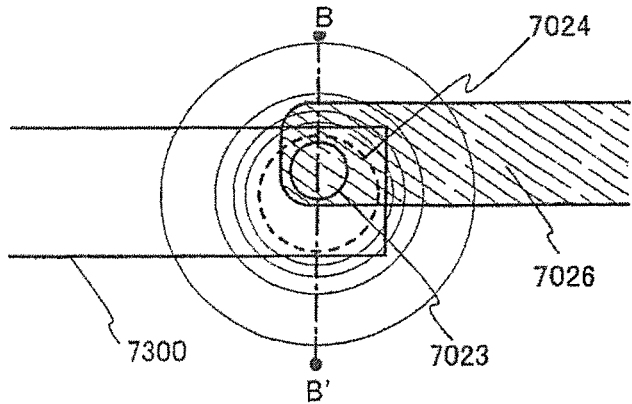
Figure 4D:
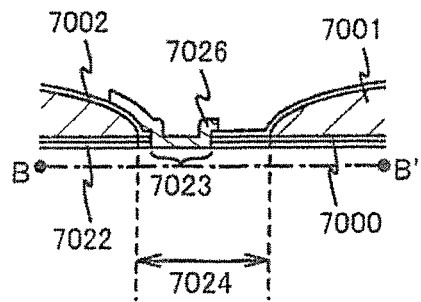

FIG. 4C shows a plan view of the vicinity of the contact hole 7023 in the case in which the contact hole 7023 deviates to one direction in the opening part 7024. Note that FIG. 4D shows a sectional view along B-B' of FIG. 4C.

The wiring 7026 obtained by patterning the conductive film 7025 is connected with a semiconductor film (not shown) formed under the gate insulating film 7022 via the contact hole 7023, which deviates to an upper side direction in the figure, in the opening part 7024.

Next, structures of a TFT and a capacitor in the semiconductor display device of the present invention will be described with reference to FIGS. 5A and 5B.

In FIG. 5A, a TFT 8001 is formed on an insulating surface 8000. The TFT 8001 is a top gate type and has a semiconductor film 8002, a gate insulating film 8003 which is in contact with the semiconductor film 8002, and a gate electrode 8004 which is in contact with the gate insulating film 8003. The semiconductor film 8002 is in contact with the insulating surface 8000. The semiconductor film 8002 has a channel forming region 8005 and impurity regions 8006 which exist on both sides of the channel forming region 8005.

On the other hand, a first electrode for capacitor 8007 formed on the gate insulating film 8003 can be formed from the same conductive film as the gate electrode 8004.

Then, a first inorganic insulating film 8008 is formed so as to cover the TFT 8001 and the first electrode for capacitor 8007. The first inorganic insulating film 8008 is an insulating film containing nitrogen and has a characteristic that it is less likely to penetrate moisture than an organic resin film to be formed later.

Then, after applying a photosensitive organic resin on the first inorganic insulating film 8008, an organic resin film 8009 having an opened part is formed by baking the photosensitive organic resin and exposing and developing a part desired to be opened. At this point, a part of the first inorganic insulating film 8008 is exposed in the opening part.

Then, a second inorganic insulating film 8010 is formed covering the organic resin film 8009 and a part of the first inorganic insulating film 8008 exposed in the opening part. Similar to the first inorganic insulating film 8008, the second inorganic insulating film 8010 is an insulating film containing nitrogen and has a characteristic that it is less likely to penetrate moisture than an organic resin film.

Note that since the first inorganic insulating film 8008 and the second inorganic insulating film 8010 are used as dielectric bodies of a capacitor, a capacitance of the capacitor is reduced if the films are too thick and treatment time required for film formation cannot be controlled. On the contrary, if the films are too thin, an effect that penetration of moisture is prevented is weakened. The first inorganic insulating film 8008 and the second inorganic insulating film 8010 preferably have a film thickness of approximately 10 nm to 200 nm, respectively, and a total film thickness of the two layers is preferably approximately 20 nm to 400 nm.

Then, in the opening part of the organic resin film 8009, the gate insulating film 8003, the first inorganic insulating film 8008, and the second inorganic insulating film 8010 are subjected to dry etching so as to expose a part of the semiconductor film and a contact hole is formed. In this case, the semiconductor film 8002 has an effect as an etching stopper.

In this case, the first inorganic insulating film 8008 and the second inorganic insulating film 8010, which exist on the first electrode for capacitor 8007, are covered by a resist mask so as not to be etched.

Then, the resist mask is removed by a developer. In general, an alkaline water solution is used as the developer, which contains a large quantity of moisture. In the present invention, since the organic resin film 8009 is covered by the first inorganic insulating film 8008 and the second inorganic insulating film 8010, the organic resin film 8009 is never exposed to the developer directly. Thus, the moisture of the developer is less likely to enter the organic resin film 8009 and swell. Therefore, after removing the resist mask with the developer, time for heating treatment for the purpose of removing moisture can be reduced.

Then, a conductive film is formed on the second inorganic insulating film 8010 so as to cover the contact hole. Then, a wiring 8011 connected to the semiconductor film 8002 and the second electrode for capacitor 8012 are formed by etching the conductive film. The second electrode for capacitor 8012 is overlapped the first electrode for capacitor 8007 with the first inorganic insulating film 8008 and the second inorganic insulating film 8010 between them. A storage capacitor 8013 is formed of the second electrode for capacitor 8012, the first inorganic insulating film 8008, the second inorganic insulating film 8010, and the first electrode for capacitor 8007.

The present invention has characteristics in that this storage capacitor 8013 is used as a capacitor included in a drive circuit of a semiconductor display device, a CPU, a controller, or other circuits. Note that the TFT 8001 may be a top gate type or a bottom gate type.

Figure 21:
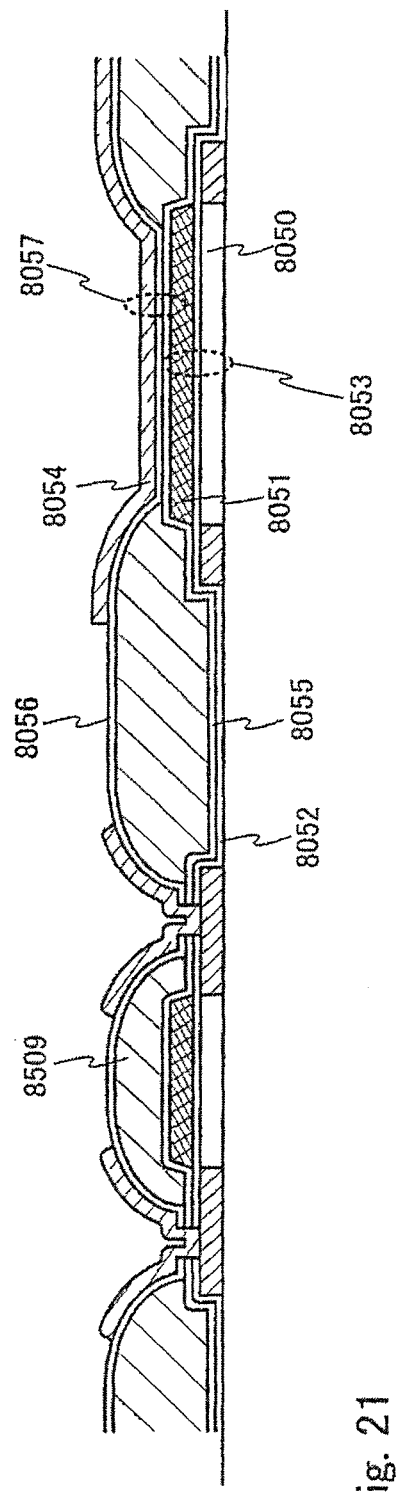
FIG. 21 is a sectional view of a semiconductor display device of the present invention.

Note that, in addition to the storage capacitor of FIG. 5A, a storage capacitor may be further formed between the semiconductor film and the first electrode for capacitor 8007. FIG. 21 shows an example in which a first storage capacitor 8053 is formed by overlapping a first electrode for capacitor 8051 and a semiconductor film for capacitor 8050 with each other with a gate insulating film 8052 between them. In addition, similar to FIG. 5A, the first electrode for capacitor 8051 and the second electrode for capacitor 8054 with each other with a first inorganic insulating film 8055 and a second inorganic insulating film 8056 between them, whereby a second storage capacitor 8057 is formed. In this way, a capacitance in the same area can be increased by forming the capacitors one on top of the other.

FIG. 5B shows a structure of the semiconductor device of the present invention in the case in which a TFT is a bottom gate.

In FIG. 5B, a TFT 8101 is formed on an insulating surface 8100. The TFT 8101 is a bottom gate type and has a semiconductor film 8102, a gate insulating film 8103 which is in contact with the semiconductor film 8102, and a gate electrode 8104 which is in contact with the gate insulating film 8103. The gate electrode 8104 is in contact with the insulating surface 8100. The semiconductor film 8102 has a channel forming region 8105 and impurity regions 8106 which exists on both sides of the channel forming region 8105. In addition, reference numeral 8115 denotes an insulating film which is used as a mask when an impurity is added to the semiconductor film, which is referred to as a channel protection film in this context.

On the other hand, a first electrode 8107 formed on the insulating surface 8100 can be formed from the same conductive film as the gate electrode 8104.

Then, a first inorganic insulating film 8108 is formed so as to cover the TFT 8101 and the first electrode for capacitor 8107. Then, after applying a photosensitive organic resin on the first inorganic insulating film 8108, an organic resin film 8109 having an opening part is formed by baking the photosensitive organic resin and exposing and developing a part desired to be opened. At this point, a part of the first inorganic insulating film 8108 is exposed in the opening part.

Then, a second inorganic insulating film 8110 is formed covering the organic resin film 8109 and a part of the first inorganic insulating film 8108 exposed in the opening part. Similar to the first inorganic insulating film 8108, the second inorganic insulating film 8110 is an insulating film containing nitrogen and has a characteristic that it is less likely to penetrate moisture than an organic resin film.

Note that since the first inorganic insulating film 8108 and the second inorganic insulating film 8110 are used as dielectric bodies of a capacitor, a capacitance of the capacitor is reduced if the films are too thick and treatment time required for film formation cannot be controlled. On the contrary, if the films are too thin, an effect that penetration of moisture is prevented is weakened. In addition, in the case of the TFT of the bottom gate type, the gate insulating film 8103 also exists between the first electrode for capacitor 8107 and a second electrode for capacitor 8112 and is used as a part of the dielectric body. Thus, it is necessary to determine film thicknesses of the first inorganic insulating film 8108 and the second inorganic insulating film 8110 taking into account a film thickness of the gate insulating film 8103. The first inorganic insulating film 8108 and the second inorganic insulating film 8110 preferably have a film thickness of approximately 10 nm to 200 nm, respectively, and a total film thickness of the three layers including the gate insulating film 8103 is preferably approximately 30 nm to 500 nm.

Then, in the opening part of the organic resin film 8109, the gate insulating film 8103, the first inorganic insulating film 8108, and the second inorganic insulating film 8110 are subjected to dry etching so as to expose a part of the semiconductor film and a contact hole is formed. In this case, the semiconductor film 8102 has an effect as an etching stopper. In addition, the first inorganic insulating film 8108 and the second inorganic insulating film 8110, which exist on the first electrode for capacitor 8107, are covered by a resist mask so as not to be etched.

Then, the resist mask is removed by a developer. In general, an alkaline water solution is used as the developer, which contains a large quantity of moisture. In the present invention, since the organic resin film 8109 is covered by the first inorganic insulating film 8108 and the second inorganic insulating film 8110, the organic resin film 8109 is never exposed to the developer directly. Thus, the moisture of the developer is less likely to enter the organic resin film 8109 and swell. Therefore, after removing the resist mask with the developer, time for heating treatment for the purpose of removing moisture can be reduced.

Then, a conductive film is formed on the second inorganic insulating film 8110 so as to cover the contact hole. Then, a wiring 8111 connected to the semiconductor film 8102 and the second electrode for capacitor 8112 are formed by etching the conductive film. The second electrode for capacitor 8112 overlaps the first electrode for capacitor 8107 with the first inorganic insulating film 8108 and the second inorganic insulating film 8110 between them. A storage capacitor 8113 is formed of the second electrode for capacitor 8112, the first inorganic insulating film 8108, the second inorganic insulating film 8110, and the first electrode for capacitor 8107.

Next, a structure of a drive circuit of the semiconductor display device manufactured using the present invention will be described citing an example.

Figure 6A:
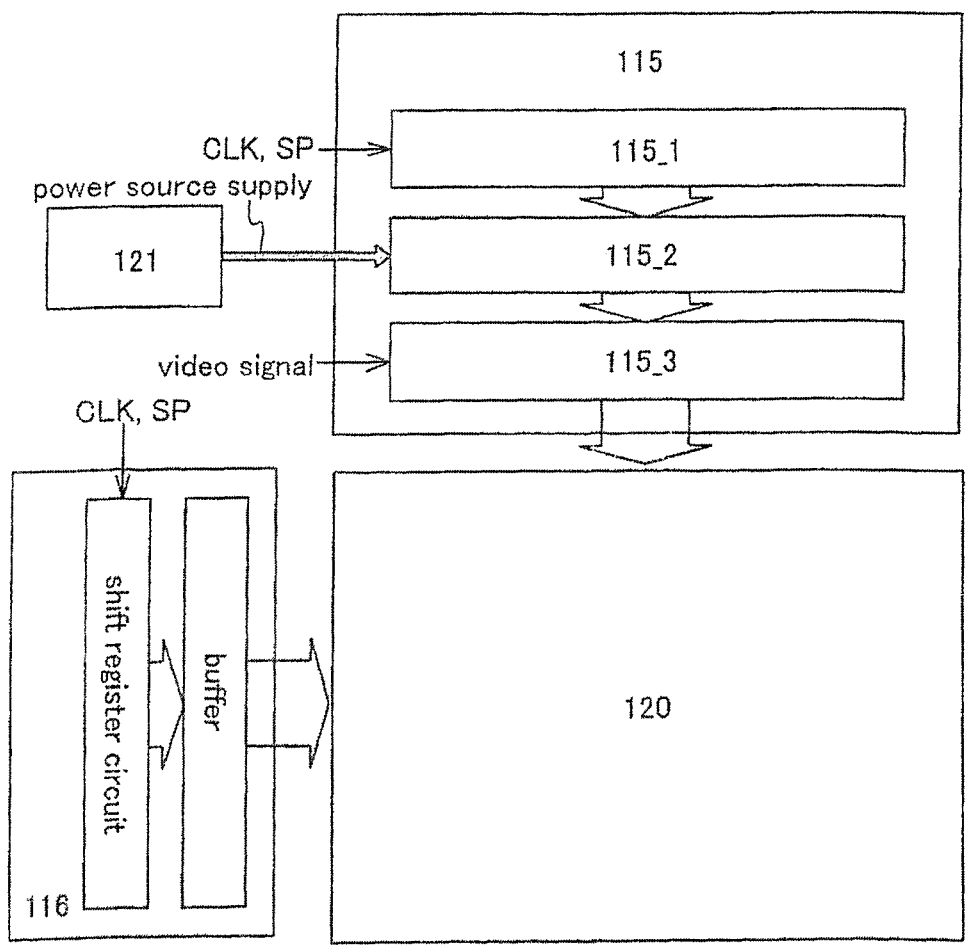
FIGS. 6A and 6B are a block diagram and a circuit diagram of a drive circuit of the semiconductor display device of the present invention, respectively.

FIG. 6A shows a block diagram of the semiconductor display device of the present invention. Reference numeral 115 denotes a signal line drive circuit; 116, a scanning line drive circuit; and 120, a pixel portion. The signal line drive circuit 115 has a shift register circuit 115_1, a level shift circuit 115_2, and a sampling circuit 115_3. Note that, in FIG. 6A although the level shift circuit 115_2 is provided between the shift register circuit 115_1 and the sampling circuit 115_3, the level shift circuit 115_2 may be incorporated in the shift register circuit 115_1.

In addition, reference numeral 121 denotes a booster circuit, which can generate a power supply voltage of various levels, which is supplied to a drive circuit, from a supplied power supply voltage.

When a clock signal (CLK) and a start pulse signal (SP) are supplied to the shift register circuit 115_1, the shift register circuit 115_1 generates a timing signal for controlling timing for sampling a video signal.

The generated timing signal is supplied to the level shift circuit 115_2. On the other hand, the power supply voltage generated in the booster circuit 121 has been supplied to the level shift circuit 115_2, and the level shift circuit 115_2 amplifies an amplitude of a voltage of the timing signal using the supplied power supply voltage.

The timing signal amplified in the level shift circuit 115_2 is inputted in the sampling circuit 115_3. Then, the video signal inputted in the sampling circuit 115_3 is sampled synchronizing with the timing signal inputted in the sampling circuit 115_3 and is inputted in the pixel portion 120 via the signal line.

Figure 6B:
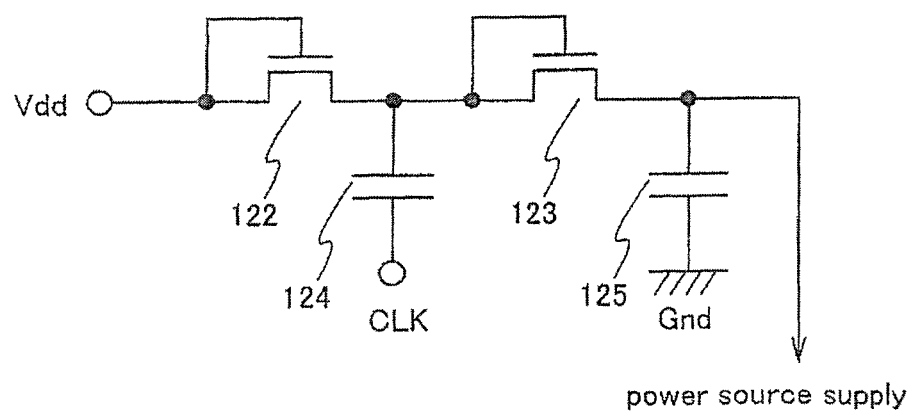

FIG. 6B shows an example of a circuit diagram of the booster circuit 121. The booster circuit shown in FIG. 6B has two n-channel TFTs 122 and 123 and two storage capacitors 124 and 125. Note that the booster circuit shown here is only an example, and the present invention is not limited to this booster circuit.

A power supply voltage Vdd is supplied to both of a gate and a drain of the n-channel TFT 122. Note that Vdd>Gnd. In addition, both of the gate and the drain of the n-channel TFT 123 are connected to a source of the n-channel TFT 122. One of two electrodes for capacitor included in the capacitor 124 is connected to the source of the n-channel TFT 122, and the clock signal CLK is supplied to the other of the two electrodes. In addition, one of two electrodes for capacitor included in the capacitor 125 is connected to a source of the n-channel TFT 123 and the other is connected to a Gnd. A voltage of the source of the n-channel TFT 123 is supplied to the level shift circuit 115_2 as a power supply voltage.

Figure 7A:
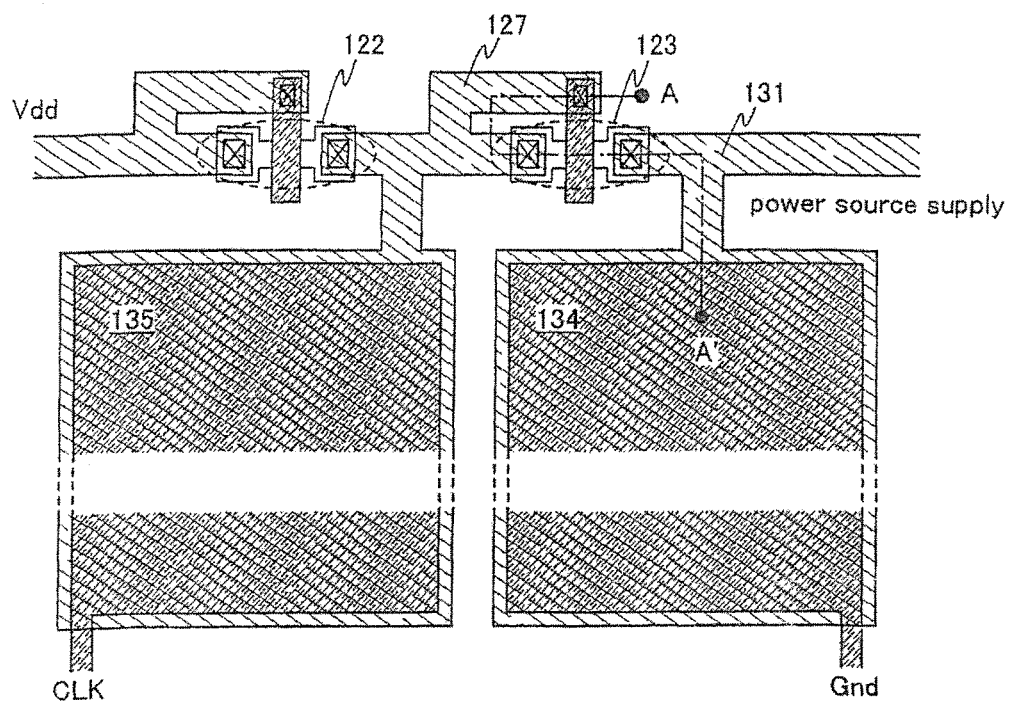
FIGS. 7A and 7B are a mask diagram and a circuit diagram of a booster circuit, respectively.
Figure 7B:
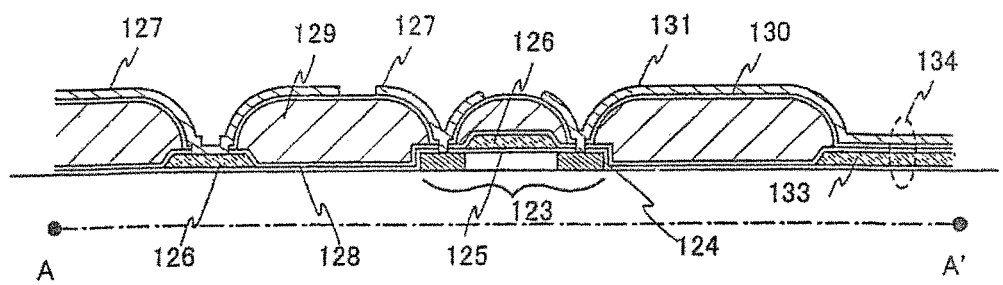

FIG. 7A shows a plan view of the booster circuit shown in FIG. 6B. Note that a sectional view along A-A' of FIG. 7A corresponds to FIG. 7B.

The n-channel TFT 123 has a semiconductor film 124, a gate insulating film 125, and a gate electrode 126. Further, the n-channel TFT 123 is covered by a first inorganic insulating film 128. In addition, an organic resin film 129 having an opening part is formed on the first inorganic insulating film 128, and a second inorganic insulating film 130 is formed covering the organic resin film 129.

A wiring 127 is connected to the gate electrode 126 and the semiconductor film 124 in the opening part of the organic resin film 129 via contact holes formed in the gate insulating film 125, the first inorganic insulating film 128, and the second inorganic insulating film 130. In addition, the wiring 131 is connected to the semiconductor film 124 in the opening part of the organic resin film 129 via the contact holes formed in the gate insulating film 125, the first inorganic insulating film 128, and the second inorganic insulating film 130.

In addition, a first electrode for capacitor 133 overlaps a second electrode for capacitor, which is a part of the wiring 131, sandwiching the first inorganic insulating film 128 and the second inorganic insulating film 130 between them in the opening part of the organic resin film 129, whereby a storage capacitor 134 is formed.

Figure 23:
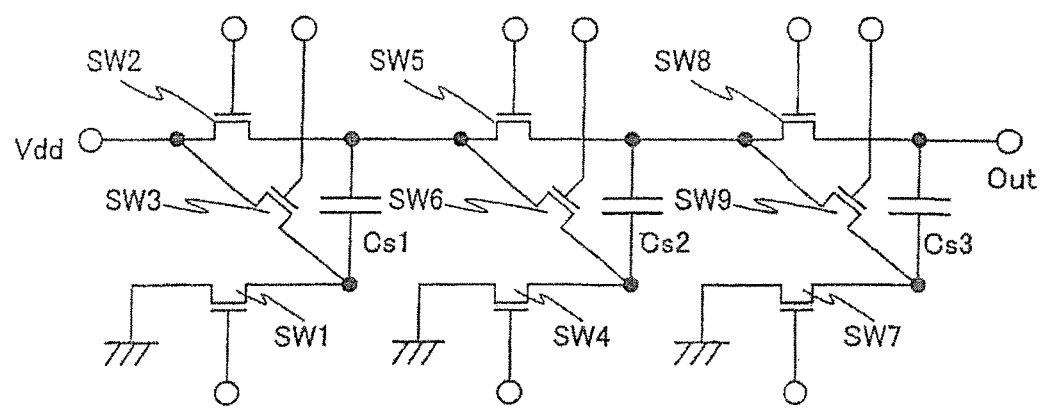
FIG. 23 is a circuit diagram of a booster circuit included in the semiconductor display device of the present invention.
Figure 24:
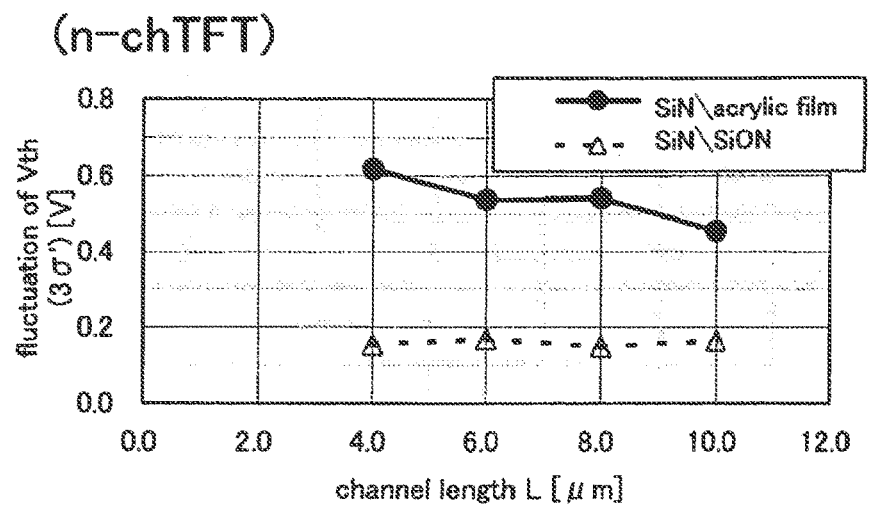
FIGS. 24A and 24B show graphs representing a channel length and a threshold value of a TFT.
Figure 24:
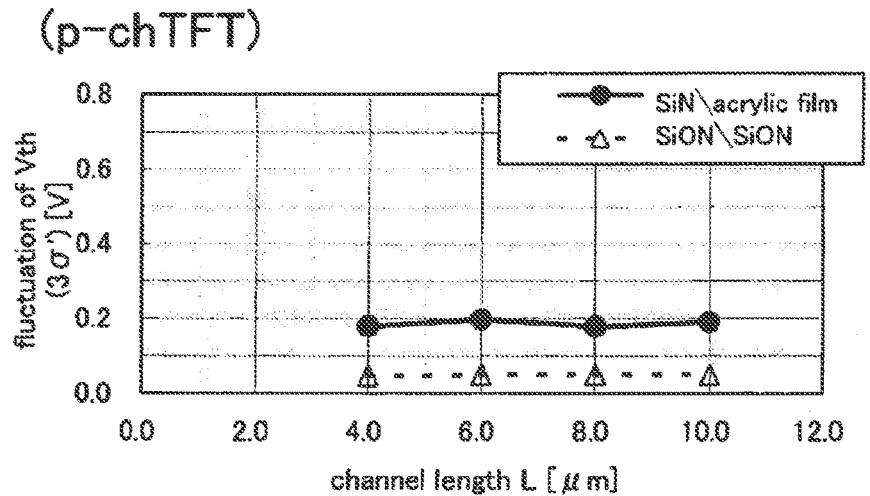

Note that the booster circuit included in the semiconductor device of the present invention is not limited to this structure. FIG. 23 shows a booster circuit having a structure different from that of the booster circuit shown in FIG. 6B. In the booster circuit shown in FIG. 13 three TFTs correspond to one capacitor, and the number of capacitors and the number of TFT can be increased in accordance with a value of a predetermined voltage with a capacitor and three TFTs corresponding to the capacitor as one unit. In FIG. 23, TFTs SW1 to SW9 are provided as switching elements corresponding to capacitors Cs1, Cs2, and Cs3, respectively.

One electrodes (first electrodes) of the capacitors Cs1, Cs2, and Cs3 are connected to the ground via the SW1, SW4, and SW7, respectively. In addition, the other electrodes (second electrodes) of the capacitors Cs1, Cs2, and Cs3 are connected to the first electrodes via the SW2 and the SW3, the SW5 and the SW6, and the SW8 and the SW9, respectively. Further, Vdd (Vdd>ground) is given to a node of the SW2 and the SW3. A node of the SW5 and the SW6 is connected to the first electrode of the capacitor Cs1. In addition, a node of the SW8 and the SW9 is connected to the first electrode of the capacitor Cs2. A voltage of the first electrode of the capacitor Cs3 is given to a circuit of a later stage.

Although the description is made citing the storage capacitor of the booster circuit in this embodiment mode, a storage capacitor to be manufactured using the present invention is not limited to this but can be used in other circuits of the semiconductor display device. In addition, the semiconductor circuit using the semiconductor circuit as described in this embodiment mode may be formed on a substrate different form the substrate on which the pixel portion is formed.

Embodiments of the present invention will be hereinafter described.

First Embodiment

In this embodiment, a manufacturing method of a light emitting device which is one of the semiconductor devices of the present invention will be described. Note that, in this embodiment, a method of manufacturing a pixel portion and a storage capacitor included in a circuit provided around the pixel portion will be described in detail.

First, as shown in FIG. 8A, a base film 5002 including an insulating film such as a silicon oxide film, a silicon nitride film, or a silicon oxide nitride film is formed on a substrate 5001 including glass such as barium borosilicate glass or aluminoborosilicate glass represented by #7059 glass, #1737 glass, and the like of Corning Corporation. For example, a silicon oxide nitride film 5002a produced from $SiH_4$, $NH_3$, and $N_2O$ is formed with a thickness of 10 to 200 nm (preferably 50 to 100 nm) by the plasma CVD method, and a silicon oxide nitride hydrogenate film 5002b produced from $SiH_4$ and $N_2O$ is likewise formed with a thickness of 50 to 200 nm (preferably 100 to 150 nm) in a laminated shape. Although the base film 5002 is shown as having a two layer structure in this embodiment, it may be formed as a single layer film of the insulating film or a structure in which the insulating film is laminated in two or more layers.

Island-shaped semiconductor layers 5003 and 5004 are formed of a crystalline semiconductor film which is produced by crystallizing a semiconductor film having an amorphous structure with the laser crystallization method or the publicly known thermal crystallization method. These island-shaped semiconductor layers 5003 and 5004 are formed with a thickness of 25 to 80 nm (preferably 30 to 60 nm). A material of the crystalline semiconductor film is not limited but is preferably formed of silicon, silicon germanium (SiGe), or the like.

In order to produce the crystalline semiconductor film with the laser crystallization method, an excimer laser, a YAG laser, or a $YVO_4$ laser of a pulse oscillation type or a continuous light emitting type is used. In the case in which these lasers are used, it is favorable to use a method of condensing laser beams, which are radiated from a laser oscillator irradiating, in a linear shape and irradiating the laser beams on a semiconductor film. Although conditions of crystallization are appropriately selected by an operator, in the case in which the excimer laser is used, it is favorable to set a pulse oscillation frequency to 300 Hz and a laser energy density to 100 400 $mJ/cm^2$ (representatively, 200 to 300 $mJ/cm^2$). In addition, in the case in which the YAG laser is used, it is favorable to use a second higher harmonic and set the pulse oscillation frequency to 30 to 300 kHz and the laser energy density to 300 to 600 $mJ/cm^2$ (representatively, 350 to 500 $mJ/cm^2$). Then, the laser beams condensed in a linear shape are irradiated over an entire surface of a substrate with a width of 100 to 1000 μm, for example, 400 μm. At this point, an overlap ratio of the linear laser beams is set to 50 to 90%.

Note that not only silicon but also silicon germanium may be used in the semiconductor film. In the case in which silicon germanium is used, a concentration of the germanium is preferably about 0.01 to 4.5 atomic %.

Subsequently, a gate insulating film 5007 covering the island-shaped semiconductor layers 5003 and 5004 is formed. The gate insulating film 5007 is formed of an insulating film containing silicon with a thickness of 40 to 150 nm using the plasma CVD method or the sputtering method. In this embodiment, the gate insulating film 5007 is formed of a silicon oxide nitride film with a thickness of 120 nm. It is needless to mention that the gate insulating film 5007 is not limited to such a silicon oxide nitride film and an insulating film containing other silicon may be used in a single layer or a laminated layer structure. For example, in the case in which a silicon oxide film is used, the silicon oxide film is formed by mixing TEOS (Tetraethyl Ortho-silicate) and $O_2$ with the plasma CVD method, setting a reactive pressure and a substrate temperature thereof to 40 Pa and 300 to 400° C., respectively, and discharging the mixed TEOS and $O_2$ at a high frequency (13.56 MHz), a power flux density of 0.5 to 0.8 $W/cm^2$. The silicon oxide film produced in this way can thereafter obtain favorable characteristics as a gate insulating film through thermal annealing at 400 to 500° C. In addition, aluminum nitride can be used as a gate insulting film. Since the aluminum nitride has relatively high thermal conductivity, heat generated by a TFT can be diffused efficiently. Further, after forming silicon oxide, silicon oxide nitride, or the like which does not contain aluminum, a film laminated aluminum nitride thereon may be used as a gate insulating film.

Then, a first conductive film 5008 and a second conductive film 5009 for forming a gate electrode on the gate insulating film 5007 are formed. In this embodiment, the first conductive film 5008 is formed of Ta with a thickness of 50 to 100 nm and the second conductive film 5009 is formed of W with a thickness of 100 to 300 nm.

A Ta film is formed by sputtering a target of Ta with Ar. In this case, if an appropriate amount of Xe or Kr is added to Ar, an internal stress of the Ta film can be eased to prevent exfoliation of the film. In addition, a Ta film of an α phase has a resistivity of approximately 20 μΩcm and can be used for a gate electrode, but a Ta film of a β phase has a resistivity of approximately 180 μΩcm and is not suitable to use as a gate electrode. In order to form the Ta film of the α phase, if tantalum nitride having a crystal structure close to the α phase of Ta is formed as a base of Ta with a thickness of approximately 10 to 50 nm, the Ta film of the α phase can be obtained easily.

In the case in which a W film is formed, it is formed by the sputtering method targeting W. Besides, the W film can also be formed by thermal CVD method using tungsten hexafluoride ($WF_6$). In any case, it is necessary to realize a low resistivity in order to use the W film as a gate electrode, and it is desirable to set a resistivity of the W film to 20 μΩcm or less. Reduction of a resistivity can be realized in the W film by increasing a size of a crystal grain. However, in the case in which a large quantity of impurity components such as oxygen are contained in W, crystallization is hindered and a resistivity of the W film is increased. Consequently, in the case in which the W film is formed by the sputtering method, the W film is formed using a W target with a purity of 99.99 or 99.9999% and giving careful consideration such that impurities are not mixed from a chemical vapor at the time of film formation, whereby a resistivity of 9 to 20 μΩcm can be realized.

Note that, although the first conductive film 5008 is assumed to be Ta and the second conductive film 5009 is assumed to be W, both the conductive films are not specifically limited but may be formed of an element selected out of Ta, W, Ti, Mo, Al, and Cu, or an alloy material or a compound material containing the element as a main component. In addition, a semiconductor film represented by a polysilicon film doped with an impurity element such as phosphorus may be used. As examples of a combination other than this embodiment, a combination of the first conductive film formed of tantalum nitride (TaN) and the second conductive film formed of W, a combination of the first conductive film formed of tantalum nitride (TaN) and the second conductive film formed of Al, and a combination of the first conductive film formed of tantalum nitride (TaN) and the second conductive film formed of Cu are preferable. In addition, a semiconductor film represented by a polysilicon film doped with an impurity element such as phosphorus or an AgPdCu alloy may be used as the first conductive film and the second conductive film.

In addition, the gate electrode is not limited to the two-layer structure but may be a three-layer structure of, for example, a tungsten film, a film of an alloy of aluminum and silicon (Al—Si), and a titanium nitride film laminated one after another. Further, in the case in which the gate electrode is formed in the three-layer structure, tungsten nitride may be used instead of tungsten, a film of an alloy of aluminum and titanium (Al—Ti) may be used instead of the film of the alloy of aluminum and silicon (Al—Si), and a titanium film may be used instead of the titanium nitride film.

Note that it is important to appropriately select an optimum etching method or a type of an etchant depending upon materials of conductive films.

Next, a mask 5010 with resist is formed, and first etching treatment is performed in order to form an electrode and a wiring. In this embodiment, the first etching treatment is performed by using an ICP (Inductively Coupled Plasma) etching method, mixing $CF_4$ and $Cl_2$ in a gas for etching, and inputting an RF (13.56 MHz) power of 500 W in an electrode of a coil type at a pressure of 1 Pa to generate plasma. An RF (13.56 MHz) power of 100 W is also inputted on the substrate side (sample stage), and a substantially negative self-bias voltage is applied thereto. In the case in which $CF_4$ and $Cl_2$ are mixed, both of the W film and the Ta film are etched to the same degree.

With the above-mentioned etching conditions, ends of the first conductive film and the second conductive film are formed in a taper shape according to an effect of the bias voltage applied to the substrate side by making a shape of the mask with resist suitable. An angle of the taper portion becomes 15 to 45°. In order to etch a gate insulating without leaving a residuum on the gate insulating film, it is favorable to increase etching time at a rate of approximately 10 to 20%. Since a selection ratio of a silicon oxide nitride film with respect to the W film is 2 to 4 (representatively, 3), a surface where the silicon oxide nitride film is exposed is etched by approximately 20 to 50 nm by over etching treatment. In this way, conductive layers of a first shape 5011 to 5014 (first conductive layers 5011*a* to 5014*a* and second conductive layers 5011*b* to 5014*b*) consisting of the first conductive layer and the second conductive layer are formed by the first etching treatment. At this point, in the gate insulating film 5007, a region not covered by the conductive layers of the first shape 5011 to 5014 is etched by approximately 20 to 50 nm, and a thinned region is formed (FIG. 8B).

Then, first doping treatment is performed to add an impurity element for giving an N type is added (FIG. 8C). A method of doping may be an ion dope method or an ion implantation method. As conditions of the ion dope method, a doze quantity is set to $1×10^{13}$ to $5×10^{14}$ atoms/cm$^2$, and an acceleration voltage is set to 60 to 100 keV. As the impurity element giving the N type, an element belonging to the XV group, typically, phosphorus (P) or arsenic (As) is used. In this embodiment, phosphorus (P) is used. In this case, the conductive layers 5011 to 5013 becomes a mask against the impurity element giving the N type, and first impurity regions 5017 to 5021 are formed in a self-aligning manner. The impurity element giving the N type is added to the first impurity regions 5017 to 5021 in a concentration range of $1×10^{20}$ to $1×10^{21}$ atoms/cm$^3$.

Next, second etching treatment is performed as shown in FIG. 9A. Similarly, the second etching treatment is performed by using the ICP (Inductively Coupled Plasma) etching method, mixing $CF_4$ and $Cl_2$ in an etching gas, and inputting an RF (13.56 MHz) power of 500 W in an electrode of a coil type at a pressure of 1 Pa to generate plasma. An RF (13.56 MHz) power of 50 W is inputted on the substrate side (sample stage), and a self-bias voltage lower than that in the first etching treatment is applied thereto. The W film is subjected to the anisotropic etching under such conditions and Ta which is the first conductive film is subjected to the anisotropic etching at an etching speed, which is slower than that for etching the W film, to form conductive layers of a second shape 5026 to 5029 (first conductive layers 5026*a* to 5029*a* and second conductive layers 5026*b* to 5029*b*). At this point, in the gate insulating film 5007, a region not covered by the conductive layers of the second shape 5026 to 5029 are further etched by approximately 20 to 50 nm and a thinned region is formed.

An etching reaction of the W film and the Ta film due to the mixed gas of $CF_4$ and $Cl_2$ can be surmised from a radical or an ion type to be generated and a vapor pressure of a reaction product. Comparing vapor pressures of fluorides and chlorides of W and Ta are compared, $WF_6$ which is a fluoride of W has an extremely high vapor pressure and the other fluorides and chlorides $WCl_5$, $TaF_5$, and $TaCl_5$ have similar vapor pressures of the same degree. Therefore, both of the W film and the Ta film are etched with the mixed gas of $CF_4$ and $Cl_2$. However, when an appropriate quantity of $O_2$ is added to this mixed gas, $CF_4$ and $O_2$ react with each other to change to CO and F, and a large quantity of an F radical or an F ion is generated. As a result, an etching speed of the W film having a high vapor pressure of a fluoride increases. On the other hand, Ta has relatively little increase in an etching speed even if F increases. In addition, since Ta is more likely to be oxidized compared with W, a surface of Ta is oxidized by adding $O_2$. Since an oxide of Ta does not react with fluorine or chlorine, the etching speed of the Ta film further decreases. Therefore, it becomes possible to differentiate etching speeds of the W film and the Ta film and to make the etching speed of the W film higher than that of the Ta film.

Then, as shown in FIG. 9B, second doping treatment is performed. In this case, an impurity element giving the N type is doped with conditions that a doze quantity is decreased to be lower than that in the first doping treatment and an acceleration is increased to be higher than that in the first doping treatment. For example, the second doping treatment is performed with the acceleration voltage of 70 to 120 keV and the doze quantity of $1 \times 10^{13}$ atoms/$cm^2$ to form a new impurity region on the inner side of the first impurity regions which are formed in the island-shaped semiconductor layer in FIG. 8C. The doping is performed such that the impurity element is also added to a region on the lower side of the second conductive layers 5026a to 5028a using the conductive layers of the second shape 5026 and 5028 as a mask against the impurity element. In this way, third impurity regions 5032 to 5037 overlapping the second conductive layers 5026a to 5028a and second impurity regions 5042 to 5047 between the first impurity regions and the third impurity regions. The impurity element giving the N type is adapted to have a concentration of $1 \times 10^{17}$ to $1 \times 10^{19}$ atoms/$cm^3$ in the second impurity regions and $1 \times 10^{16}$ to $1 \times 10^{18}$ atoms/$cm^3$ in the third impurity regions.

Then, as shown in FIG. 9C, fourth impurity regions 5052 to 5057 of an opposite conductive type of the first conductive type are formed in the island-shaped semiconductor layer 5004 forming the p-channel TFT. The impurity regions are formed in a self-aligning manner using the second conductive layer 5028b as a mask against an impurity element. At this point, the island-shaped semiconductor layer 5003 and the first electrode for capacitor 5029 forming the n-channel TFT are coated entirely with a resist mask 5200. Although phosphorus is added at different concentrations in the respective impurity regions 5052 to 5057, the impurity regions are formed by an ion dope method using diborane ($B_2H_6$) and are adapted to have an impurity concentration of $2 \times 10^{20}$ to $2 \times 10^{21}$ atoms/$cm^3$ in any region.

The impurity regions are formed in the respective island-shaped semiconductor layers in the above-mentioned process. The second conductive layers 5026 to 5028 overlapping the island-shaped semiconductor layers function as the gate electrode. In addition, the second conductive layer 5029 functions as the first electrode for capacitor.

Then, with an object of conductive type control, a process for activating the impurity elements added to the respective island-shaped semiconductor layer is performed. This process is performed by a thermal anneal method using an anneal furnace. Besides, an laser anneal method or a rapid thermal anneal method (RTA method) can be applied. In the thermal anneal method, the process is performed in a nitrogen atmosphere with an oxygen concentration of 1 ppm or less, preferably 0.1 ppm or less, at a temperature of 400 to 700° C., representatively, 500 to 600° C. In this embodiment, heat treatment is performed at 500° C. for four hours. However, in the case in which the wiring material used in the second conductive layers 5026 to 5029 is susceptible to heat, it is preferable to form an interlayer insulating film (containing silicon as a main component) in order to protect the wiring and the like and, then, activate the film.

Moreover, a process for performing heat treatment at a temperature of 300 to 450° C. for 1 to 12 hours in an atmosphere containing 3 to 100% of nitrogen to hydrogenate the island-shaped semiconductor layer is performed. This process is a process for terminating dangling bond of a semiconductor layer with thermally excited hydrogen. As other means of hydrogenation, plasma hydrogenation (using hydrogen excited by plasma) may be performed.

Figure 10A:
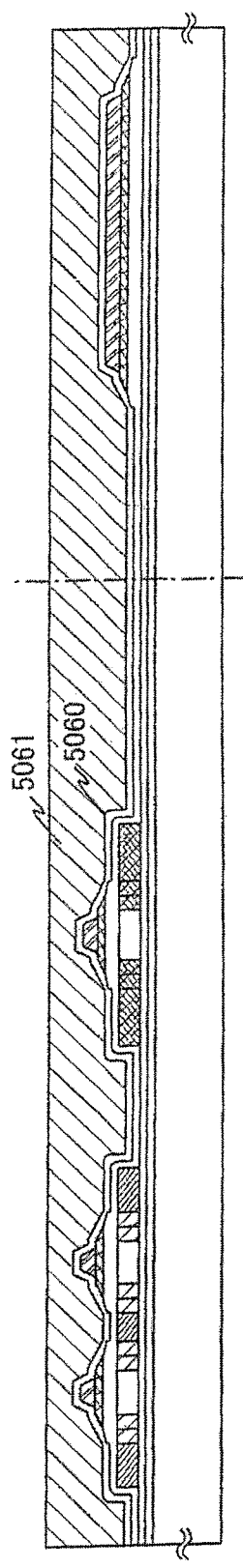
FIGS. 10A to 10C are views showing the manufacturing method of the semiconductor display device of the present invention.

Subsequently, as shown in FIG. 10A, a first inorganic insulating film 5060 consisting of silicon oxide nitride with a thickness of 10 to 200 nm is formed using the CVD method. Note that the first inorganic insulating film is not limited to a silicon oxide nitride film, and any inorganic insulating film containing nitrogen may be used as the first inorganic insulating film as long as the film can suppress penetration of moisture to and from an organic resin film to be formed later. For example, silicon nitride, aluminum nitride, or aluminum oxide nitride can be used.

Note that aluminum nitride has a relatively high thermal conductivity and can effectively diffuse heat generated in a TFT or a light emitting element.

Next, an organic resin film 5061 consisting of a positive photosensitive organic resin is formed on the first inorganic insulating film 5060. Although the organic resin film 5061 is formed using positive photosensitive acrylic in this embodiment, the present invention is not limited to this.

In this embodiment, the organic resin film 5061 is formed by applying positive photosensitive acrylic with a spin coat method and baking the same. Note that a film thickness of the organic resin film 5061 is set to be approximately 0.7 to 5 µm (preferably, 2 to 4 µm) after baking.

Figure 10B:
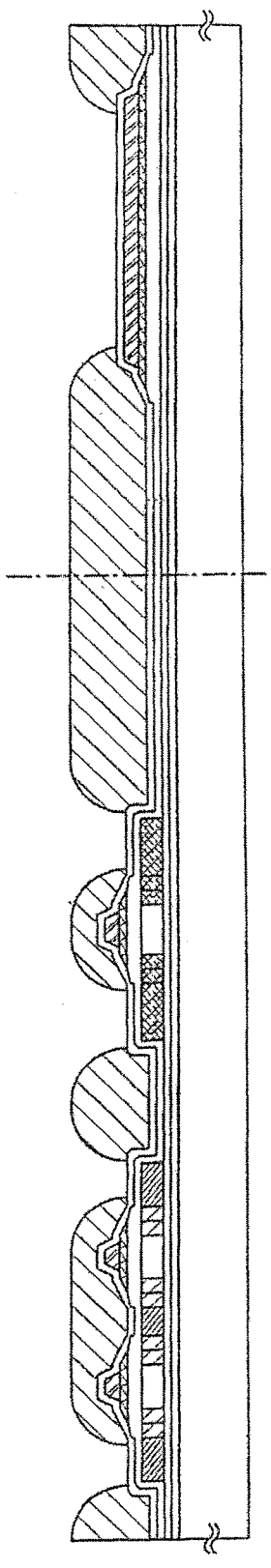

Next, a part where an opening part is desired to be formed is exposed to light using a photo mask. Then, after developing the part with a developer containing TMAH (tetramethyl ammonium hydroxide) as a main component, the substrate is dries, and baking is performed at 220° for approximately one hour. Then, as shown in FIG. 10B, the opening part is formed in the organic resin film 5061, and a part of the first inorganic insulating film 5060 is exposed in the opening part.

Note that, since the positive photosensitive acrylic is light brown, it is subjected to decolorizing treatment when light emitted from a light emitting element travels to the substrate side. In this case, before baking, the entire photosensitive acrylic after development is exposed to light again. In the exposure at this point, slightly stronger light is irradiate compared with the exposure for forming the opening part or irradiation time is extended such that the exposure can be performed completely. For example, when a positive acrylic resin with a film thickness of 2 µm is decolorized, in the case in which a nonmagnification projection aligner (more specifically, MPA manufactured by Canon Inc.) utilizing multi-wavelength light consisting of a g ray (436 nm), an h ray (405 nm), and an i ray (365 nm) which are spectrum light of an ultrahigh pressure mercury vapor lamp is used, the light is irradiated for approximately 60 sec. The positive acrylic resin is completely decolorized by this exposure.

In addition, although baking is performed at the temperature of 220° C. after development in this embodiment, baking may be performed at a high temperature of 220° C. after performing baking at a low temperature of 100° C. as pre-baling after development.

Figure 10C:
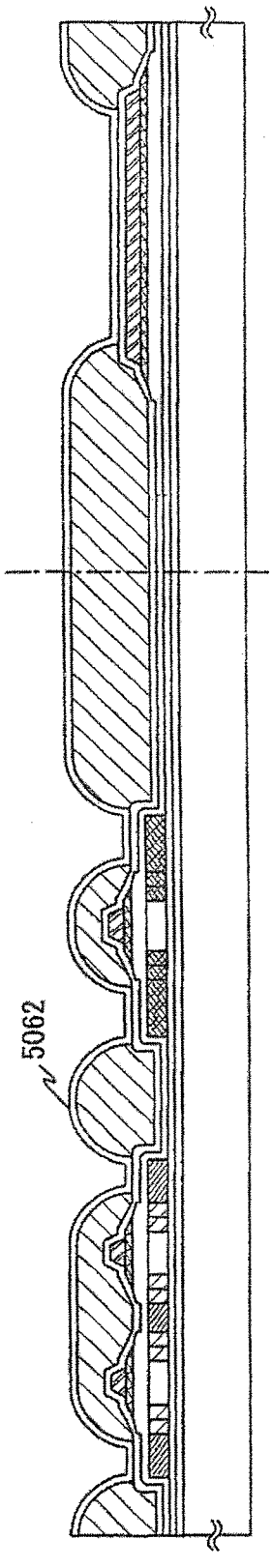

Then, as shown in FIG. 10C, covering the opening part in which a part of the first inorganic insulating film 5060 is exposed and the organic resin film 5061, a second inorganic insulating film 5062 consisting of silicon nitride is formed using an RF sputtering method. A film thickness of the second inorganic insulating film 5062 is desirably approximately 10 to 200 nm. In addition, the second inorganic insulating film is not limited to a silicon oxide nitride film, and any inorganic insulating film containing nitrogen may be used as the second inorganic insulating film as long as the film can suppress penetration of moisture to and from the organic resin film 5061. For example, silicon nitride, aluminum nitride, or aluminum oxide nitride can be used.

Note that in a silicon oxide nitride film or an aluminum oxide nitride film, a ratio of atomic % of oxygen and nitrogen thereof relates to a barrier property of the same. The higher the ratio of nitrogen to oxygen, the higher the barrier property. In addition, more specifically, a ratio of nitrogen is desirably higher than a ratio of oxygen.

In addition, a film formed using the RF sputtering method is high in denseness and excellent in the barrier property. As conditions of the RF sputtering, for example, in the case in which a silicon oxide nitride film is formed, with an Si target, gases of $N_2$, Ar, and $N_2O$ are flown such that a flow ratio thereof becomes 31:5:4, and the film is formed with a pressure of 0.4 Pa and an electric power of 3000 W. In addition, for example, in the case in which a silicon nitride film is formed, with an Si target, gases of $N^2$ and Ar are flown such that a flow ratio in a chamber of becomes 20:20, and the film is formed with a pressure of 0.8 Pa, an electric power of 3000 W, and a film formation temperature of 215° C.

A first interlayer insulating film is formed of this organic resin film 5061, the first inorganic insulating film 5060, and the second inorganic insulating film 5062.

Next, as shown in FIG. 11A, in the opening part of the organic resin film 5061, a contact hole is formed in the gate insulating film 5007, the first inorganic insulating film 5060, and the second inorganic insulating film 5062 using the dry etching method.

By the opening of this contact hole, a part of the first impurity regions 5017 and 5019 and the fourth impurity regions 5052 and 5057 are exposed. Conditions of this dry etching are appropriately set according to materials of the gate insulating film 5007, the first inorganic insulating film 5060, and the second inorganic insulating film 5062. In this embodiment, since silicon oxide is used for the gate insulating film 5007, silicon oxide nitride is used for the first inorganic insulating film 5060, and silicon nitride is used for the second inorganic insulating film 5062, first, the second inorganic insulating film 5062 consisting of silicon nitride and the first inorganic insulating film 5060 consisting of silicon oxide nitride are etched using $CF_4$, $O_2$, and He as etching gases. Thereafter, the gate insulating film 5007 consisting of silicon oxide is etched using $CHF_3$.

Note that, at the time of this dry etching, since the first inorganic insulating film 5060 and the second inorganic insulating film 5062 on the first electrode for capacitor 5029 are used as a dielectric body of a storage capacitor, the films are protected by a resist mask or the like so as not to be etched.

In addition, it is essential to prevent the organic resin film 5061 from being exposed in the contact hole at the time of etching.

Next, a conductive film is formed on the second inorganic insulating film 5062 so as to cover the contact hole and patterned, whereby wirings 5064 to 5067 connected to the first impurity regions 5017 and 5019 and the fourth impurity regions 5052 and 5057, a wiring for leading 5068 to be electrically connected to an external terminal, and a second electrode for capacitor 5069 are formed. Note that a storage capacitor 5070 is formed in a part where the second electrode for capacitor 5069 and the first electrode for capacitor 5029 overlap each other with the first inorganic insulating film 5060 and the second inorganic insulating film 5062 between them in the opening part of the organic resin film 5061.

Note that, in this embodiment, the wirings 5064 to 5067, the wiring for leasing 5068, and the second electrode for capacitor 5069 are formed of the conductive film with the three layer structure in which a Ti film with a thickness of 100 nm, an Al film with a thickness of 300 nm, and a Ti film with a thickness of 150 nm are continuously formed by the sputtering method on the second inorganic insulating film 5062. However, the present invention is not limited to this structure. These may be formed of a conductive film with a single layer or may be formed of a conductive film with plural layers other than three layers. In addition, a material is not limited to this.

For example, these may be formed using a conductive film in which an Al film containing Ti is laminated after forming the Ti film or may be formed using a conductive film in which an Al film containing W is laminated after forming the Ti film.

Next, a pixel electrode 5072 being in contact with the wiring 5067 is formed by forming a transparent conductive film, for example, an ITO film with a thickness of 110 nm and patterning the same. The pixel electrode 5072 is arranged so as to be in contact with and overlap the wiring 5067, whereby contact between them is realized. In addition, a transparent conductive film containing indium oxide mixed with 2 to 20% of zinc oxide (ZnO) may be used. This pixel electrode 5072 becomes an anode of the light emitting element (FIG. 11B).

Next, a photosensitive organic resin of a negative type or a positive type is formed and a part desired to be opened is exposed to light, whereby a second interlayer insulating film 5073 having an opening part is formed. Note that, a part of the pixel electrode 5072 and a part of the wiring for leading 5068 are exposed by this process.

Since roundness can be given to a section of the opening part by using the photosensitive organic resin, coverage of an electroluminescence layer an a cathode which are formed later can be made satisfactory, and a defect called shrink in which a light emitting area decreases can be reduced.

Then, a third interlayer insulating film 5074 consisting of silicon nitride is formed on the second interlayer insulating film 5073 using the RF sputtering method so as to cover the exposed parts of the pixel electrode 5072 and the wiring for leading 5068. Note that the third interlayer insulating film 5074 is not limited to silicon nitride, and any inorganic insulating film containing nitrogen may be used as long as penetration of moisture to and from the second interlayer insulating film 5073 can be suppressed. For example, silicon nitride, aluminum nitride, or aluminum nitride oxide can be used.

Then, by patterning the third interlayer insulating film 5074, a part of the pixel electrode 5072 and a part of the wiring for leading 5068 are exposed in the opening part of the second interlayer insulating film 5073.

At the time of this etching, it is essential to make an arrangement such that the second interlayer insulating film 5073 is not exposed in the contact hole.

Next, the electroluminescence layer 5075 is formed by the evaporation method and a cathode (MgAg electrode) 5076 is further formed by the evaporation method. At this point, it is desirable to apply heat treatment to the pixel electrode 5072 prior to forming the electroluminescence layer 5075 and the cathode 5076 and completely remove moisture. Note that, although the MgAg electrode is used as a cathode of the OLED in this embodiment, other publicly known materials may be used as long as it forms a conductive film with a small work function. For example, Ca, Al, CaF, MgAg, or AlLi may be used.

Note that AlLi is used as a cathode, Li in AlLi can be prevented from entering the substrate side of the third interlayer insulating film 5074 by the third interlayer insulating film 5074 containing nitrogen.

Figure 25A:
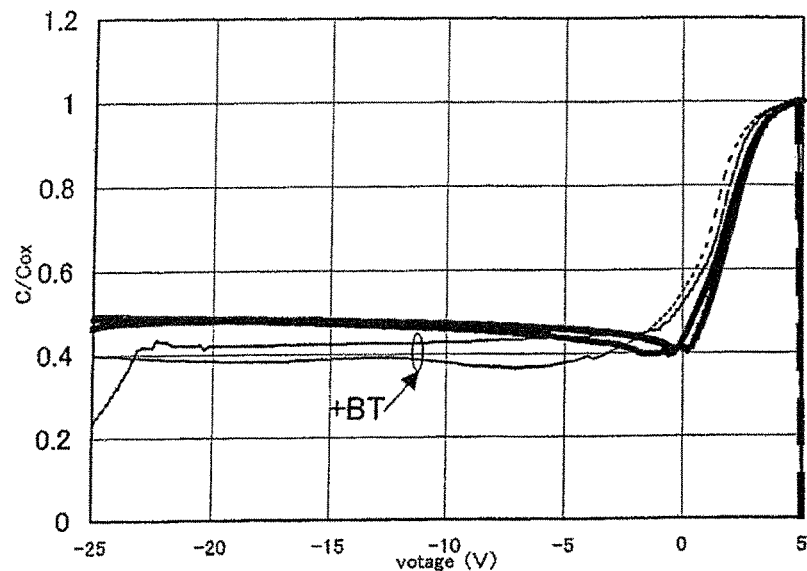
FIGS. 25A and 25B show graphs representing CV characteristics of the TFT.
Figure 25B:
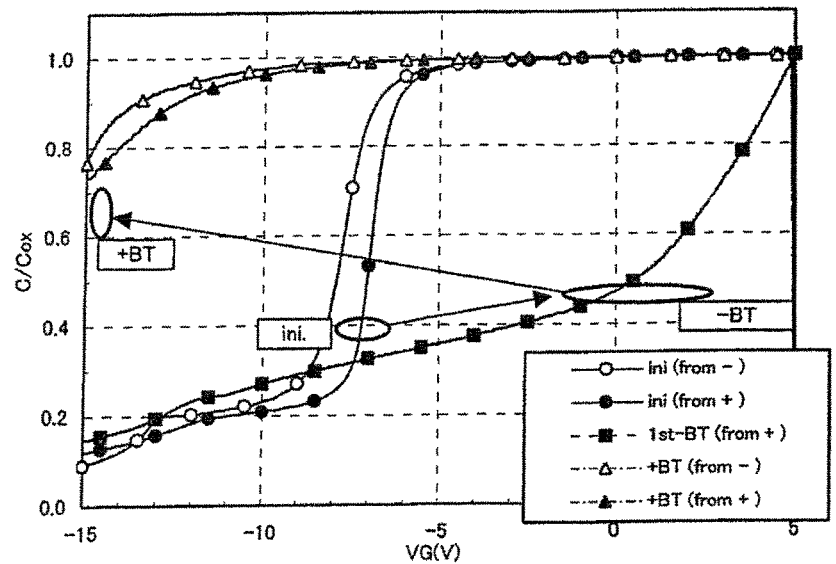

Here, data indicating a blocking effect of a silicon nitride film, which is formed by the sputtering method with high frequency discharge, against lithium is shown in FIGS. 25A and 25B. FIG. 25A shows a C-V characteristic of an MOS structure with a silicon nitride film formed by the sputtering method with the high frequency discharge (represented as RF-SP SiN) as a dielectric body. Note that "Li-dip" means a solution containing lithium was spin-coated on the silicon nitride film, which means that the silicon nitride film was intentionally contaminated by lithium for an experiment. In addition, FIG. 25B shows a C-V characteristic of an MOS structure with a silicon nitride film formed by the plasma CVD method (represented as CVD SiN) as a dielectric body for comparison purpose. Note that, in data of FIG. 25B, an alloy film in which lithium is added to aluminum as a metal electrode is used. As a result of applying a usual BT experiment to these films (more specifically, as shown in FIG. 25A, heating treatment was performed for one hour at a temperature of ±150° C. in addition to voltage application of 1.7 MV), whereas almost no change was observed in the C-V characteristic of the silicon nitride film formed by sputtering method with the high frequency discharge, large change was observed in the C-V characteristic of the silicon nitride film formed by the plasma CVD method and contamination by lithium was confirmed. These data indicate that the silicon nitride film formed by the sputtering method with the high frequency discharge has a very effective blocking effect against lithium diffusion.

Note that a publicly known material can be used s the electroluminescence layer 5075. Although a two layer structure consisting of a hole transporting layer and an emitting layer is provided as an electroluminescence layer in this embodiment, any one of a hole injection layer, an electron injection layer, and an electron transporting layer may be provided. In this way, various examples have been reported concerning a combination, and any structure of the examples may be used.

For example, SAlq, CAlq, and the like may be used as the electron transporting layer or the hole blocking layer.

Note that it is sufficient that a film thickness of the electroluminescence layer 5075 is 10 to 400 nm (typically 60 to 150 nm) and a thickness of the cathode 5076 is 80 to 200 nm (typically, 100 to 150 nm).

In this way, a light emitting device with a structure as shown in FIG. 12A is completed. In FIG. 12A, reference numeral 5081 denotes a pixel portion and 5082 denotes a drive circuit or other circuits. Note that a part where the pixel electrode 5072, the electroluminescence layer 5075, and the cathode 5076 overlap each other is equivalent to the OLED.

In addition, a part of the cathode 5076 is connected to the wiring for leading 5068. The wiring for leading 5068 is electrically connected to a terminal to be connected to the FPC. A sectional structure of the part to be connected to the FPC (FPC connection part) 5083 is shown in FIG. 12B.

An electrode for FPC 5085 formed from the same conductive layer as the gate electrode is formed on the gate insulating film 5007. Then, the electrode for FPC 5085 is connected to the wiring for leading 5068 via a contact hole 5086 formed in the first inorganic insulating film 5060 and the second inorganic insulating film 5062 in the opening part of the organic resin film 5061.

Then, on the electrode for FPC 5085, an opening part of the organic resin film 5061 is provided and the first inorganic insulating film 5060 and the second inorganic insulating film 5062 are etched to be removed, whereby the electrode for FPC 5085 is exposed. Thereafter, a terminal for FPC 5084 formed from the same transparent conductive film as the pixel electrode 5072 is formed on the electrode for FPC 5085.

A terminal of the FPC is connected to the terminal for FPC 5084 via a conductive resin having anisotropy.

Reference numeral 5087 denotes a cover material, which is high in air tightness and is sealed by a sealing material 5088 emitting less gas. Note that, as shown in FIG. 12B, in order to increase adhesion of the cover material 5087 and the element substrate on which the light emitting element is formed, unevenness may be provided by forming plural opening parts in the second interlayer insulating film 5073 in a part on which the sealing material 5088 is applied.

Note that the structure and the specific producing method of the TFT described in this embodiment are only an example, and the present invention is not limited to this structure.

Second Embodiment

In this embodiment, a structure of a light emitting device having a sectional structure different from that of the light emitting device shown in the first embodiment will be described.

Figure 13A:
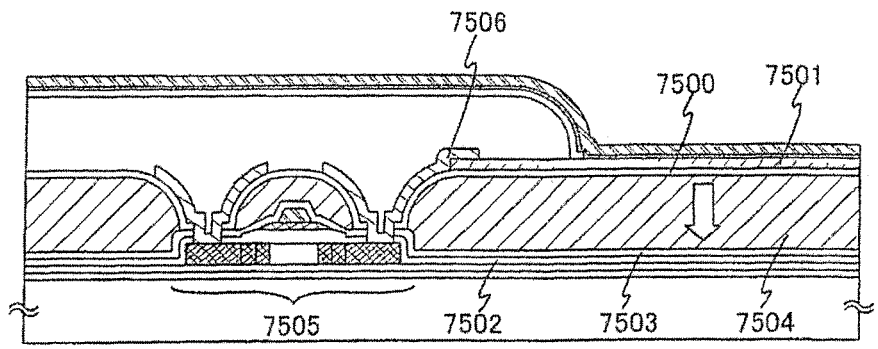
FIGS. 13A to 13D are sectional views of the semiconductor display device of the present invention.

In a light emitting device shown in FIG. 13A, after forming a second inorganic insulating film 7500, a transparent conductive film is formed and patterned before forming a contact hole, whereby a pixel electrode 7501 is formed. Then, a gate insulating film 7502, a first inorganic insulating film 7503, and the second inorganic insulating film 7500 are etched in an opening part of an organic resin film 7504 to form the contact hole, and a wiring 7506 electrically connecting a TFT 7505 and the pixel electrode 7501 is formed.

In this way, by forming the pixel electrode 7501 before forming the wiring 7506, a process of polishing a surface of the pixel electrode before forming the wiring 7506 can be provided.

Figure 13B:
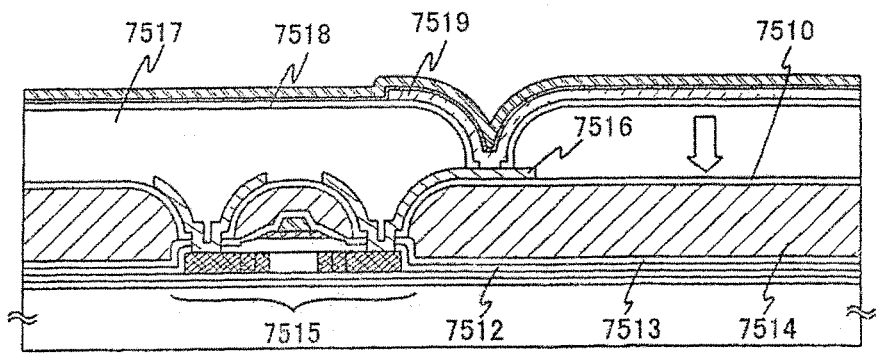

In a light emitting device shown in FIG. 13B, after forming a second inorganic insulating film 7510, a gate insulating film 7512, a first inorganic insulating film 7513, and the second inorganic insulating film 7510 are etched in an opening part of an organic resin film 7514 to form a contact hole, and a wiring 7516 electrically connecting to a TFT 7515 is formed.

Then, a second interlayer insulating film 7517 is formed covering the wiring 7516 and the second inorganic insulating film 7510. The second interlayer insulating film 7517 may be a positive photosensitive organic resin film or a negative photosensitive organic resin film. In FIG. 13B, the second interlayer insulating film 7517 is formed using positive acrylic.

Then, an opening part is formed in the second interlayer insulating film 7517 by exposing it to light to expose a part of the wiring 7516. Thereafter, a third interlayer insulating film 7518 is formed on the second interlayer insulating film 7517 covering the opening part, and a part of the third interlayer insulating film 7518 is removed in the opening part to expose a part of the wiring 7516. At this point, an arrangement is made such that the second interlayer insulating film 7517 is not exposed in the opening part.

Then, a transparent conductive film is formed on the third interlayer insulating film 7518 and patterned, whereby a pixel electrode 7519 connected to the wiring 7516 is formed.

Figure 13C:
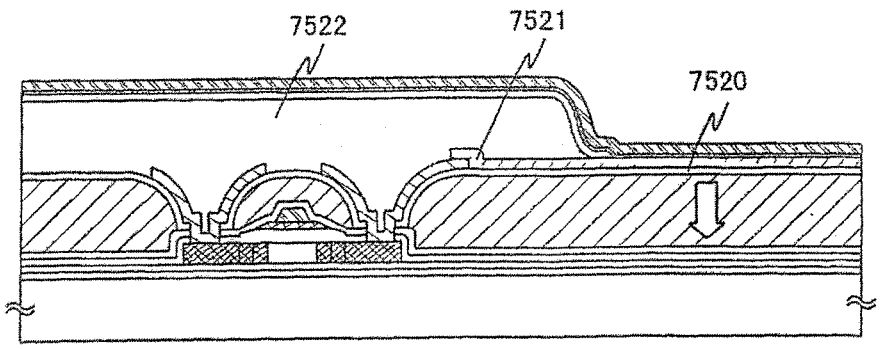

A light emitting device shown in FIG. 13C indicates an example in which, after forming a pixel electrode 7521 on a second inorganic insulating film 7520, a third interlayer insulating film 7522 is formed using negative acrylic. In the case in which the third interlayer insulating film 7522 is formed using negative acrylic, it is unnecessary to perform exposure with the object of decolorizing the third interlayer insulating film 7522.

Figure 13D:
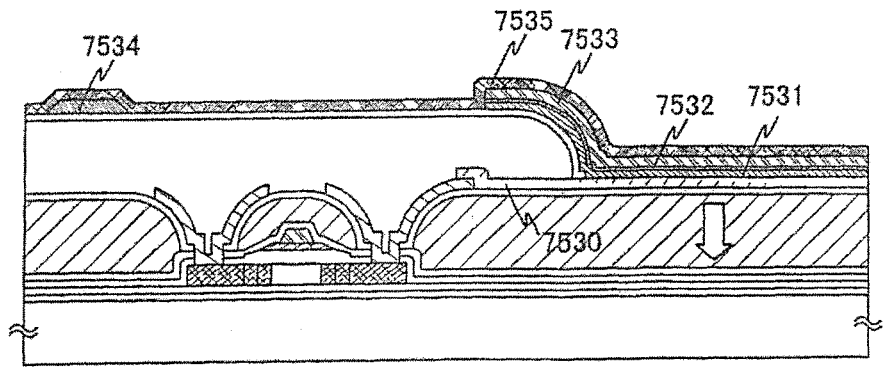

FIG. 13D illustrates an example of, in the case in which polythiophene (PEDOT) as a hole injection layer is used in a part of an electroluminescence layer of a light emitting element, patterning to remove the PEDOT film.

Since the polythiophene (PEDOT) is generally formed as a film using the spin coating method, even a part not desired to be formed as a film is formed as a film. Thus, after forming a PEDOT film 7531 on a pixel electrode 7530, a light emitting layer 7532 and a cathode 7533 are formed by evaporation using a mask for evaporation. Although a paraphenylenevinylene (PPV) is used as the light emitting layer in this embodiment, any film may be used as long as it can be formed by the evaporation method. In addition, although Ca is used as the cathode 7533, any material may be used as long as it is a material with a small work function and can be formed by the evaporation method.

Next, PEDOT is patterned by ashing using oxygen plasma with the cathode 7533 as a mask.

Next, an capacitor electrode 7534 is formed. An capacitor electrode is an electrode provided for lowering a resistance of a cathode and consists of a metal material having a resistance lower than that of the cathode. The capacitor electrode 7534 is obtained by forming a conductive film consisting of the metal material having a resistance lower than that of the cathode and, then, patterning the conductive film.

Then, a protective film 7535 electrically connecting the capacitor electrode 7534 and the cathode 7533 is formed by evaporation using a mask for evaporation. The protective film 7535 consists of a metal material, which may be the same as the material for the cathode 7533.

Note that, in FIG. 13D, an example of patterning a hole injection layer with a cathode of a light emitting element as a mask is shown. However, this embodiment is not limited to this structure. An electroluminescence layer other than the hole injection layer may be patterned with the cathode as a mask.

Figure 14A:
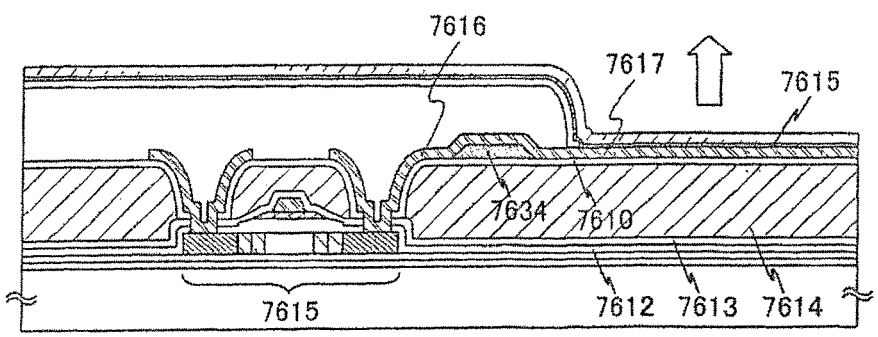
FIGS. 14A and 14B are sectional views of the semiconductor display device of the present invention.

In a light emitting device shown in FIG. 14A, after forming a second inorganic insulating film 7610, a conductive film consisting of a metal material having a resistance lower than that of a cathode is formed and patterned, whereby an capacitor electrode 7634 is formed. Then, a gate insulating film 7612, a first inorganic insulating film 7613, and the second inorganic insulating film 7610 are etched in an opening part of an organic resin film 7614 to form a contact hole, and a wiring 7616 electrically connecting a TFT 7615 and an capacitor electrode 7634 is formed.

The wiring 7616 is in contact with an electroluminescence layer 7617 in a part thereof and functions as a cathode.

Figure 14B:
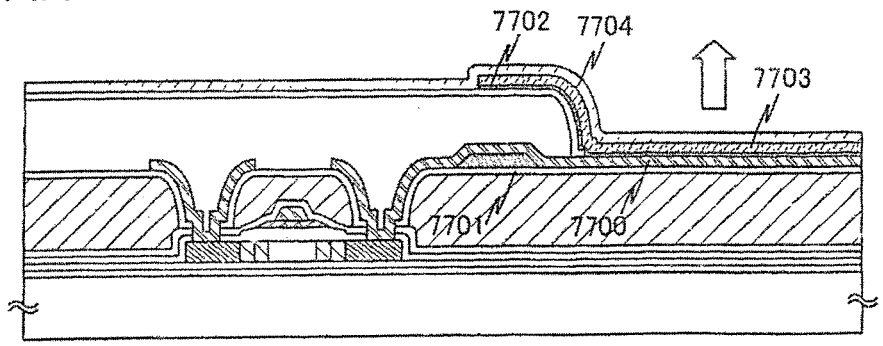

In a light emitting device shown in FIG. 14B, after forming a cathode 7700 on a second inorganic insulating film 7701, an electroluminescence layer 7702 and an ITO film 7703 are formed. At this point, a work function can be reduced by adding Li to the ITO film 7703. Then, an ITO film 7704 is formed anew separately covering the ITO film 7703 added with Li.

Third Embodiment

In this embodiment, electric connection between an capacitor electrode for lowering a resistance of a cathode and a terminal for FPC to be connected to a terminal of an FPC will be described.

Figure 15A:
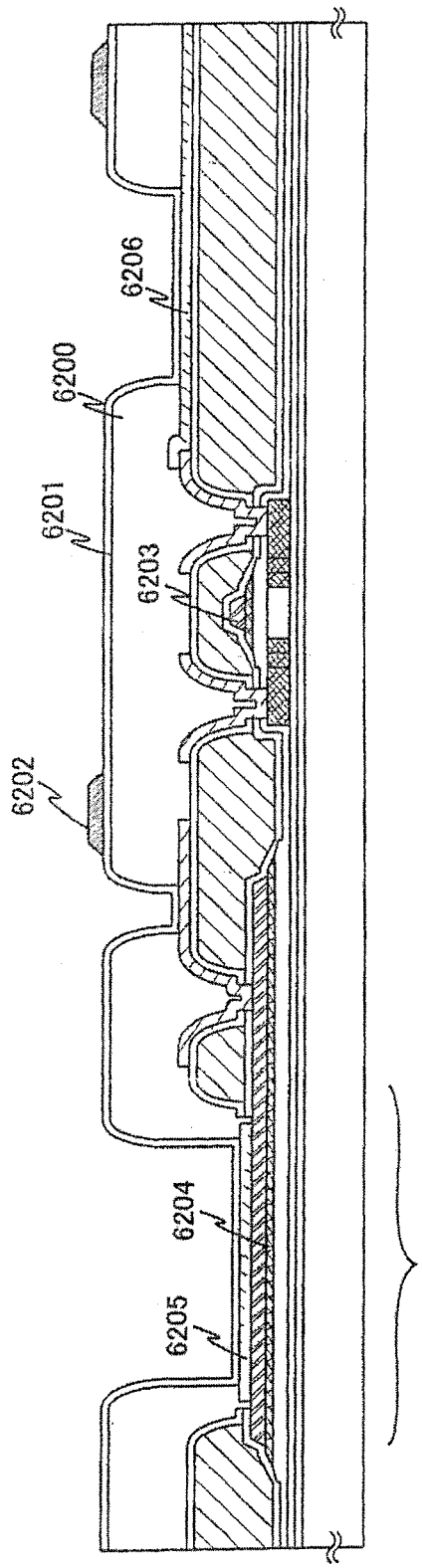
FIGS. 15A and 15B are views showing the manufacturing method of the semiconductor display device of the present invention.

FIG. 15A shows a sectional view of a light emitting device at a point when, after a third interlayer insulating film 6201 is formed on a second interlayer insulating film 6200 having an opening part, an capacitor electrode 6202 is formed on the third interlayer insulating film 6201. The capacitor electrode 6202 is formed of a material having a wiring resistance lower than that of a cathode to be formed later.

Note that an electrode for FPC 6204 formed of the same conductive film as a gate electrode 6203 of a TFT is formed in an opening part of the second interlayer insulating film 6200. In addition, a terminal for FPC 6205 formed of the same transparent conductive film as a pixel electrode 6206 is formed on the electrode for FPC 6204.

At the point of FIG. 15A, the terminal for FPC 6205 is covered by the third interlayer insulating film 6201 in an FPC connection part 6215.

Figure 15B:
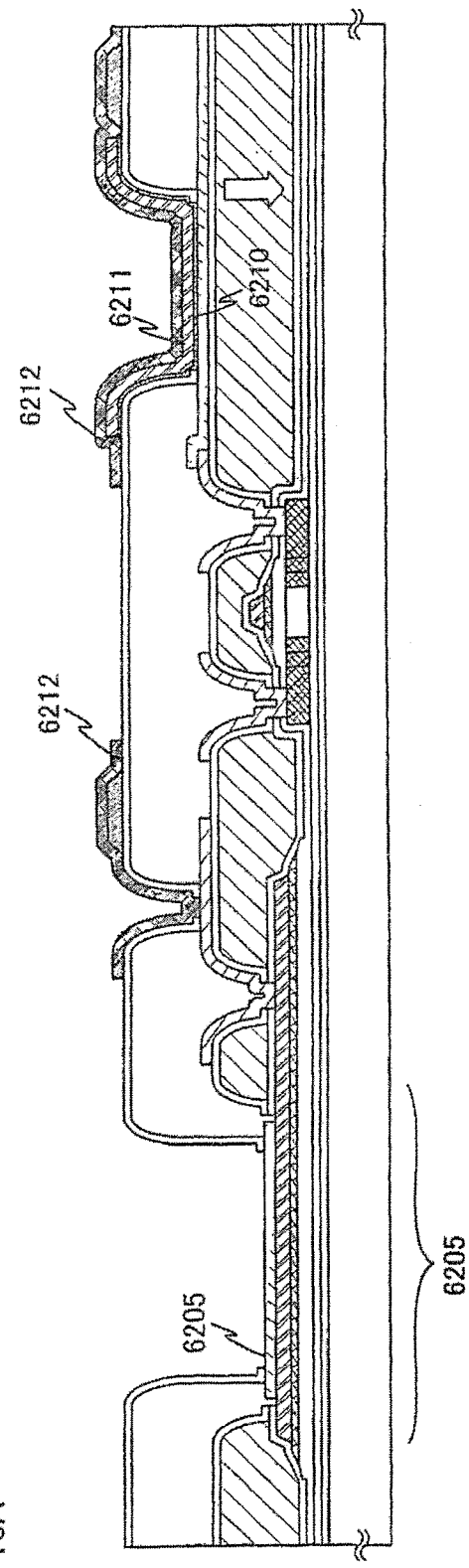

Next, as shown in FIG. 15B, a part of the third interlayer insulating film 6201 is etched to be removed, whereby the terminal for FPC 6205 and the pixel electrode 6206 are partly exposed. At this point, the second interlayer insulating film 6200 is not to be exposed.

After laminating an electroluminescence layer 6210 and a cathode 6211 on the pixel electrode 6206, a protective film 6212 electrically connecting the terminal for FPC 6205 and the cathode 6211 is formed.

In the above-mentioned structure, when the capacitor electrode 6202 is formed by etching, since the pixel electrode is covered by the third interlayer insulating film 6201, the surface of the pixel electrode 6206 can be prevented from being roughened by the etching.

Figure 16:
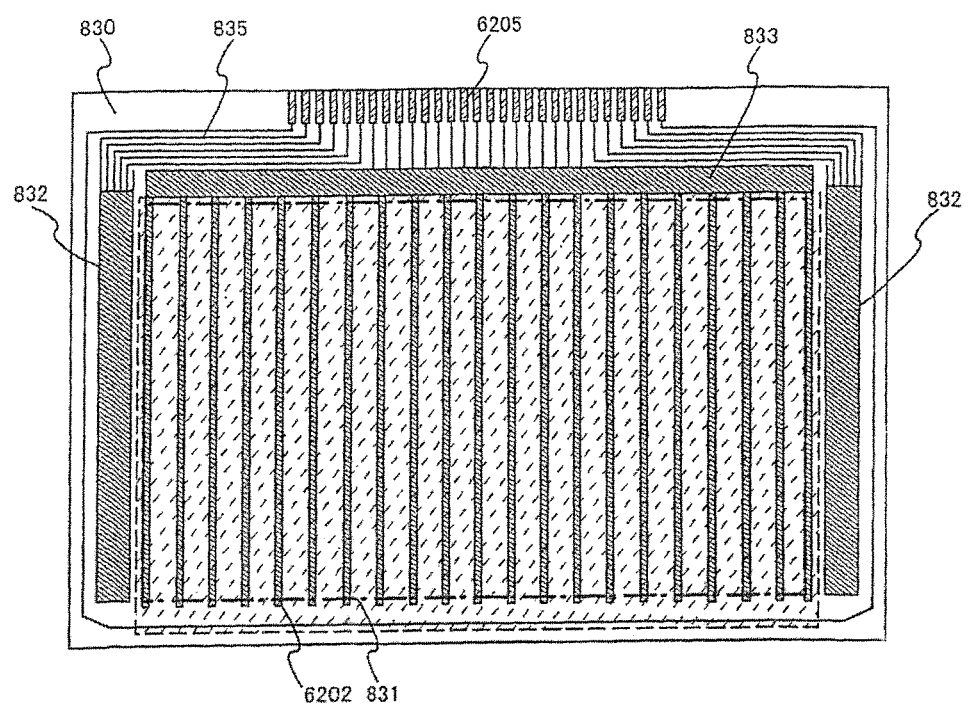
FIG. 16 is a plan view of the semiconductor display device of the present invention.

FIG. 16 shows a plan view of a substrate (element electrode), on which light emitting elements are formed, of the light emitting device of this embodiment. A state in which a pixel portion 831, scanning line drive circuits 832, a signal line drive circuit 833, and the terminals for FPC 6205 are formed on a substrate 830 is shown. The terminals for FPC 6205 and the respective drive circuits, a power supply line and opposed electrodes formed in the pixel portion are connected by lead wirings 835. The light emitting elements are formed the respective adjacent capacitor electrodes 6202 which are laid out in a stripe shape.

In addition, an IC chip on which a CPU or a memory is formed may be implemented on an element substrate by a COG (Chip on Glass) method or the like, if necessary.

Fourth Embodiment

The present invention explains the configuration of the light emitting apparatus having a controller formed on the same substrate of a pixel portion and a driving circuit.

Figure 17:
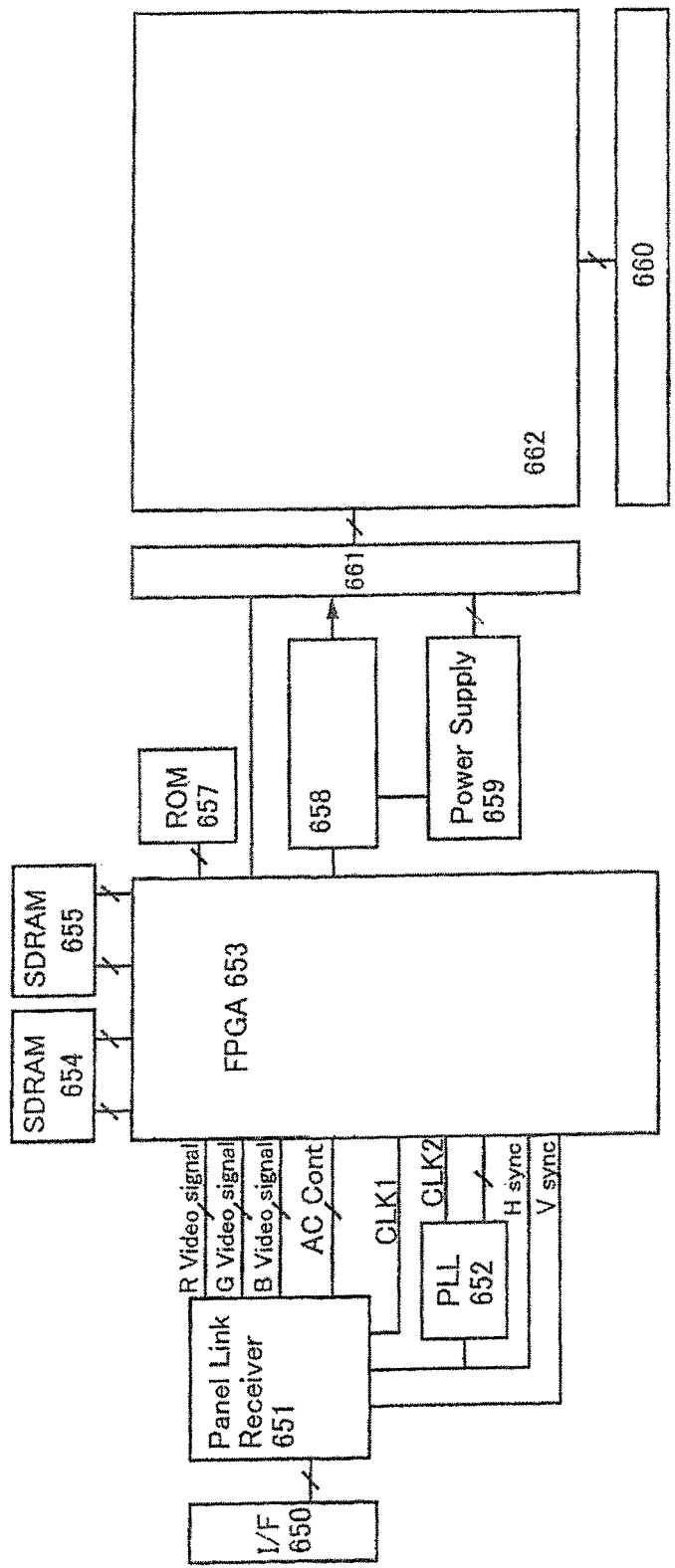
FIG. 17 is a block diagram showing a structure of a controller of a light emitting device.

The configuration of the controller of this embodiment is shown in FIG. 17. A controller is composed of an interface (I/F) 650, the panel link receiver 651, the phase locked loop 652 (PLL), the field programmable logic device 653 (FPGA), SDRAM (Synchronous Dynamic Random Access Memory) 654 and 655, ROM (Read Only Memory) 657, the voltage adjustment circuit 658, and the power supply 659. In addition, although SDRAM is used in this embodiment, if writing and read-out of high-speed data are possible instead of SDRAM, it is possible to also use DRAM (Dynamic Random Access Memory) and SRAM (Static Random Access Memory).

In the panel link receiver 651, the digital video signal is carried out parallel-serial conversion and inputted into the semiconductor display device through the interface 650, and it is inputted into the signal conversion portion 653 as a digital video signal corresponding to each color of R, G, and B.

Moreover, based on the various signals inputted into the semiconductor display device through the interface 650, a Hsync signal, a Vsync signal, the clock signal CLK, and exchange voltage (AC Cont) are generated in the panel link receiver 651, and they are inputted into the signal conversion portion 653.

The phase locked loop 652 has the function to unite the phase of the frequency of the various signals inputted into a semiconductor display device, and the frequency of the signal conversion portion 653 of operation. Although the operation frequency of the signal conversion portion 653 is not necessarily the same as the frequency of the various signals inputted into a semiconductor display device, the operation frequency of the signal conversion portion 653 is adjusted in the phase locked loop 652 so that it may synchronize mutually.

The program which controls operation of the signal conversion portion 653 is memorized in ROM 657, and the signal conversion portion 653 operates according to this program.

The digital video signal inputted into the signal conversion portion 653 is once written in SDRAMs 654 and 655, and is held. In the signal conversion portion 653, among the digital video signals of all the bits currently held at SDRAM 654, every 1 bit of digital video signals corresponding to all pixels is read, and they are inputted into a signal line driver circuit.

Moreover, in the signal conversion portion 653, the information about the length of the luminescence period of OLED corresponding to each bit is inputted into a scanning line driver circuit.

In addition, the voltage adjustment circuit 658 adjusts the voltage between the anode and the cathode of OLED of each pixel synchronizing with the signal inputted from the signal conversion portion 653. The power supply 659 supplies the power-supply voltage of a direct current to the voltage adjustment circuit 658, the signal line driver circuit 660, the scanning line driver circuit 661, and the pixel portion 662.

The capacitance having the configuration shown in the Embodiment Mode can be used for the circuits which can be made from capacitance, for example, PLL 652, SDRAM 654 and 655, among various kinds of circuits held by controller. Moreover, the panel link receiver 651 uses capacitance in some cases, and in that case, capacitance having the configuration shown in the Embodiment Mode can be used. Also, the voltage adjustment circuit 658 can be used if it is a capacity divisional type.

This embodiment may also be implemented by being freely combined with Embodiments 1 to 3.

Fifth Embodiment

In this embodiment, a structure of a liquid crystal display device, which is one of the semiconductor display devices of the present invention, will be described.

Figure 18:
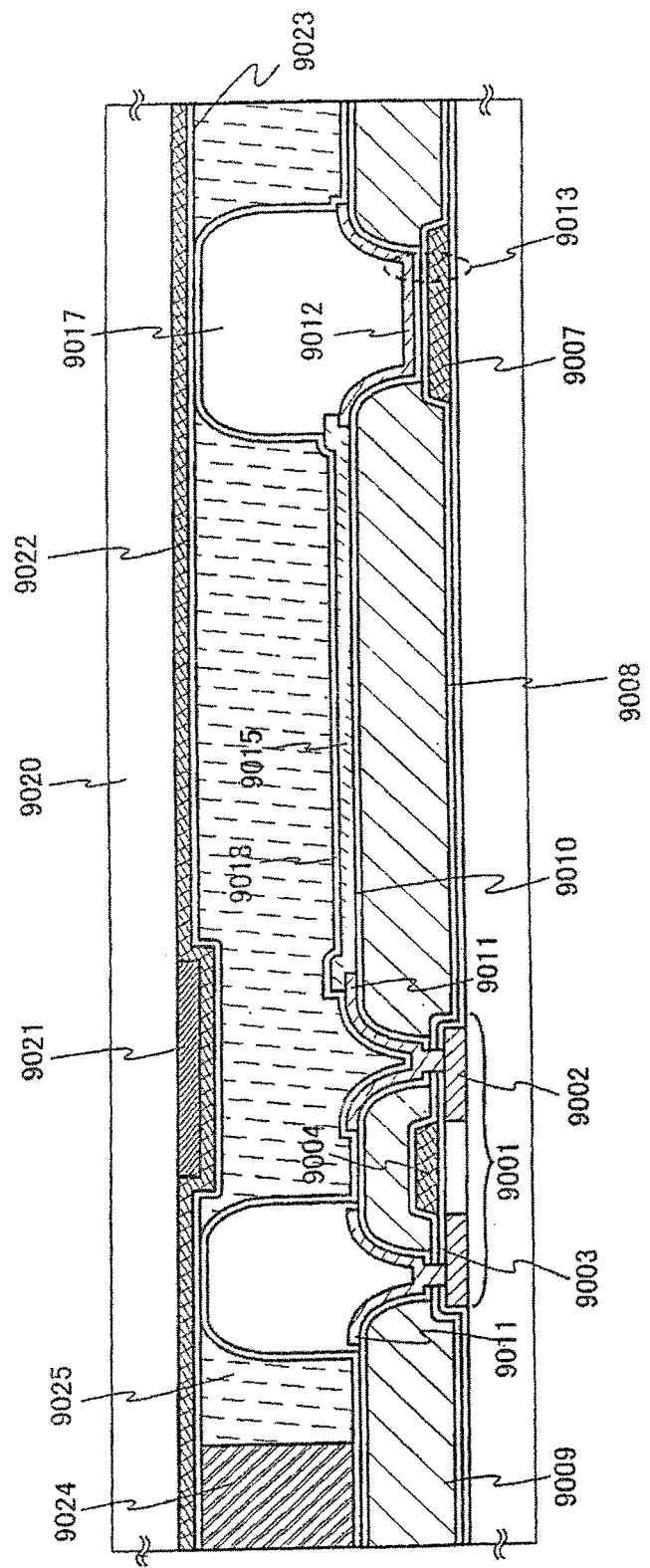
FIG. 18 is a sectional view of a semiconductor display device of the present invention.

A sectional view of the liquid crystal display device of this embodiment is shown in FIG. 18. In FIG. 18, a TFT 9001 is formed on an insulating surface. The TFT 9001 is a top gate type and has a semiconductor film 9002, a gate insulating film 9003 which is in contact with the semiconductor film 9002, and a gate electrode 9004 which is in contact with the gate insulating film 9003.

On the other hand, a first electrode for capacitor 9007 formed on the gate insulating film 9003 can be formed from the same conductive film as the gate electrode 9004.

Further, a first inorganic insulating film 9008 is formed so as to cover the TFT 9001 and the first electrode for capacitor 9007. The first inorganic insulating film 9008 is an insulating film containing nitrogen and has a characteristic that it is less likely to penetrate moisture than an organic resin film to be formed later.

Then, after applying a photosensitive organic resin on the first inorganic insulating film 9008, the photosensitive organic resin is baked and a part desired to be opened is exposed to light and developed, whereby an organic resin film 9009 having the opening part is formed. At this point, a part of the first inorganic resin film 9008 is exposed in the opening part.

Then, a second inorganic insulating film 9010 is formed covering the organic resin film 9009 and the part of the first inorganic insulating film 9008 exposed in the opening part. The second inorganic insulating film 9010, like the first inorganic insulating film 9008, is an insulating film containing nitrogen and has a characteristic that it is less likely to penetrate moisture than an organic resin film to be formed later.

Then, in the opening part of the organic resin film 9009, the gate insulating film 9003, the first inorganic insulating film 9008, and the second inorganic insulating film 9010 are subjected to dry etching such that a part of the semiconductor film 9002 is exposed, and a contact hole is formed. The semiconductor film 9002 has an effect as an etching stopper.

At this point, the first inorganic insulating film 9008 and the second inorganic insulating film 9010 existing on the first electrode for capacitor 9007 are covered by a resist mask so as not to be etched.

Then, a conductive film is formed on the second inorganic insulating film 9010 so as to cover the contact hole. Then, the conductive film is etched, whereby wirings 9011 connected to the semiconductor film 9002 and a second electrode for capacitor 9012 are formed. The second electrode for capacitor 9012 overlaps the first electrode for capacitor 9007 with the first inorganic insulating film 9008 and the second inorganic insulating film 9010 between them. A storage capacitor 9013 is formed of the second electrode for capacitor 9012, the first inorganic insulating film 9008, the second inorganic insulating film 9010, and the first electrode for capacitor 9007.

Then, a transparent conductive film is formed on the second inorganic insulating film 9010 so as to cover the wirings 9011 and the second electrode for capacitor 9012 and patterned, whereby a pixel electrode 9015 is formed. The pixel electrode 9015 is connected to one of the wirings 9011 and the second electrode for capacitor 9012.

Then, positive acrylic is applied on the second inorganic insulating film 9010 covering the pixel electrode 9015, the wirings 9011, and the second electrode for capacitor 9012 and baked, then partially exposed to light and developed, whereby a third interlayer insulating film 9017 having an opening part is formed. Although positive acrylic is used for the third interlayer insulating film 9017 in this embodiment, negative acrylic may be used. The pixel electrode 9015 is exposed in the opening part. The third interlayer insulating film 9017 is used as a spacer for keeping an interval among substrates constant. A thickness thereof is desirably approximately 0.7 μm to several μm, although it depends upon a type of liquid crystal.

Then, an orientation film 9018 is formed. Usually, a polyimide resin is used for an orientation film for a liquid crystal display device. After forming the orientation film, rubbing treatment is applied to the orientation film such that liquid crystal molecules are oriented with a certain constant pre-tilt angle.

A light shielding film 9021, an opposed electrode 9022, and an orientation film 9023 are formed on an opposed substrate 9020 on an opposed side. As the light shielding film 9021, a Ti film, a Cr film, an Al film, or the like are formed with a thickness of 150 to 300 nm. Then, the pixel portion, the element substrate on which the drive circuits are formed, and the opposed substrate are stuck together by a seal material 9024. A filler (not shown) is mixed in the seal material 9024, and two substrates are stuck together with a uniform interval by this filler and the third interlayer insulating film 9017. Thereafter, liquid crystal 9025 is injected between both the substrates. A publicly known liquid crystal material only has to be used as a liquid crystal material. For example, other than TN liquid crystal, no-threshold anti-ferroelectric mixed liquid crystal showing electro-optical response property, with which a transmissivity continuously changes with respect to an electric field, can also be used. Some no-threshold anti-ferroelectric mixed liquid crystal shows a V-shaped electro-optical response property. In this way, an active matrix liquid crystal display device shown in FIG. 18 is completed.

The liquid crystal display device described in this embodiment is only an example of the liquid crystal device of the present invention, and the present invention is not limited to the structure shown in FIG. 18.

Note that it is possible to combine this embodiment with the first to fourth embodiments freely.

Sixth Embodiment

In this embodiment, a structure of a drive circuit of a liquid crystal display device, which is one of the semiconductor display devices of the present invention, will be described.

Figure 19A:
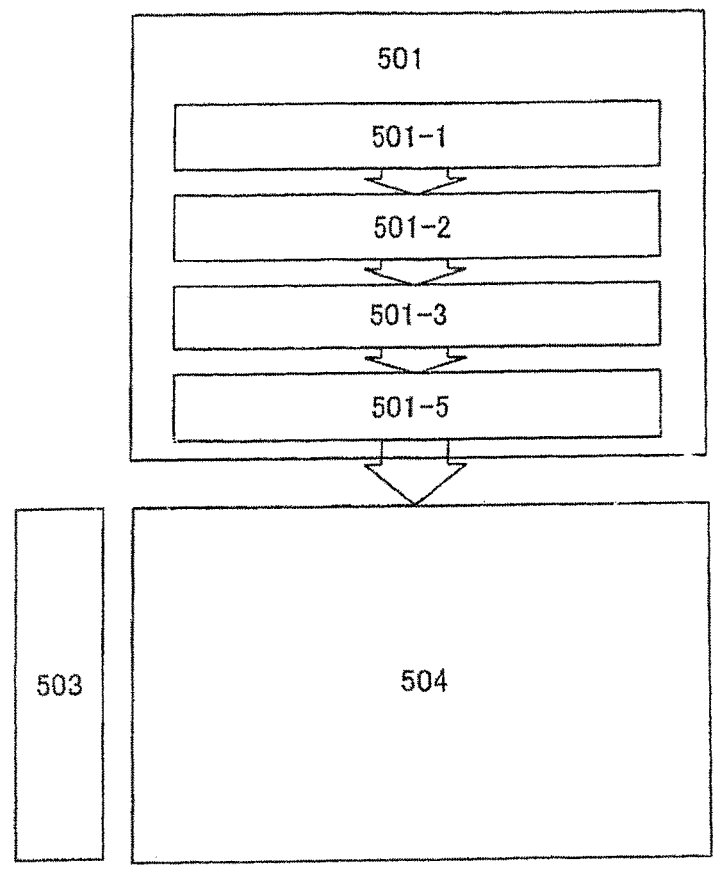
FIGS. 19A and 19B are a block diagram and a circuit diagram of a drive circuit of the semiconductor display device of the present invention, respectively.

FIG. 19A is a schematic block diagram of an active matrix liquid crystal display device of this embodiment. Reference numeral 501 denotes a signal line drive circuit; 503, a scanning line drive circuit; and 504, a pixel portion.

The signal line drive circuit 501 has a shift register circuit 501-1, a latch circuit A 501-2, a latch circuit B 501-3, and a D/A conversion circuit (DAC) 501-5. Besides, the signal line drive circuit 501 has a buffer circuit and a level shift circuit (both of which are not shown). In addition, for convenience of description, a level shift circuit is included in the DAC 501-5.

In addition, reference numeral 503 denotes the scanning line drive circuit, which may have a shift register circuit, a buffer circuit, and a level shifter circuit.

The pixel portion 504 has plural pixels. A TFT serving as a switching element is arranged in each pixel. One of a source and a drain of each pixel TFT is connected to a signal line and the other is connected to a pixel electrode. In addition, the gate is electrically connected to the scanning line. Each pixel TFT controls supply of a video signal to the pixel electrode electrically connected to each pixel TFT. The video signal is supplied to each pixel electrode, a voltage is applied to liquid crystal sandwiched between each pixel electrode and an opposed electrode to drive the liquid crystal.

First, operations of the signal line drive circuit 501 will be described. In the shift register circuit 501-1, a timing signal for controlling timing at which a digital video signal is latched by the latch circuit A 501-2 is generated based upon an inputted clock signal and a start pulse.

In the latch circuit A 501-2, the digital video signal is latched synchronizing with the generated timing signal. When the video signal is latched in all stages of the latch circuit A 501-2, a latch signal is supplied to the latch circuit B 501-3 in accordance with operation timing of the shift register circuit 501-1. At this instance, the digital video signal latched by the latch circuit A 501-2 is transmitted to the latch circuit B 501-3 all at once and latched by latch circuits of all the stages of the latch circuit B 501-3.

In the latch circuit A 501-2 which has completed transmitting the digital video signal to the latch circuit B 501-3, the digital video signal is latched sequentially based upon a timing signal from the shift register circuit 501-1.

On the other hand, the digital video signal latched in the latch circuit B 501-3 is supplied to the D/A conversion circuit (DAC) 501-5. The DAC 501-5 converts the digital video signal into an analog video signal and supplies the analog signal to each signal line sequentially.

In the scanning line drive circuit 503, a timing signal from a shift register (not shown) is supplied to a buffer circuit (not shown) and to a corresponding scanning line. Since gate electrodes of pixel TFTs for one line are connected to the scanning line and all the pixel TFTs for one line have to be turned ON simultaneously, a buffer circuit with a large current capacity is used for the above-mentioned buffer circuit.

In this way, switching of a corresponding pixel TFT is performed by a scanning signal from the scanning line drive circuit, an analog video signal (gradation voltage) from the signal line drive circuit is supplied to the pixel TFT to drive liquid crystal molecules.

In the liquid crystal display device of this embodiment, the D/A conversion circuit 501-5 is a capacity dividing type and has a capacitor of the structure described in the embodiment mode.

Figure 19B:
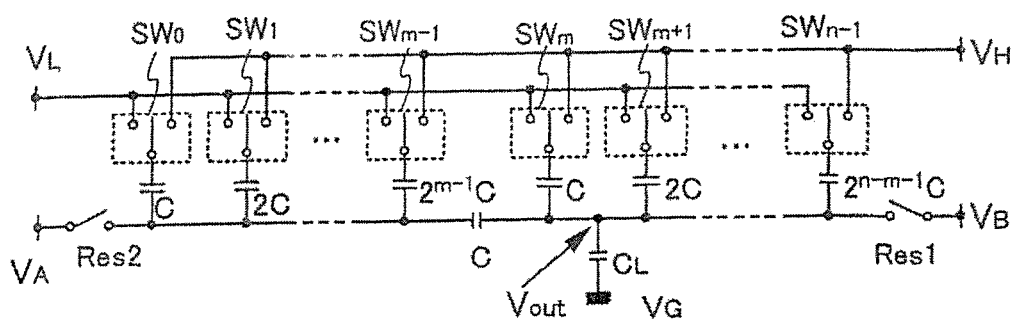

FIG. 19B shows a circuit diagram of the D/A conversion circuit 501-5 of this embodiment. The DAC shown in FIG. 19B can handle digital data of n bits ($D_0$ to $D_{n-1}$). Note that $D_0$ is assumed to be an LSB and $D_{n-1}$ is assumed to be an MSB.

As shown in FIG. 19B, the DAC of the present invention has n switches ($SW_0$ to $SW_{n-1}$) controlled by each bit of the n-bit digital data ($D_0$ to $D_{n-1}$), capacitors (C, 2C, ..., $2^{m-1}$C, C, 2C, ..., $2^{n-m-1}$C) connected to the respective switches ($SW_0$ to $SW_{n-1}$), and two reset switches (Res1 and Res2). These capacitors have capacities which are integer times as large as that of a unit capacitor C. Further, these capacitors are formed of the capacitor of the structure shown in the embodiment mode.

In addition, the DAC of the present invention has a capacitor C which connects a circuit portion corresponding to low order m bits and a circuit portion corresponding to high order (n-m) bits. As shown in FIG. 19B, one ends of respective capacitors of the circuit portion corresponding to the low order m bits form a common connection end. In addition, one ends of respective capacitors of the circuit portion corresponding to the high order (n-m) bits form a common connection end. Note that a capacitor $C_L$ is a load capacitor of a signal line connected to an output $K_{out}$. In addition, a ground power supply is assumed to be $V_G$. Note that $V_G$ may be an arbitrary constant power supply.

A power supply $V_H$, a power supply $V_L$, an offset power supply $V_B$, and a power supply $V_A$ are connected to the DAC of the present invention. Analog signals of opposite phases are outputted to the output $V_{out}$ in the case of $V_H > V_L$ and the case of $H_V < V_L$. Note that, here, the output in the case of $V_H > V_L$ is assumed to be a normal phase and the case of $H_V < V_L$ is assumed to be an inversed phase.

The switches ($SW_0$ to $SW_{n-1}$) are adapted to be connected to the poser supply $V_L$ at the time when inputted digital data ($D_0$ to $D_{n-1}$) is 0 (Lo) and connected to the power supply $V_H$ at the time when inputted data is 1 (Hi). The reset switch Res1 controls charging of electric charges from $V_B$ to the capacitors (C, 2C, ..., $2^{n-m-1}$C) corresponding to the high order (n-m) bits. In addition, the reset switch Res2 controls charging of electric charges from $V_A$ to the capacitors (C, 2C, ..., $2^{m-1}$C) corresponding to the low order m bits.

Note that one end of the reset switch Res2 may be connected to the power supply $V_L$ such that a voltage from the power supply $V_A$ is not performed.

Note that, although the signal line drive circuit and the scanning line drive circuit described in this embodiment are used as drive circuits of a liquid crystal display device, the drive circuits may be used as drive circuits of a light emitting device or other semiconductor display devices.

Seventh Embodiment

The semiconductor display device of the present invention may have a CPU on the same substrate on which a pixel portion is provided.

Figure 20A:
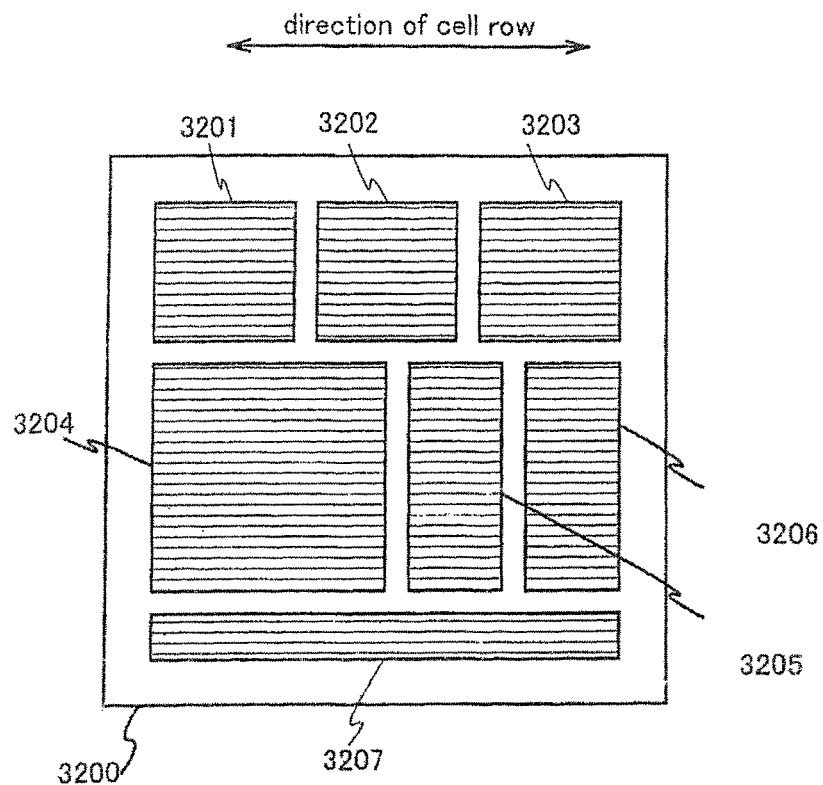
FIGS. 20A and 20B are block diagrams showing structures of a CPU and an ASIC included in the semiconductor display device of the present invention.

FIG. 20A shows a structure of a microprocessor 3200 which is an example of a semiconductor circuit included in the semiconductor display device of the present invention. The microprocessor 3200 is constituted by various circuits. In FIG. 20A, the microprocessor 3200 is constituted by a CPU core 3201, a DRAM 3204, a clock controller 3203, a cache memory 3202, a cache controller 3205, a serial interface 3206, an I/O port 3207, and the like. It is needless to mention that the microprocessor shown in FIG. 20A is a simplified example and an actual microprocessor has various kinds of structures depending upon applications of the same.

A storage capacitor having the structure described in the embodiment mode can be used for the cache memory 3202 and the DRAM 3204.

In addition, as one of the semiconductor circuits included in the semiconductor display device of the present invention, an IC with a specified application like an ASIC (Application Specific Integrated Circuit).

Figure 20B:
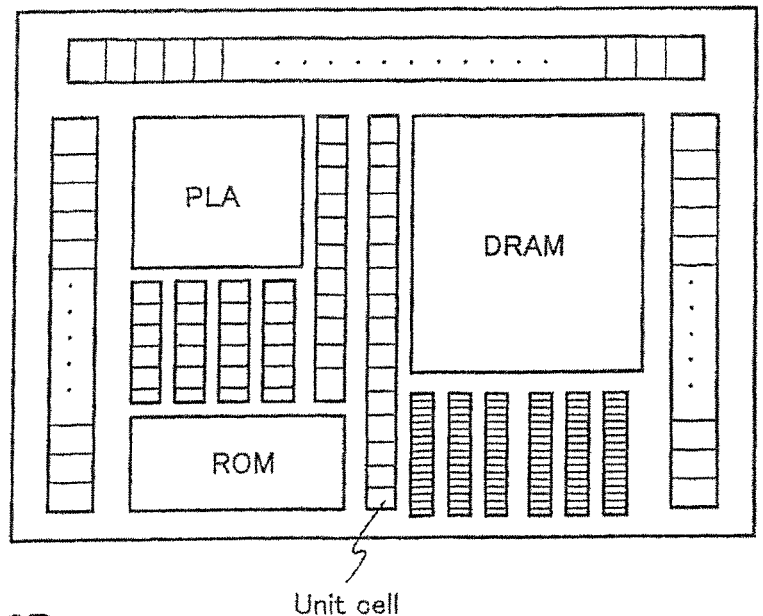

FIG. 20B shows a conceptual view of a polycell type standard cell which is one of ASICs. With the polycell type standard cell, it is attempted to realize short TAT of a layout design by making heights of cells identical. The polycell type standard cell shown in FIG. 20B can form the storage capacitor, which is described in the embodiment mode, in a DRAM.

Note that the ASIC shown in FIG. 20B is only an example of the semiconductor circuits included in the semiconductor display device of the present invention. The present invention is not limited to this.

Eighth Embodiment

The semiconductor display apparatus formed by the present invention can be applied to various electronics. Examples of the electronics are portable information terminals (electronic books, mobile computers, cellular phones, or the like), video cameras, digital cameras, personal computers, TV receivers, cellular phones, projection display apparatuses, or the like. Specific examples of these electronics are shown in FIGS. 22A to 22H.

Figure 22A:
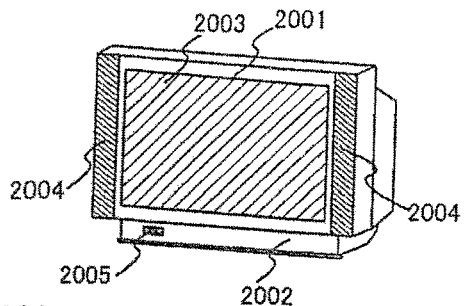
FIGS. 22A to 22H are views of electronic equipment using the semiconductor display devices of the present invention.

FIG. 22A shows a display apparatus, which is composed of a case 2001, a support base 2002, a display unit 2003, speaker units 2004, a video input terminal 2005, etc. The display apparatus of the present invention is completed by using the semiconductor display apparatus of the present invention to the display unit 2003. The display apparatus refers to all display apparatuses for displaying information, including ones for personal computers, for TV broadcasting reception, and for advertisement.

Figure 22B:
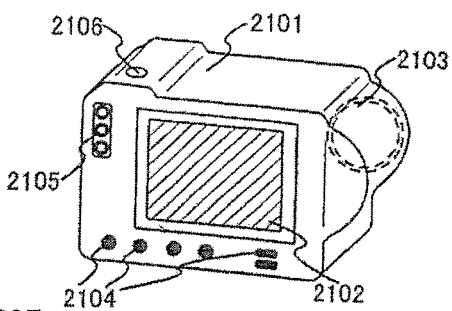

FIG. 22B shows a digital still camera, which is composed of a main body 2101, a display unit 2102, an image receiving unit 2103, operation keys 2104, an external connection port 2105, a shutter 2106, etc. The digital still camera of the present invention is completed by using the semiconductor display apparatus of the present invention to the display unit 2102.

Figure 22C:
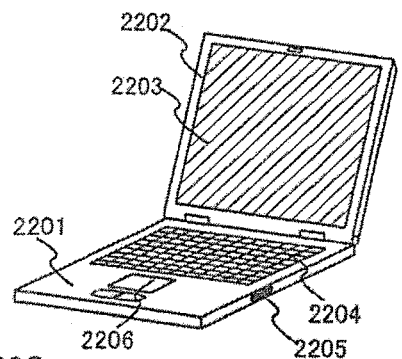

FIG. 22C shows a laptop, which is composed of a main body 2201, a case 2202, a display unit 2203, a keyboard 2204, an external connection port 2205, a pointing mouse 2206, etc. The laptop of the present invention is completed by using the semiconductor display apparatus of the present invention to the display unit 2203.

Figure 22D:
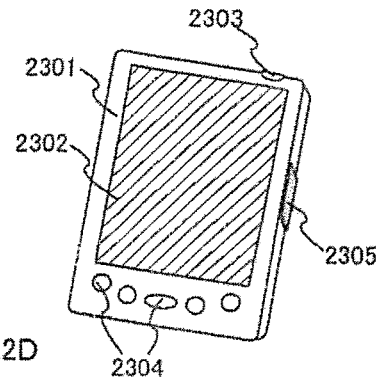

FIG. 22D shows a mobile computer, which is composed of a main body 2301, a display unit 2302, a switch 2303, operation keys 2304, an infrared port 2305, etc. The mobile computer of the present invention is completed by using the semiconductor display apparatus of the present invention to the display unit 2302.

Figure 22E:
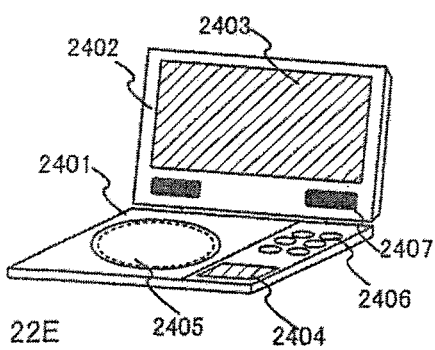

FIG. 22E shows a portable image reproducing apparatus having a recording medium (a DVD player, to be specific). The apparatus is composed of a main body 2401, a case 2402, a display unit A 2403, a display unit B 2404, a recording medium (DVD or the like), a reading unit 2405, operation keys 2406, speaker units 2407, etc. The display unit A 2403 mainly displays image information whereas the display unit B 2404 mainly displays text information. Domestic video games and the like are also included in the image reproducing apparatus having a recording medium. The portable image reproducing apparatus of the present invention is completed by using the semiconductor display apparatus of the present invention to the display units A 2403 and B 2404.

Figure 22F:
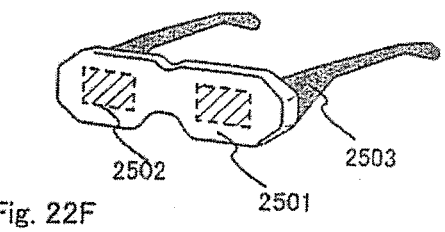

FIG. 22F shows a goggle type display (head mounted display), which is composed of a main body 2501, display units 2502, and arm units 2503. The goggle type display of the present invention is completed by using the semiconductor display apparatus of the present invention to the display units 2502.

Figure 22G:
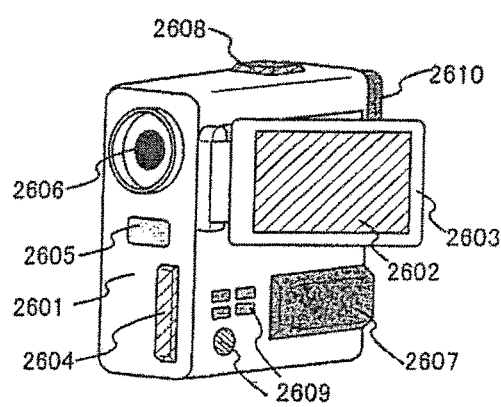

FIG. 22G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The video camera of the present invention is completed by using the semiconductor display apparatus of the present invention to the display unit 2602.

Figure 22H:
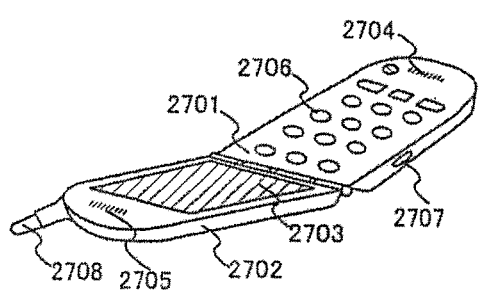

FIG. 22H shows a cellular phone, which is composed of a main body 2701, a case 2702, a display unit 2703, an audio input unit 2704, an audio output unit 2705, operation keys 2706, an external connection port 2707, an antenna 2708, etc. The cellular phone of the present invention is completed by using the semiconductor display apparatus of the present invention to the display unit 2703. In the case that the semiconductor display apparatus of the present invention is the light emitting apparatus, the display unit 2703 displays white letters on black background, therefore the cellular phone consumes less power.

As described above, the application range of the present invention is so wide that it is applicable to electronics of any field. This embodiment can be operated by combining with any configuration shown in Embodiments 1 to 7.

Ninth Embodiment

Figure 26A:
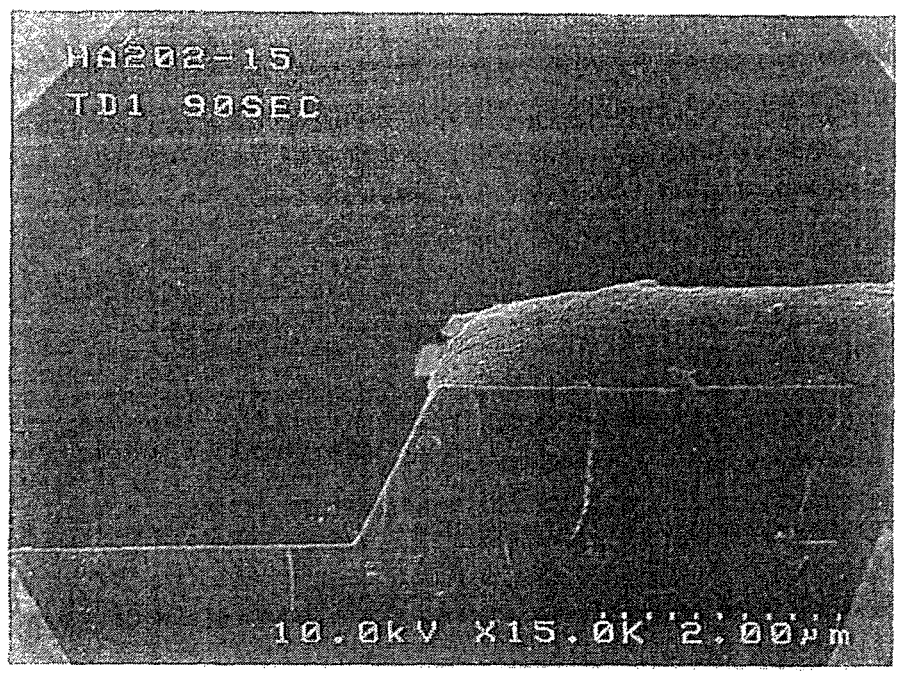
FIGS. 26A and 26B are sectional views of a non-photosensitive acrylic film in an opening part.
Figure 26B:
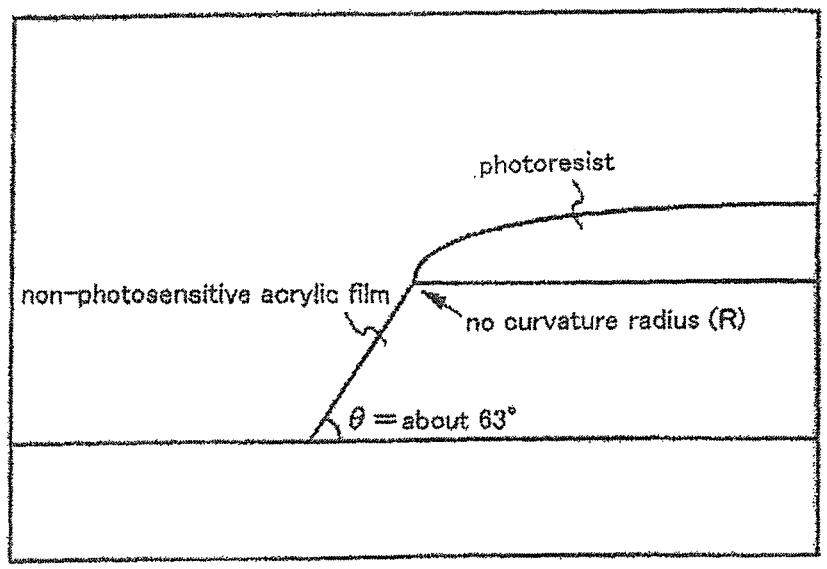

A photograph shown in FIG. 26A is a sectional SEM (scanning type electron microscope) photograph in a state in which dry etching treatment is applied to a non-photosensitive acrylic film (film thickness: approximately 1.3 μm) to pattern it. FIG. 26B is a schematic view of FIG. 26A. In the case in which the dry etching treatment is applied to the non-photosensitive acrylic film as in the past, a curved surface is hardly formed in an upper part of the pattern, and an upper end substantially without a curvature radius (R) is obtained. In addition, although a taper angle (contact angle) is approximately 63° in a lower part of the pattern, no curved surface is observed in this lower end either.

Figure 1B:
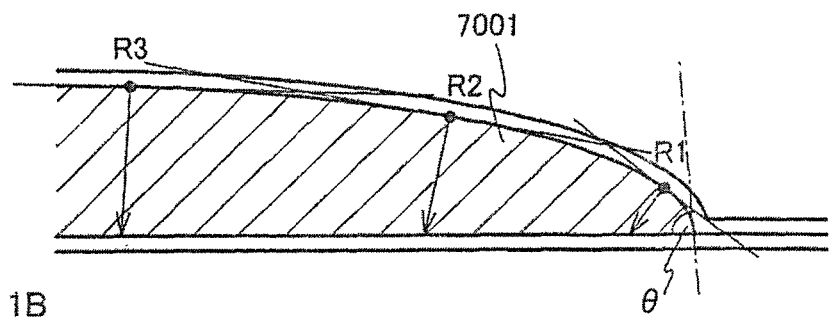
Figure 1C:
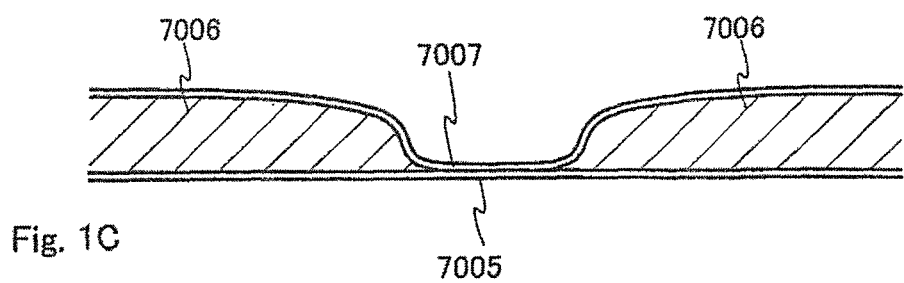
Figure 1D:
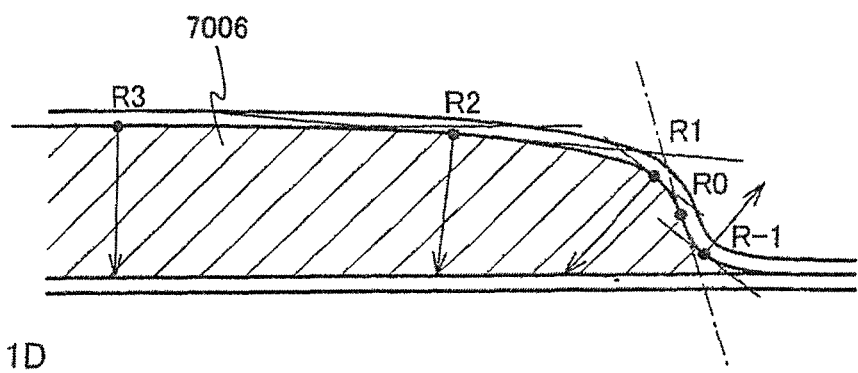
Figure 27A:
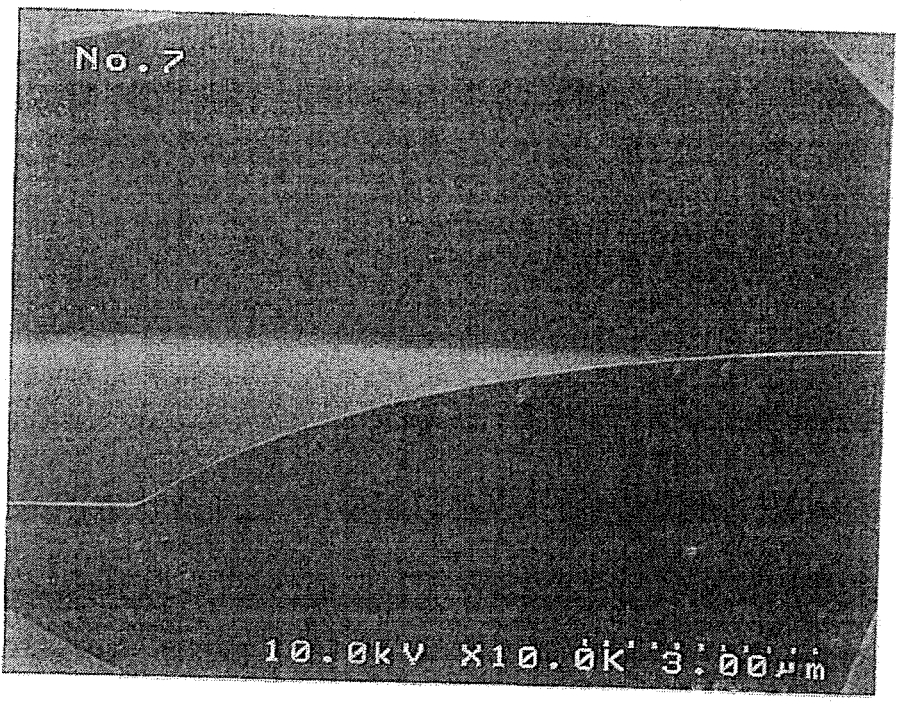
FIGS. 27A and 27B are sectional views of a positive photosensitive acrylic film in an opening part.
Figure 27B:
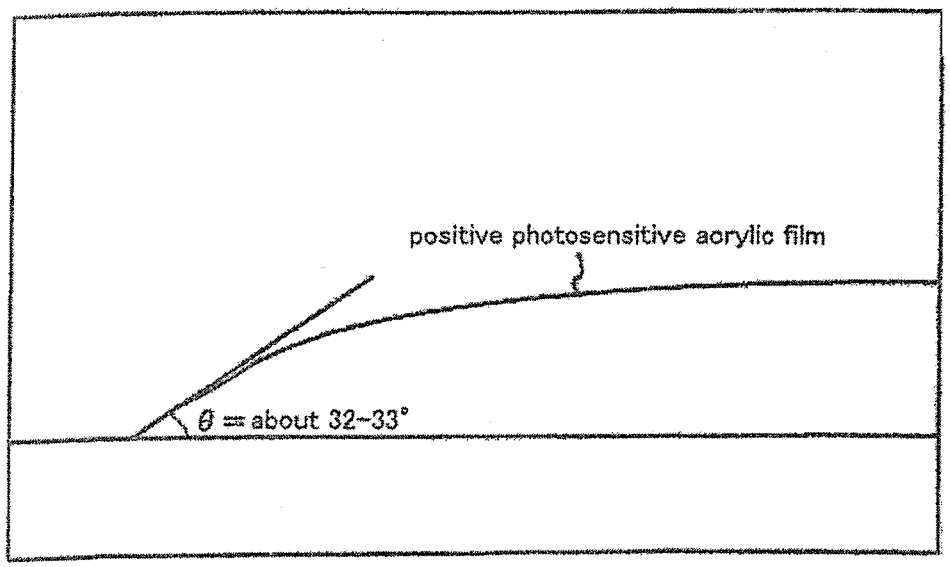

Next, a photograph shown in FIG. 27A is a sectional SEM photograph in a state in which exposure and development treatment are applied to a positive photosensitive acrylic film (film thickness: approximately 2.0 μm) to pattern it. FIG. 27B is a schematic view of FIG. 27A. A sectional shape of the positive photosensitive acrylic film has an extremely gentle curved surface after etching treatment with a developer, and a curvature radius (R) changes continuously. In addition, as a contact angle, a value as small as approximately 32 to 33° is obtained. That is, it is just like the shape shown in FIG. 1B. It can be said that it is a very useful shape in producing the thin film transistor and the display device of the present invention. It is needless to mention that, although a value of the contact angle changes depending upon etching conditions, a film thickness, and the like, it only has to satisfy $30° < \theta < 65°$ as described above.

Figure 28A:
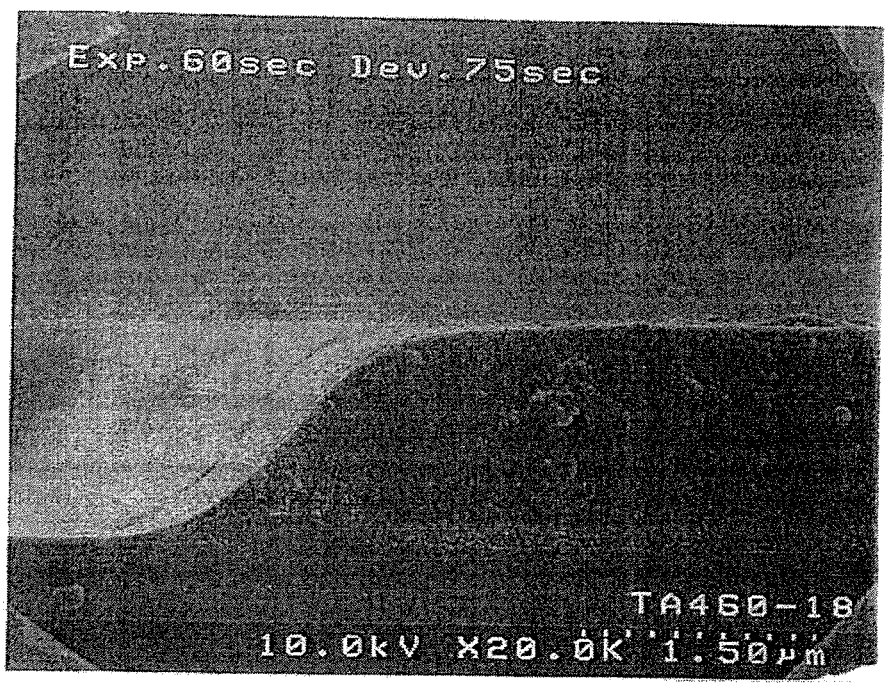
FIGS. 28A and 28B are sectional views of a negative photosensitive acrylic film in an opening part.

Next, a photograph shown in FIG. 28A is a sectional SEM photograph in a state in which exposure and development treatment are applied to a negative photosensitive acrylic film (film thickness: approximately 1.4 μm) to pattern it.

Figure 28B:
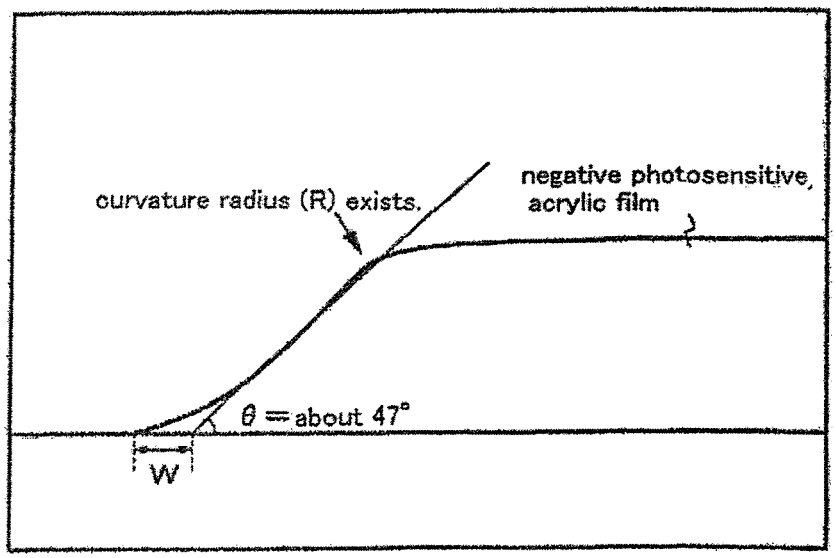

FIG. 28B is a schematic view of FIG. 28A. A sectional shape of the negative photosensitive acrylic film has a gentle S-shaped curved surface after etching treatment with a developer and is curved with a certain curvature radius (R) in an upper end of the pattern. In addition, as a contact angle, a value of approximately 47° is obtained. In this case, a length of a part of a tail represented by W of FIG. 28B is a problem. In particular, in a contact hole (opening part) requiring fine machining, if this tail part becomes long, it is likely that a state in which an electrode or a wiring in a lower layer is not exposed in the contact hole occurs, and disconnection due to contact failure is feared. However, a possibility of such disconnection decreases if the length (W) of this tail part is 1 μm or less (preferably, a length less than a radius of the contact hole).

Figure 29A:
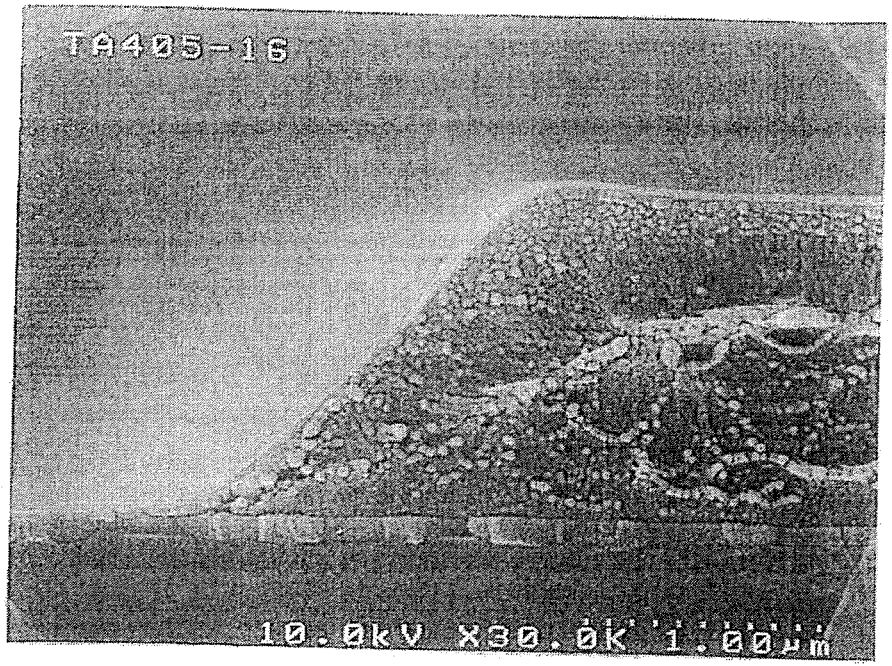
FIGS. 29A and 29B are sectional views of a positive photosensitive polyimide film in art opening part.
Figure 29B:
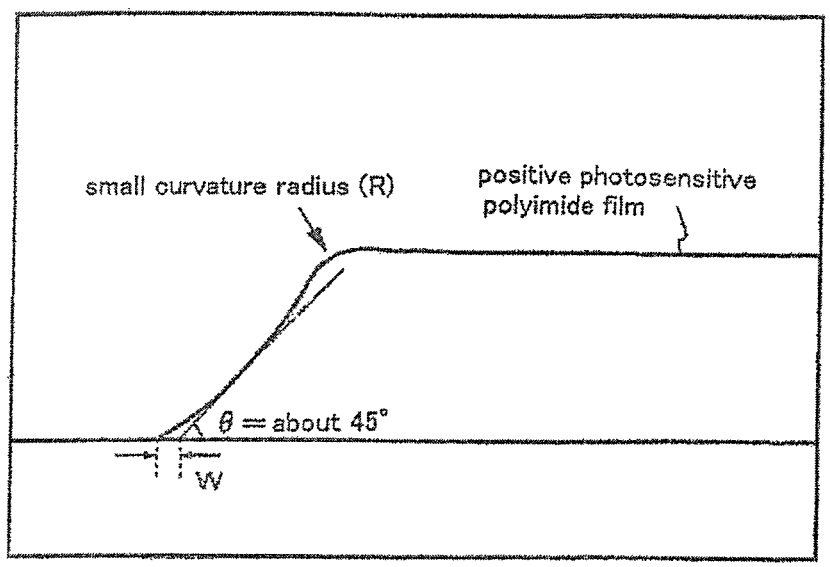

Next, a photograph shown in FIG. 29A is a sectional SEM photograph in a state in which exposure and development treatment are applied to a positive photosensitive polyimide film (film thickness: approximately 1.5 μm) to pattern it. FIG. 29B is a schematic view of FIG. 29A. A sectional shape of the positive photosensitive polyimide film has a slight tail part (represented by a length W) and a curved upper end after etching treatment with a developer. However, a certain curvature radius (R) thereof is small.

Observing the above-mentioned sectional shapes, considerations as described blow can be made. After forming a contact hole (opening part), when a metal film to be an electrode or a wiring is formed, the sputtering method, the evaporation method, or the CVD method is used. It is known that, when material molecules constituting a thin film deposit on a surface to be formed, the material molecules move on the surface to find a stable site, and tend to gather in a part of a shape having an acute angle (shape to be a projected part) like an upper end of the contact hole. In particular, this tendency is conspicuous in the evaporation method. Thus, when a sectional shape of the opening part is the shape as shown in FIG. 26A, since the material molecules concentrate on the edge of the opening part, a film thickness increases in that part locally and a projected part of an eave shape is formed. This projected part is not preferable because it becomes a cause of a failure such as disconnection (step breakage) later. Therefore, it can be said that the non-photosensitive acrylic film shown in FIG. 26A and the positive photosensitive polyimide film shown in FIG. 29A are materials disadvantageous from the viewpoint of a coverage.

In addition, in the shape with the tail part formed in the lower end of the contact hole as shown in FIGS. 28A and 29A, it is likely that the tail part may cover the bottom surface of the contact hole to cause connection failure. Therefore, it can be said that the films having such a shape is a material disadvantageous from the viewpoint of a contact property. It is needless to mention that there is no problem if the length of the tail part is 1 μm or less (preferably, a length less than the radius of the contact hole).

By covering an inorganic insulating film with an organic resin film, roughening of a surface due to dry etching can be suppressed. Thus, since it is possible to prevent unevenness from appearing on a surface of a pixel electrode or the like to be formed later or a thickness of the pixel electrode from becoming irregular, occurrence of display irregularity can be prevented.

In addition, by covering an organic resin film with an inorganic insulating film containing nitrogen that is less likely to transmit moisture compared with the organic resin film, discharge of moisture from the organic resin film can be suppressed and, conversely, the organic resin film is prevented from absorbing moisture to swell. Thus, a wiring can be prevented from corroding due to the moisture discharged from the organic resin film. Moreover, in the case of a light emitting device using a light emitting element represented by an organic light emitting diode (OLED), luminance of the light emitting element can be prevented from deteriorating due to the moisture discharged from the organic resin film.

Further, by covering an entire organic resin film with an inorganic insulating film such that the organic resin film is not exposed, the organic resin film can be prevented from absorbing moisture in an alkaline solution to be used at the time of development to swell, and treatment time of heating treatment with an object of removing the moisture after development can be controlled. Moreover, the moisture in the organic resin film can be prevented from being discharged to a film or an electrode adjacent to the organic resin film, and long-term reliability of a panel can be increased.

In addition, in the case in which a non-photosensitive organic resin is used, dry etching is generally used in order to form an opening in an interlayer insulating film. The dry etching is an etching method using an active radical or plasma of a reactive gas. Since the interlayer insulating film has a thickness approximately ten times as large as that of a gate insulating film, the dry etching with an object of opening takes time. If time during which a substrate with a TFT formed thereon is exposed to plasma is long, a threshold value of the TFT tends to fluctuate to a positive side due to a so-called charging damage in which a hole is trapped by the gate insulating film. Thus, by forming an opening with wet etching using a photosensitive organic resin as in the present invention, time during which the dry etching is used can be reduced significantly, and fluctuation of the threshold value of the TFT can be suppressed.

What is claimed is:

1. A semiconductor display device comprising:
   a pixel portion comprising:
      a transistor comprising:
         an active layer over a substrate; and
         a gate electrode over the active layer with a gate insulating layer interposed therebetween;
      a first inorganic insulating layer over and in direct contact with the gate electrode and the gate insulating layer;
      an organic layer over the first inorganic insulating layer, the organic layer including a first opening part;
      a contact hole in the gate insulating layer and the first inorganic insulating layer,
   wherein the first opening part and the contact hole overlap each other,
   wherein a wiring is over the organic layer, the wiring is in direct contact with the active layer through the first opening part and the contact hole,
   wherein the wiring includes a first layer containing titanium, a second layer containing aluminum, and a third layer containing titanium,
   wherein the second layer is between the first layer and the third layer,
   wherein a thickness of the second layer is higher than each of a thickness of the first layer and a thickness of the third layer,
   wherein the first inorganic insulating layer contains silicon and nitrogen, and
   wherein a curvature radius of a part of a surface of the organic layer becomes longer continuously as the organic layer separates from the first opening part.

2. A semiconductor display device according to claim 1, further comprising:
   a semiconductor circuit generating a signal for displaying an image on the pixel portion, the semiconductor circuit having a capacitor;
   a second inorganic insulating layer covering the organic layer;
   wherein the semiconductor circuit comprises a transistor, and the transistor has an active layer, a gate electrode adjacent to the active layer with a gate insulating layer interposed therebetween,
   wherein the organic layer having a second opening part,
   wherein the first and second inorganic insulating layers are in direct contact with each other in the first opening part and the second opening part, and
   wherein the capacitor has a first electrode formed from the same conductive layer as the gate electrode, a second electrode formed from the same conductive layer as the wiring, and a part of the first and second inorganic insulating layers which overlap the first electrode and the second electrode in the second opening part.

3. A semiconductor display device according to claim 1, wherein the organic layer is a positive photosensitive organic layer.

4. A semiconductor display device according to claim 2, wherein the semiconductor circuit is one of a booster circuit, a D/A conversion circuit of a capacity dividing type, a DRAM, an analog latch circuit, or a protective circuit.

5. A semiconductor display device according to claim 1, wherein the organic layer is acrylic.

6. A semiconductor display device according to claim 2, wherein the organic layer inclines at 30° or more and 65° or less with respect to the substrate on a tangent line thereof at the end of the first and second opening parts.

7. A semiconductor display device comprising:
   a pixel portion comprising:
      a transistor comprising:
         an active layer over a substrate; and
         a gate electrode over the active layer with a gate insulating layer interposed therebetween;
      a first inorganic insulating layer over and in direct contact with the gate electrode and the gate insulating layer;
      an organic layer over the first inorganic insulating layer, the organic layer including a first opening part;
      a contact hole in the gate insulating layer and the first inorganic insulating layer,
   wherein the first opening part and the contact hole overlap each other,
   wherein a wiring is over the organic layer, the wiring is in direct contact with the active layer through the first opening part and the contact hole,
   wherein the wiring includes a first layer containing titanium, a second layer containing aluminum, and a third layer containing titanium,
   wherein the second layer is between the first layer and the third layer,
   wherein a thickness of the second layer is higher than each of a thickness of the first layer and a thickness of the third layer,
   wherein the first inorganic insulating layer contains silicon and nitrogen, and
   wherein a sectional shape of a part of a surface of the organic layer at an end of the first opening part draws a parabola having a principal axis within a surface parallel with the substrate.

8. A semiconductor display device according to claim 7, further comprising:
a semiconductor circuit generating a signal for displaying an image on the pixel portion, the semiconductor circuit having a capacitor;
a second inorganic insulating layer covering the organic layer;
wherein the semiconductor circuit comprises a transistor, and the transistor has an active layer, a gate electrode adjacent to the active layer with a gate insulating layer interposed therebetween,
wherein the organic layer having a second opening part,
wherein the first and second inorganic insulating layers are in direct contact with each other in the first opening part and the second opening part, and
wherein the capacitor has a first electrode formed from the same conductive layer as the gate electrode, a second electrode formed from the same conductive layer as the wiring, and a part of the first and second inorganic insulating layers which overlap the first electrode and the second electrode in the second opening part.

9. A semiconductor display device according to claim 7, wherein the organic layer is a positive photosensitive organic layer.

10. A semiconductor display device according to claim 8, wherein the semiconductor circuit is one of a booster circuit, a D/A conversion circuit of a capacity dividing type, a DRAM, an analog latch circuit, or a protective circuit.

11. A semiconductor display device according to claim 7, wherein the organic layer is acrylic.

12. A semiconductor display device according to claim 8, wherein the organic layer inclines at 30° or more and 65° or less with respect to the substrate on a tangent line thereof at the end of the first and second opening parts.

* * * * *